(12) United States Patent
Buretea et al.

(10) Patent No.: US 7,468,315 B2
(45) Date of Patent: Dec. 23, 2008

(54) SYSTEM AND PROCESS FOR PRODUCING NANOWIRE COMPOSITES AND ELECTRONIC SUBSTRATES THEREFROM

(75) Inventors: Mihai A. Buretea, San Francisco, CA (US); Jian Chen, Mountain View, CA (US); Calvin Y. H. Chow, Portola Valley, CA (US); Chunming Niu, Palo Alto, CA (US); Yaoling Pan, Union City, CA (US); J. Wallace Parce, Palo Alto, CA (US); Linda T. Romano, Sunnyvale, CA (US); David P. Stumbo, Belmont, CA (US)

(73) Assignee: Nanosys, Inc., Palo Alto, GA (US)

( * ) Notice: Subject to any disclaimer, the term of this patent is extended or adjusted under 35 U.S.C. 154(b) by 294 days.

(21) Appl. No.: 11/225,951

(22) Filed: Sep. 14, 2005

(65) Prior Publication Data

US 2007/0238314 A1    Oct. 11, 2007

Related U.S. Application Data

(62) Division of application No. 10/910,800, filed on Aug. 4, 2004, now Pat. No. 7,091,120.

(60) Provisional application No. 60/491,979, filed on Aug. 4, 2003.

(51) Int. Cl.
*H01L 21/28* (2006.01)
*H01L 21/3205* (2006.01)

(52) U.S. Cl. .................. 438/602; 438/197; 438/603; 257/E21.17; 257/E21.4; 257/E21.05; 257/E21.459

(58) Field of Classification Search ............... 438/602, 438/603, 604, 606, 680, 681, 697, 197
See application file for complete search history.

(56) References Cited

U.S. PATENT DOCUMENTS 4,625,071 A    11/1986 Delahoy et al.

(Continued)

FOREIGN PATENT DOCUMENTS

EP    1087446    3/2001

(Continued)

OTHER PUBLICATIONS

Alivisatos, A.P. et al., " Naturally aligned nanocrystals" Science (2000) 289:736.

(Continued)

*Primary Examiner*—David Nhu
(74) *Attorney, Agent, or Firm*—Andrew L. Filler

(57) ABSTRACT

The present invention relates to a system and process for producing a nanowire-material composite. A substrate having nanowires attached to a portion of at least one surface is provided. A material is deposited over the portion to form the nanowire-material composite. The process further optionally includes separating the nanowire-material composite from the substrate to form a freestanding nanowire-material composite. The freestanding nanowire material composite is optionally further processed into an electronic substrate. A variety of electronic substrates can be produced using the methods described herein. For example, a multi-color light-emitting diode can be produced from multiple, stacked layers of nanowire-material composites, each composite layer emitting light at a different wavelength.

22 Claims, 40 Drawing Sheets

U.S. PATENT DOCUMENTS

| | | | |
|---|---|---|---|
| 5,260,957 A | 11/1993 | Hakimi et al. | |
| 5,262,357 A | 11/1993 | Alivisatos et al. | |
| 5,293,050 A | 3/1994 | Chapple-Sokol et al. | |
| 5,331,183 A | 7/1994 | Sariciftci et al. | |
| 5,350,459 A | 9/1994 | Suzuki et al. | |
| 5,350,644 A | 9/1994 | Graetzel et al. | |
| 5,354,707 A | 10/1994 | Chapple-Sokol et al. | |
| 5,422,489 A | 6/1995 | Bhargava | |
| 5,434,878 A | 7/1995 | Lawendy | |
| 5,454,880 A | 10/1995 | Sariciftci et al. | |
| 5,504,323 A | 4/1996 | Heeger et al. | |
| 5,505,928 A | 4/1996 | Alivisatos et al. | |
| 5,523,555 A | 6/1996 | Friend et al. | |
| 5,525,440 A | 6/1996 | Kay et al. | |
| 5,537,000 A | 7/1996 | Alivisatos et al. | |
| 5,571,612 A | 11/1996 | Motohiro et al. | |
| 5,585,640 A | 12/1996 | Huston et al. | |
| 5,613,140 A | 3/1997 | Taira | |
| 5,670,791 A | 9/1997 | Friend et al. | |
| 5,690,807 A | 11/1997 | Clark, Jr. et al. | |
| 5,698,048 A | 12/1997 | Friend et al. | |
| 5,751,018 A | 5/1998 | Alivisatos et al. | |
| 5,804,836 A | 9/1998 | Heeger et al. | |
| 5,897,945 A | 4/1999 | Lieber et al. | |
| 5,990,479 A | 11/1999 | Weiss et al. | |
| 5,997,832 A | 12/1999 | Lieber et al. | |
| 6,013,871 A | 1/2000 | Curtin | |
| 6,031,711 A | 2/2000 | Tennent et al. | |
| 6,036,774 A | 3/2000 | Lieber et al. | |
| 6,048,616 A | 4/2000 | Gallagher et al. | |
| 6,136,156 A | 10/2000 | El-Shall et al. | |
| 6,207,392 B1 | 3/2001 | Weiss et al. | |
| 6,225,198 B1 | 5/2001 | Alivisatos et al. | |
| 6,231,744 B1 | 5/2001 | Ying et al. | |
| 6,239,355 B1 | 5/2001 | Salafsky | |
| 6,245,988 B1 | 6/2001 | Gratzel et al. | |
| 6,277,740 B1 | 8/2001 | Goldstein | |
| 6,297,063 B1 * | 10/2001 | Brown et al. | 438/2 |
| 6,306,736 B1 | 10/2001 | Alivisatos et al. | |
| 6,322,901 B1 | 11/2001 | Bawendi et al. | |
| 6,340,822 B1 | 1/2002 | Brown et al. | |
| 6,359,288 B1 | 3/2002 | Ying et al. | |
| 6,383,923 B1 * | 5/2002 | Brown et al. | 438/666 |
| 6,413,489 B1 | 7/2002 | Ying et al. | |
| 6,423,551 B1 | 7/2002 | Weiss et al. | |
| 6,440,213 B1 | 8/2002 | Alivisatos et al. | |
| 6,501,091 B1 | 12/2002 | Bawendi et al. | |
| 6,563,132 B1 | 5/2003 | Talroze et al. | |
| 6,611,640 B2 | 8/2003 | LoCasclo et al. | |
| 6,741,019 B1 * | 5/2004 | Filas et al. | 313/355 |
| 6,794,265 B2 | 9/2004 | Lee et al. | |
| 6,882,051 B2 | 4/2005 | Majumdar et al. | |
| 7,091,120 B2 * | 8/2006 | Buretea et al. | 438/602 |
| 2001/0038900 A1 | 11/2001 | Todori et al. | |
| 2001/0041160 A1 | 11/2001 | Margrave et al. | |
| 2001/0046244 A1 | 11/2001 | Klimov et al. | |
| 2002/0006723 A1 | 1/2002 | Goldstein | |
| 2002/0016306 A1 | 2/2002 | Hutchison et al. | |
| 2002/0040728 A1 | 4/2002 | Yoshikawa | |
| 2002/0071952 A1 | 6/2002 | Bawendi et al. | |
| 2002/0110180 A1 | 8/2002 | Barney et al. | |
| 2002/0130311 A1 | 9/2002 | Lieber et al. | |
| 2002/0172820 A1 | 11/2002 | Majumdar et al. | |
| 2002/0182632 A1 | 12/2002 | Anderson et al. | |
| 2002/0192441 A1 | 12/2002 | Kalkan et al. | |
| 2003/0089899 A1 | 5/2003 | Lieber et al. | |
| 2003/0142944 A1 | 7/2003 | Sundar et al. | |
| 2003/0145779 A1 | 8/2003 | Alivisatos et al. | |
| 2003/0186522 A1 | 10/2003 | Duan et al. | |
| 2003/0226498 A1 | 12/2003 | Alivisatos et al. | |
| 2004/0003838 A1 | 1/2004 | Curtin | |
| 2004/0026684 A1 | 2/2004 | Empedocles et al. | |
| 2004/0095658 A1 | 5/2004 | Buretea et al. | |
| 2004/0112964 A1 | 6/2004 | Empedocles et al. | |
| 2004/0118448 A1 | 6/2004 | Scher et al. | |

FOREIGN PATENT DOCUMENTS

| | | |
|---|---|---|
| JP | 55-125681 | 9/1980 |
| WO | WO-9400887 | 1/1994 |
| WO | WO-9404497 | 3/1994 |
| WO | WO-9529924 | 11/1995 |
| WO | WO-9610282 | 4/1996 |
| WO | WO-0103208 | 1/2001 |
| WO | WO-0217362 | 2/2002 |
| WO | WO-0248701 | 6/2002 |
| WO | WO-02080280 | 10/2002 |
| WO | WO-03054953 | 7/2003 |
| WO | WO-03084292 | 10/2003 |
| WO | WO-03085700 | 10/2003 |
| WO | WO-2004032193 | 4/2004 |

OTHER PUBLICATIONS

Alivisatos, A.P. et al., "Perspectives on the physical chemistry of semiconductor nanocrystals" J. Phys. Chem. (1996) 100:13226-13239.

Bjork, M.T. et al., "One-dimensional steeplechase for electrons realized" Nano Letters (2002) 2:86-89.

Cao, Y.W. et al., "Growth and properties of semiconductor core/shell nanocrystals witn InAs cores" J. Am. Chem. Soc. (2000) 122:9692-9702.

Colvin et al., "Light emitting diodes made from cadmium selenide nanocrystals and a semiconducting polymer" Nature (1994) 370:354-357.

Cui, Y. et al. "Diameter-controlled synthesis of single-crystal silicon nanowires" (2001) Appl. Phys. Letts. 78(15):2214-2216.

Cui, Y. et al. "Doping and electrical transport in silicon nanowires" J. Phys. Chem. B (2000) 104(22):5213-5216.

Cui, Y. et al., "Nanowire nanosensors for highly sensitive and selective detection of biological and chemical species," Science (2001) 293:1289-1292.

Dabbousi, B.O. et al., "(cdSe)ZnS core-shell quantum dots: Synthesis and characterization of a sizze series of highly luminescent nanocrystallites" J. Phys. Chem. B (1997) 101(46):9463-9475.

Dabbousi, B.O. et al., "Electroluminescence from CdSe quantum-dot/polymer composites" Appl. Phys. Lett (1995) 66(11):1316-1318.

Danek, M. et al., "Synthesis of luminescent thin-film Cd/Se/ZnSe quantum dot composites using CdSe quantum dots passivated with an overlayer of ZnSe" Chem. Mater. (1996) 8(1):173-180.

Diehl, "Fraunhofer LUCOLEDs to replace lamps" III-Vs Rev. (1996) 10(1).

Duan, X et al., "High-performance thin-film transistors using semiconductor nanowires and nanoribbons," Nature (2003) 425-274-278.

Duan, X. et al., "Nanowire Nanoelectronics Assembled from the Bottom-up" Molecular Nanoelectronics Reed, M. ed., American Scientific Publisher, New York (2002).

Duan, X. et al., "General synthesis of compound semiconductor nanowires," Adv. Mater. (2000) 12:298-302.

Duan, X. et al., Nano Lett (2002) 2:487-490.

Empedocles, S. et al., "Photoluminescence spectroscopy of single CdSe nanocrystallite quantum dots" Phys. Rev. Lett (1996) 77(18):3873-3876.

Empedocles, S. et al., "Quantum-confined stark effect in single CdSe Nanocrystallite quantum dots" Science (1997) 278:2114-2117.

Ginger, D.S. e al., "Charge Separation in Conjugated-Polymer/Nanocrystal Blends" Synthetic Metals (1999) 101:425-428.

Ginger, D.S. et al., "Charge Injection and Transport in Fils of CdSe Nanocrystals" J. Appl. Phys. (2000) 87(3):1361-1368.

Greenham, N.C. et al., "Charge Separation and Transport in Conjugated-Polymer/Semiconductor-Nanocrystal Composites Studied by Photoluminescence Quenching and Photoconductivity" Phys. Rev. B. (1996) 54(24):17628-17637.

Gudiksen, M.S. et al., "Diameter-selective synthesis of semiconductor nanowires" J. Am. Chem. Soc. (2000) 122:8801-8802.

Gudiksen, M.S. et al., "Growth of nanowire superlattice structures for nanoscale photonics and electronics" Nature (2002) 415:617-620.

Gudiksen, M.S. et al., "Synthetic control of the diameter and length of single crystal semiconductor nanowires" *J. Phys. Chem.B* (2001) 105:4062.

Guha et al., "Hybrid organic-inorganic semiconductor-based light-emitting dioes" J. Appl. Phys. (1997) 82(8):4126-4128.

Hines, M.A. et al., "Synthesis and characterization of strongly luminescing ZnS-Capped CdSe nanocrystals" J. Phys. Chem. (1996) 100:468-471.

Hu, J. et al., "Linearly polarized emission from colloidal semiconductor quantum rods" Science (2001)292:2060-2063.

Huang, Y. et al., "Gallium nitride nanowire nanodevices," *Nano Lett.* (2002) 2:101-104.

Huang, Y. et al., "Logic gates and computation from assembled nanowire building blocks" *Science* (2001) 294:1313-1317.

Huynh, W.U. et al., "CdSe Nanocrystal Rods/Poly(3-hexylthiophene) Composite Photovoltaic Devices," *Adv. Mater.* (1999) 11(11):923-927.

Huynh, W.U. et al., "Hybrid nanorod-polymer solar cells" Science (2002) 295(5564):2426-2427.

Jun, Y-W. et al., "Controlled synthesis of multi-armed CdS nanorod architectures using monosurfactant system" J. Am. Chem. Soc. (2001) 123:5150-5151.

Kortan, A.R. et al., "Nucleation and growth of CdSe on ZnS quantum crystallite seeds and vice versa, in inverse micelle media" J. Am Chem. Soc. (1990) 112:1327-1332.

Kuno, M. et al., "The band edge luminescence of surface modified CdSe nanocrystallites: probing the luminescing state" J. Chem. Phys. (1997)106(23):9869-9882.

Lawless, D. et al., "Bifunctional capping of CdS nanoparticles and bridging to TiO2" J. Phys. Chem. (1995) 99:10329-10335.

Lee, J. et al., "Full color emission from II-VI semiconductor quantum dot-polymer composites" Adv. Mater. (2000) 12(15) :1102-1105.

Li, L-S. et al., "Band gap variation of size- and shape-controlled colloidal CdSe quantum rods" Nanoletters (2001) 1:349-351.

Li, L-S. et al., "Semiconductor nanorod liquid crystals" Nanoletters (2002) 2:557-560.

Liu, C. et al., "Sol-Gel synthesis of free-standing ferroelectric lead zirconate titanate nanoparticles" J. Am. Chem. Soc. (2001) 123(18):4344-4345.

Manna, L. et al., "Synthesis of soluble and processable rod-, arrow-, teardrip-, and tetrapod-shaped CdSe nanocrystals," *J. Am. Chem. Soc.* (2000) 122(51):12700-12706.

Manna, L. et al., "Epitaxial growth and photochemical annealing of graded CdS/ZnS shells on colloidal CdSe nanorods,"J. Am. Chem. Soc. (2002) 124(24):7136-7145.

Matsumoto, H. et al., "Preparation of monodisperse CdS nanocrystals by size selective photocorrosion" J. Phys. Chem. (1996) 100(32):13781-13785.

Morales, A.M. et al., "A laser ablation method for the synthesis of crystalline semiconductor nanowires" Science (1998) 279(9):208-211.

Murray, C.B. et al., "Synthesis and characterization of nearly monodisperse CdE (E=S, Se, Te) semiconductor nanocrystallites" J. Am. Chem. Soc. (1993) 115:8706.

Nirmal, M. et al., "Fluorescence intermittency in single cadmium selenide nanocrystals" Nature (1996) 383:802-804.

Peng, X. et al., "Epitaxial growth of highly luminescent CsDe/CdS core/shell nanocrystals with photostability and electronic accessibility" J. Am. Chem. Soc. (1997) 119(30):7019-7029.

Peng, X. et al., "Shape control of CdSe nanocrystals," *Nature* (2000) 404(6773):59-61.

Puntes, V.F. et al., "Colloidal nanocrystal shape and size control: the case of cobalt" *Science* (2001) 291:2115-2117.

Rockenberger, J. et al., "A new nonhydrolytic single-precursor approach to surfactant-capped nanocrystals of transition metal oxides" *J. Am. Chem. Soc.* (1999) 121:11595-11596.

Scher, E.C. et al., "Shape control and applications of nanocrystals" Philosophical Transactions of the Royal Society London, Series A (2003) 361:241-257.

Schlamp, M.C. et al., "Improved efficiencies in light emitting diodes with with CdSe (CdS) core/shell type nanocrystals and a semiconducting polymer" J. Appl. Phys. (1997) 82:5837-5842.

Urban, J.J. et al., "Synthesis of single-crystalline perovskite nanorods composed of varium titanate and strontium titanate" J. Am. Chem. Soc. (2002) 124(7):1186-1187.

Wang, J. et al., "Highly polarized photoluminescence and photodetection from single indium phosphide nanowires," *Science* (2001) 293:1455-1457.

Wu, Y. et al., "Block-by-block growth of single-crystalline Si/SiGe superlattice nanowires" Nano Letters (2002) 2(2):83-86.

Yun, W.S. et al., "Ferroelectric properties of individual barium titanate nanowires investigated by scanned probe microscopy" Nano Letters (2002) 2(2):447-450.

\* cited by examiner

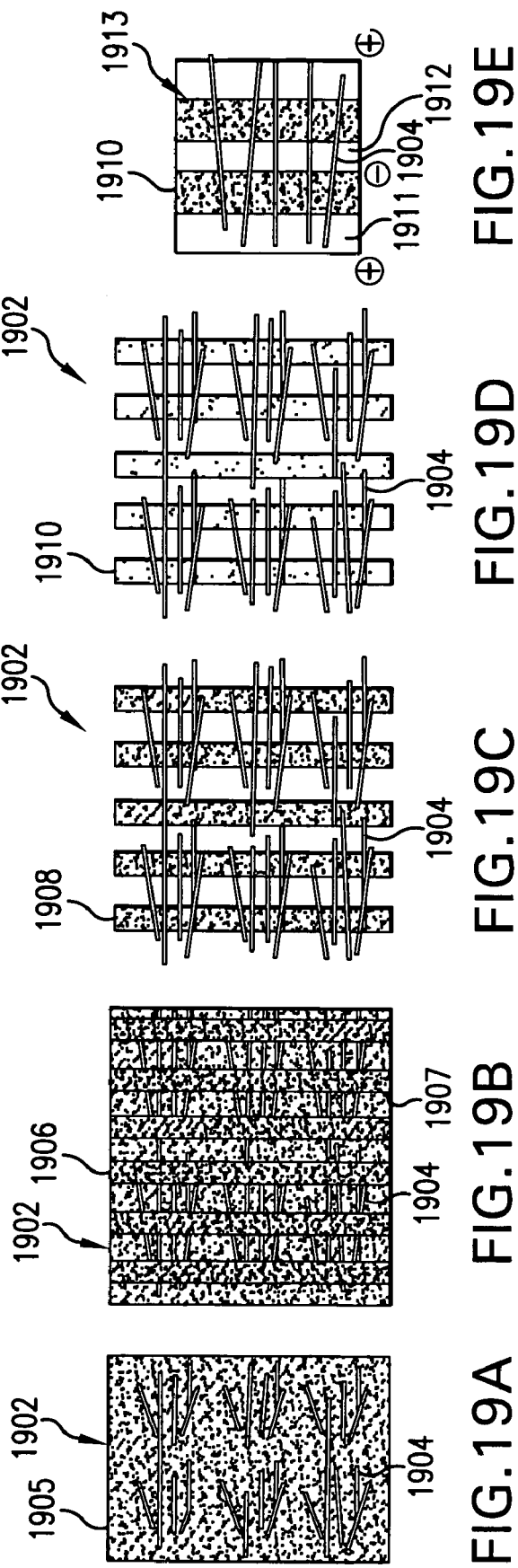

SYSTEM AND PROCESS FOR PRODUCING NANOWIRE COMPOSITES AND ELECTRONIC SUBSTRATES THEREFROM

CROSS-REFERENCE TO RELATED APPLICATION

This application is a divisional of U.S. patent application Ser. No. 10/910,800, filed Aug. 4, 2004, which claims the benefit of U.S. Provisional Patent Application No. 60/491,979, filed Aug. 4, 2003, each of which is incorporated herein in its entirety.

BACKGROUND OF THE INVENTION

1. Field of the Invention

The present invention relates to semiconductor devices, and more particularly, to the preparation of active elements for use in semiconductor devices.

2. Related Art

An interest exists in industry in developing low cost electronics, and in particular, in developing low cost, large area electronic devices. Availability of such large area electronic devices could revolutionize a variety of technology areas, ranging from civil to military applications. Example applications for such devices include driving circuitry for active matrix liquid crystal displays (LCDs) and other types of matrix displays, smart libraries, credit cards, radio-frequency identification tags for smart price and inventory tags, security screening/surveillance or highway traffic monitoring systems, large area sensor arrays, and the like.

Current approaches involve using amorphous silicon or organic semiconductors as the base materials for electronic devices, such as thin-film transistors (TFTs). However, amorphous silicon and organic semiconductors have performance limitations. For example, they exhibit low carrier mobility, typically about 1 $cm^2/V\_s$ (centimeter squared per volt second) or less. Furthermore, they require relatively expensive processes, such as laser induced annealing, to improve their performance.

An alternative approach involves using semiconductor nanowires as the building blocks for large area electronic and optoelectronic devices. A wide range of Group IV, III-V and II-VI semiconductor nanowires can be rationally synthesized with tunable chemical composition, physical dimension and electronic properties, see Duan, X., et al. Nanowire Nanoelectronics Assembled from the Bottom-up, in Molecular Nanoelectronics, Reed, M. ed., American Scientific Publisher, New York (2002); Duan, X. and Lieber, C. M., *Adv. Mater.* 12:298-302 (2000) and Gudiksen, M. S., et al. *J. Phys. Chem. B* 105:4062-4062 (2001), each of which are incorporated herein, in their entirety, for all purposes.

The extended longitudinal dimension and reduced lateral dimension makes nanowires the smallest dimension materials for efficient transport of electrical carriers. A variety of nanodevices have been demonstrated using the nanowires, including field effect transistors (FETs), logic circuits, memory arrays, light-emitting diodes (LEDs) and sensors, see Huang, Y. et al., *Nano Letters* 2:101-104 (2002); Huang, Y. et al., *Science* 294:1313-1317 (2001); Duan, X., et al., *Nano Letters* 2:487-490 (2002); Wang, J., et al., *Science* 293:1455-1457 (2001); Cui, Y., et al, *Science* 293:1289-1292 (2001); U.S. Patent Publication No. 20050079659, which is incorporated herein, in its entirety, for all purposes.

While nanowires show promise as high mobility electrical carriers, their use in devices is currently limited by difficulties that arise in harvesting nanowires from the substrates on which they have been synthesized. If the nanowires are not harvested, then the range of nanodevices that employ nanowires are limited because only those substrates suitable for nanowire synthesis can be used in the device. Currently, nanowires are harvested by separating the nanowires from the substrate using mechanical devices, such as a razor blade or other knife-edges. This method has drawbacks including possible physical damage to the nanowires during harvesting. Therefore, there is a need to develop efficient methods of harvesting nanowires from the substrates on which they are synthesized.

SUMMARY OF THE INVENTION

In a first aspect, the present invention relates to a system and process for producing a nanowire-material composite. A substrate is provided having nanowires attached to a portion of at least one surface. A material is deposited over the portion to form the nanowire-material composite. The nanowire-material composite is optionally separated from the substrate to form a freestanding nanowire-material composite.

In another aspect, the present invention relates to a system and process for depositing oriented nanowires. A first substrate having nanowires attached to a portion of at least one surface is provided. Each nanowire has a first end attached to the portion. A material is deposited over the portion to form a nanowire-material composite. The nanowire-material composite is patterned to form a patterned composite. The patterned composite is separated from the first substrate. The patterned composite is applied to a second substrate such that the nanowires are aligned substantially parallel to the second substrate. The material is optionally removed from the nanowire-material composite to form on the second substrate a thin film of nanowires aligned substantially parallel to the second substrate and having a sufficient density to achieve an operational current level. A plurality of semiconductor device regions is defined in the thin film of nanowires. Contacts are formed at the semiconductor device regions to thereby provide electrical connectivity to the plurality of semiconductor devices.

In another aspect, the invention relates to a system and process for producing an electronic substrate. A nanowire-material composite comprising a plurality of nanowires is attached to a portion of a substrate. The nanowire-material composite is patterned to define one or more semiconductor device regions. Contacts are formed at the semiconductor device regions to thereby provide electrical connectivity to the device regions. A nanowire-material composite can be attached to the portion of the substrate by lamination. The nanowire-material composite is optionally planarized to expose a portion of the nanowires after the composite is attached to the substrate. A dielectric layer is optionally deposited on the nanowire-material composite. The dielectric layer is etched to form a patterned dielectric layer and to expose a portion of the nanowire-material composite to define the one or more semiconductor device regions. The exposed nanowire-material composite is optionally doped. The dielectric layer is removed. The semiconductor device regions are metallized to form electrical connectivity to the device regions.

A p-n junction is optionally formed in the nanowire-material composite. The nanowires are formed from at least one light emitting semiconducting material such that the p-n junctions emit light during operation. The light emitting materials include at least one of GaN, GaP, GaAs, InP, InAs, ZnO and a combination thereof. Alternatively, the nanowire-material composite is formed from a plurality of nanowire-material composite layers. Each nanowire-material composite layer includes at least one of the light-emitting semiconducting materials selected to emit light at a wavelength different from the other layers.

In an aspect, a first nanowire-material composite layer of the plurality of nanowire-material composite layers is formed from at least one light emitting semiconducting material selected to emit light at a blue light wavelength. A second nanowire-material composite layer of the plurality of nanowire-material composite layers is formed from at least one light-emitting semiconducting material selected to emit light at a green light wavelength. A third nanowire-material composite layer of the plurality of nanowire-material composite layers from at least one light-emitting semiconducting material selected to emit light at a red light wavelength. The first nanowire-material composite layer is coupled to a first surface of the second nanowire-material composite layer. A second surface of the second nanowire-material composite layer is coupled to a first surface of the third nanowire-material composite layer. A second surface of the third nanowire-material composite layer is attached to the substrate.

In another aspect, the present invention relates to a system and process for forming a composite. A plurality of nanowires are grown on a portion of a substrate, each nanowire having an end attached to the portion. A material is deposited on the substrate to cover the portion. The material encases the plurality of nanowires on the portion to form a nanowire-material composite layer. A material applicator is optional, which deposits the material on the substrate. The plurality of nanowires are optionally substantially aligned parallel to their long axis in the material. The material applicator flows the material onto the substrate to align the plurality of nanowires. A composite hardener is optional, which hardens the material on the portion. A composite processor is optional. A separator is optional, which separates the nanowire-material composite from the substrate.

In another aspect, the present invention relates to a process for producing a nanowire-material composite. The process comprises contacting nanowires with a material to form a mixture and depositing the mixture on a substrate to form a nanowire-material composite. The substrate comprises a semiconductor, glass, ceramic, polymer, metal, composite thereof, one or both of the interior and exterior surface of a tube or an irregular object, e.g. reticulated macroporous metal, oxide or ceramic.

The process optionally further comprises hardening the composite, separating the composite from the substrate to form a free-standing nanowire-material composite, and aligning the nanowires, such as by applying an electric field across the composite.

In another aspect, the present invention relates to a process for forming a nanowire array and a nanowire array prepared according to the process. The process comprises providing a nanowire-material composite, applying a mask comprising a pattern to the nanowire-material composite to form a masked composite; removing a portion of the material from the composite to expose the nanowires embedded in the portion and form an array of exposed nanowires in said nanowire-material composite.

The mask can comprise a metal foil comprising a pattern that allows for the selective removal of material from the composite. The patterns comprise an array of shapes, (e.g. circles, squares, triangles, rectangles and the like). The material is removed using a plasma etch, organic solvent, or other way.

In another aspect, the present invention relates to a process for producing a high capacitance capacitor, and a capacitor produced by the process. The process comprises providing a free-standing nanowire-material composite, depositing a metal on both surfaces of the composite film, depositing an insulator on a metal surface to form a capacitor film, and assembling a capacitor. The assembling step comprises optional further processing steps including, but not limited to attaching leads to the metal surfaces, rolling the capacitor film and sealing the film in a canister. The nanowires are optionally oriented in the nanowire-material composite, such as orienting the nanowires perpendicular to the composite surface.

In another aspect, the present invention relates to an alternative process for producing a high capacitance capacitor, and a capacitor produced by the process. The process comprises providing a metal foil having a surface coated with an insulator, depositing gold nanoparticles on a portion of the insulator, growing nanowires on the portion, depositing a material over the portion to embed the nanowires and form a nanowire-material composite, depositing metal on the nanowire-material composite to form a capacitor film, and assembling the capacitor.

In another aspect, the present invention relates to a process of producing a tubular nanowire-material composite. The process comprises contacting nanowires with a material to form a mixture, and extruding the mixture to form a tubular nanowire-material composite. The process optionally further comprises removing a portion of the material from one or both of the inner and outer surfaces of the tubular nanowire-material composite to expose a portion of the nanowires.

In another aspect, the present invention relates to an alternative process of producing a tubular nanowire-material composite. The process comprises providing a substrate having nanowires attached perpendicular to a portion of at least one surface, and depositing a material over the portion to form a nanowire-material composite. The process optionally further comprises hardening the composite by removing solvent or polymerizing the material. The process further comprises separating the nanowire-material composite from the substrate to form a free-standing nanowire-material composite, optionally cutting the free-standing composite into strips, and bonding together the ends of the free-standing composite to form a tubular nanowire-material composite. The bonding step can comprise gluing together the ends of the free-standing composite. The process optionally further comprises removing a portion of the material from one or both of the inner and outer surfaces of the tubular nanowire-material composite to partially expose the nanowires.

In another aspect, the present invention relates to a free-standing nanowire-material composite. The freestanding nanowire-material composite can be in the form of a sheet that can be rolled and stored for later use or further processing. The nanowire-material composite optionally comprises a portion of exposed nanowires. The exposed nanowires are optionally exposed in an array of circular wells.

These and other objects, advantages and features will become readily apparent in view of the following detailed description of the invention.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 19A-19E show a nanowire-material composite being processed to form an electronic substrate, according to an embodiment of the present invention.

Figure 1:
FIG. 1 shows a view of a portion of a thin film of nanowires, according to an example embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanotube and nanowire technologies and other functional aspects of the systems (and components of the individual operating components of the systems) may not be described in detail herein. Furthermore, for purposes of brevity, the invention is frequently described herein as pertaining to a semiconductor transistor device. It should be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term nanowire generally refers to any elongated conductive or semiconductive material that includes at least one cross sectional dimension that is less than 500 nm, and preferably, less than 100 nm, and has an aspect ratio (length:width) of greater than 10, preferably, greater than 50, and more preferably, greater than 100. Examples of such nanowires include semiconductor nanowires as described in Published International Patent Application Nos. WO 02/17362, WO 02/48701, and WO 01/03208, each of which is incorporated in its entirety for all purposes, carbon nanotubes, and other elongated conductive or semiconductive structures of like dimensions. Particularly preferred nanowires include semiconductive nanowires, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, $CaCN_2$, $ZnGeP_2$, $CdSnAs_2$, $ZnSnSb_2$, $CuGeP_3$, $CuSi_2P_3$, (Cu, Ag)(Al, Ga, In, Tl, Fe)(S, Se, Te)$_2$, $Si_3N_4$, $Ge_3N_4$, $Al_2O_3$, (Al, Ga, In)$_2$ (S, Se, Te)$_3$, $Al_2CO$, and an appropriate combination of two or more such semiconductors. In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si.; or an n-type is selected from a group consisting of: Si, Ge, Sn, S, Se and Te.

Hence, although the term nanowire is referred to throughout the description herein for illustrative purposes, it is intended that the descriptions herein also encompass the use of nanotubes. Nanotubes can be formed in combinations/thin films of nanotubes as is described herein for nanowires, alone or in combination with nanowires, to provide the properties and advantages described herein.

Furthermore, it is noted that thin film of nanowires of the present invention can be a heterogeneous film, which incorporates semiconductor nanowires and/or nanotubes, and/or nanowires/nanotubes of different composition and/or structural characteristics. For example, a heterogeneous film can include nanowires/nanotubes with varying diameters and lengths, and nanotubes and/or nanotubes that are heterostructures having varying characteristics.

In the context of the invention, the substrate to which nanowires are attached may comprise: a uniform substrate, e.g., a wafer of solid material, such as silicon, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

The substrates to which nanowires are grown, attached or processed may further comprise irregular surfaces. For example, nanowires may be grown or attached to substrates such as the interior and exterior surfaces of a tube and interior and exterior surfaces of a porous medium, e.g. reticulated macroporous metals, oxides, ceramics and other porous medium.

By substantially aligned or oriented is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., above, below, up, down, top, bottom, etc.) made herein are for purposes of illustration only, and that devices of the present invention can be spatially arranged in any orientation or manner.

Nanowire Film Embodiments

The present invention is directed to a method of harvesting nanowires and the use of nanowires in systems and devices to improve system and device performance. For example, the present invention is directed to the use of nanowires in semiconductor devices. According to the present invention, multiple nanowires are formed into a high mobility thin film and/or a nanowire-material composite. The thin film and/or composite of nanowires is used to harvest nanowires and/or in electronic devices to enhance the performance and manufacturability of the devices.

FIG. 1 shows a close-up view of a thin film of nanowires 100, according to an example embodiment of the present invention. Thin film of semiconductor nanowires 100 can be used instead of amorphous silicon or organic thin films in conventional electronic devices to achieve improved device behavior, while allowing for a straightforward and inexpensive manufacturing process. Through the use of thin films of nanowires, the present invention is particularly adapted to making high performance, low cost devices on large and flexible substrates.

Note that thin film of nanowires 100 as described herein may be formed in a wide range of possible surface areas. For example, thin films of nanowires 100 of the present invention can be formed to have functional areas greater than 1 mm$^2$, greater than 1 cm$^2$, greater than 10 cm$^2$, greater than 1 m$^2$, and even greater or smaller areas.

As shown in FIG. 1, thin film of nanowires 100 includes a plurality of individual nanowires closely located together. Thin film of nanowires 100 can have a variety of thickness amounts that are equal to or greater than the thickness of a single nanowire. In the example of FIG. 1, the nanowires of thin film of nanowires 100 are aligned such that their long axes are substantially parallel to each other. Note that in alternative embodiments, the nanowires of thin film of nanowires 100 are not aligned, and instead can be oriented in different directions with respect to each other, either randomly or otherwise. In an alternative embodiment, the nanowires of thin film of nanowires 100 may be isotropically oriented, so that high mobility is provided in all directions. Note that the nanowires of thin film of nanowires 100 may be aligned in any manner relative to the direction of electron flow in order to enhance performance as required by a particular application.

Figure 2:
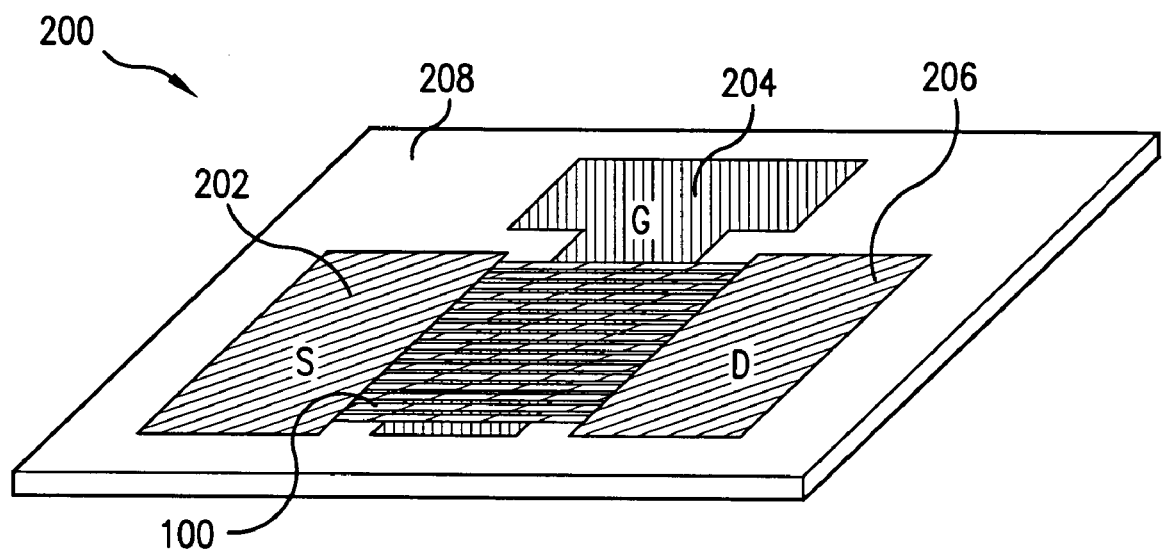
FIG. 2 shows a semiconductor device that includes a thin film of nanowires, according to an example embodiment of the present invention.

FIG. 2 shows a semiconductor device 200 that includes thin film of nanowires 100, according to an example embodiment of the present invention. In FIG. 2, semiconductor device 200 is shown as a transistor, having a source electrode 202, a gate electrode 204, a drain electrode 206, formed on a substrate 208. Thin film of nanowires 100 is coupled between source electrode 202 and drain electrode 206 over a portion of gate electrode 204. Alternatively, gate electrode 204 is formed over nanowires 100, which are coupled between source electrode 202 and drain electrode 206. Thin film of nanowires 100 substantially operates as a channel region for the transistor of semiconductor device 200, and allows semiconductor 200 to operate with enhanced characteristics, as further described herein. Numerous substrate types applicable to substrate 208 are described elsewhere herein.

Note that semiconductor device 200 is shown as a transistor in FIG. 2 for illustrative purposes. It would be understood to persons skilled in the relevant art(s) from the teachings herein that thin film of nanowires 100 can be included in semiconductor device types in addition to transistors, including diodes.

In embodiments, the nanowires of thin film of nanowires 100 are single crystal semiconductor nanowires that span all the way between source electrode 202 and drain electrode 206. Hence, electric carriers can transport through the single crystal nanowires, resulting in high mobility that is virtually impossible to obtain with current amorphous and polysilicon technologies.

In addition, and without being bound to any particular theory of operation, due to a one-dimensional nature of the electron-wave traversing inside the nanowire channel, and a reduced scattering probability, it may be possible for nanowires to achieve even higher mobility than a bulk single crystal material. Nanowires can be designed to be a "ballistic" transport for electrical carries. "Ballistic" is used herein to mean transport through a nanowire with no scattering and where the nanowire has quantized resistance.

Note that a variety of contact area types can be formed for semiconductor devices incorporating nanowires. Contact area is used herein to mean the electrical connectivity between an electrode and another element of the device, for example, the connectivity between the gate electrode, a dielectric layer and a nanowire in a MOSFET. The contact areas can be Ohmic and non-Ohmic. Alternatively, a non-ohmic Schottky diode barrier contact can be used as an electrode. A Schottky diode barrier contact is commonly used for a III-V semiconductor material when it is difficult to make a high quality gate dielectric. Source electrodes 202, gate electrodes 204, and drain electrodes 206 are formed of a conductive material, such as a metal, alloy, silicide, polysilicon, or the like, including combinations thereof, as would be apparent to a person having ordinary skill in the art.

As described above, the nanowires of thin film of nanowires 100 can be aligned or oriented. For example, the nanowires of thin film of nanowires 100 shown in FIG. 2 can be aligned parallel to the length of the channel between source electrode 202 and drain electrode 206, or can be aligned in alternative ways.

Thin film of nanowires 100 can be formed with a sufficient number of nanowires to provide desired characteristics for semiconductor device 200. For example, thin film of nanowires 100 can be formed of a sufficient number or density of nanowires to achieve a desired operational current density or current level desired for the particular application. For example, the current level may be in the nanoamp range, including 2 nanoamps, and greater and lesser current levels. For instance, in the transistor example of FIG. 2, thin film of nanowires 100 can be formed to have a current level in the channel of greater than about 10 nanoamps.

For example, to achieve the required operational current density, a minimum number of nanowires can be included in the thin film of nanowires for a given area on the substrate. Hence, each formed semiconductor device will have a sufficient number of nanowires to carry current at an operational current level. For example, the required number of nanowires per unit area can be 1 nanowire, 2 nanowires, and any other greater number of nanowires, including 5, 10, 100 or more.

In another aspect, a thin film of nanowires 100 can be formed to have asymmetric mobility. For example, this can be accomplished by asymmetrically aligning the nanowires of thin film of nanowires 100, and/or by doping the nanowires in a particular manner. Such asymmetric mobility can be caused to be much greater in a first direction than in a second direction. For example, asymmetric mobilities can be created in the order of 10, 100, 1000, and 10000 times greater in the first direction than in the second direction, or to have any other asymmetric mobility ratio between, greater, or less than these values.

The nanowires of thin film of nanowires 100 can be doped in various ways to modify performance and for device fabrication. The nanowires can be doped prior to inclusion in semiconductor device 200, or after inclusion. The nanowires can be doped during growth and synthesis, prior to being formed into a thin film, after being formed into a thin film or when embedded in a composite. A thin film of nanowires can be doped after being formed on the substrate. Furthermore, a nanowire can be doped differently along portions of its long axis, and can be doped differently from other nanowires in thin film of nanowires 100. Some examples of doping schemes for individual nanowires, and for thin films of nanowires are provided as follows. However, it will be apparent to persons skilled in the relevant art(s) from the teachings herein that nanowires, and thin films thereof, can be doped according to additional ways, and in any combination of the ways described herein.

Figure 3A:
FIGS. 3A-3E show nanowires doped according to various example embodiments of the present invention.

FIG. 3A shows a single crystal nanowire 300. Nanowire 300 can be doped or undoped. Nanowire 300 can be doped uniformly or non-uniformly. Single crystal nanowires can be doped into either p- or n-type semiconductors in a fairly controlled way for device fabrication. The type of dopant and dopant concentration in nanowire 300 can be changed to tune the operating characteristics of a device. Carrier mobility in nanowire 300, threshold voltage for device switching and off-state current flow are all effected by the type and concentration of doping. Carrier mobility levels up to 1500 $cm^2/V\_s$ have been shown for single p-type Si (silicon) nanowires, and carrier mobility levels up to 4000 $cm^2/V\_s$ have been shown for n-type InP nanowires.

Figure 3B:
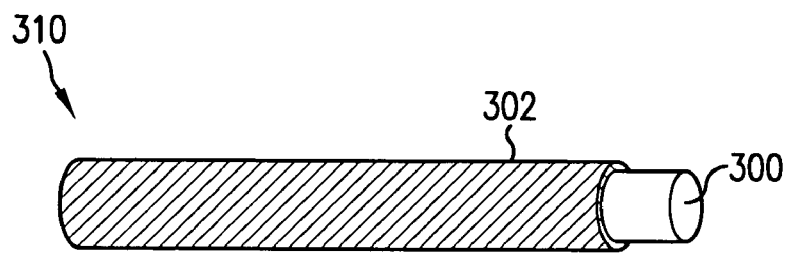

FIG. 3B shows a nanowire 310 doped according to a core-shell structure. As shown in FIG. 3B, nanowire 310 has a doped surface layer 302, which can have varying thickness levels, including being only a molecular monolayer on the surface of nanowire 310. Doping concentration can vary throughout the thickness of shell surface layer 302. Such surface doping can separate impurities from conducting core 300 and decrease the probability of impurity-related scattering events at the interface of core 300 and shell 302. This core-shell architecture may lead to greatly enhanced carrier mobility inside nanowire core 300 or at its interface with shell 302. Ballistic transport may be achieved inside nanowire 310 when no scattering occurs and the distance between source and gain electrodes is no greater than the length of nanowire 310. Further detail on doping of nanowires is provided below. For transistor-type device fabrication, a dielectric layer and gate are also deposited on nanowire 310.

Figure 3C:
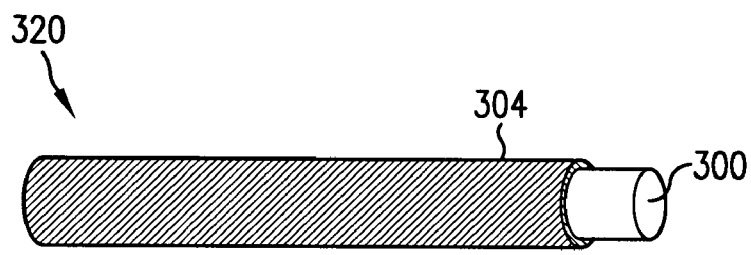

FIG. 3C shows a nanowire 320 that is coated with a dielectric material layer 304, according to another type of core-shell structure. Dielectric material layer 304 can be chosen from a variety of dielectric materials, such as $SiO_2$ or $Si_3N_4$. The use of dielectric material layer 304 can act as a protective layer in semiconductor device 200, for example, by reducing leakage and preventing electrical shorts. In another example, the dielectric layer can act as a gate dielectric in a field effect transistor (FET). The dielectric layer can be formed by oxidizing the nanowire, coating the nanowire, or otherwise forming the dielectric layer. For example, other high dielectric constant materials can be used, including silicon nitride, $Ta_2O_5$, $TiO_2$, $ZrO_2$, $HfO_2$, $Al_2O_3$, AlN, AlO, SiC and others, including organic materials, for example, perylene. Nitridation of nanowires can be accomplished with processes similar to those employed in oxidation of nanowires. These materials can be applied to nanowires by gas-phase deposition processes, including, but not limited to, chemical vapor deposition (CVD), plasma assisted chemical vapor deposition (PACVD) and physical vapor deposition (PVD); solution phase over-coating or simply by spin-coating the appropriate precursor onto the substrate. Vapors of the dielectric can be prepared by any method known in the art, including those employing molten dielectric or vapors created by high voltage discharge or sputtering of the dielectric. Other known techniques can be employed.

Figure 3D:
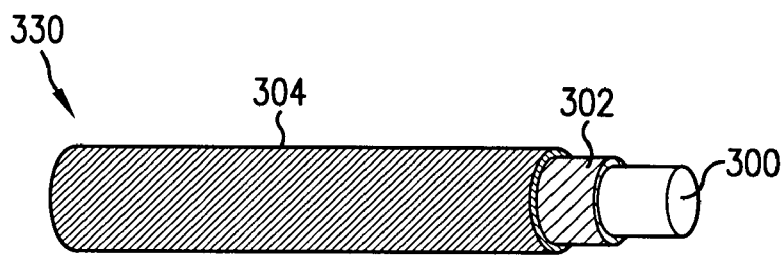

FIG. 3D shows a nanowire 330 with core 300 and with a doped shell surface layer 302 according to the core-shell structure shown in FIG. 3B. Nanowire 330 is also coated with a dielectric material layer 304, as shown in FIG. 3C. Shell material 302 should have a bandgap higher than that of core material 300. For example, when GaAs nanowires are used for core 300, GaAlAs can be used for doped shell 302. Doped shell 302 has thickness less than the diameter of core 300. Dielectric layer 304 is not doped and has thickness in the range of about 5 nanometers to about 100 nanometers.

Figure 3E:
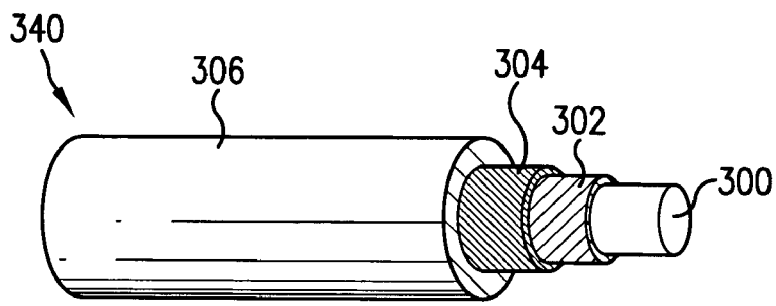

FIG. 3E shows a nanowire 340 with core-shell-dielectric architecture of FIG. 3D, and with a gate layer 306 coated over dielectric layer 304. Preferably, dielectric layer 304 is formed on the surface of the nanowire-material composite such that the distance between the gate and nanowire 300 is 5 nanometers or less, 10 nanometers or less, 50 nanometers or less, or 100 nanometers or less.

Figure 4A:
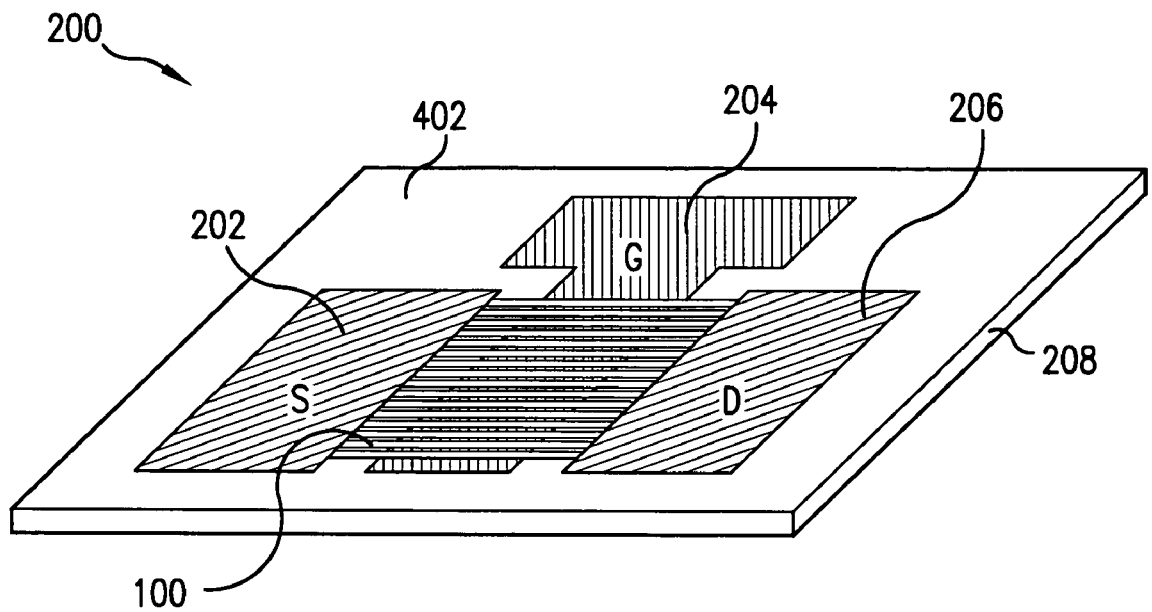
FIGS. 4A and 4B show examples of a semiconductor device, doped according to example doping embodiments of the present invention.
Figure 4B:
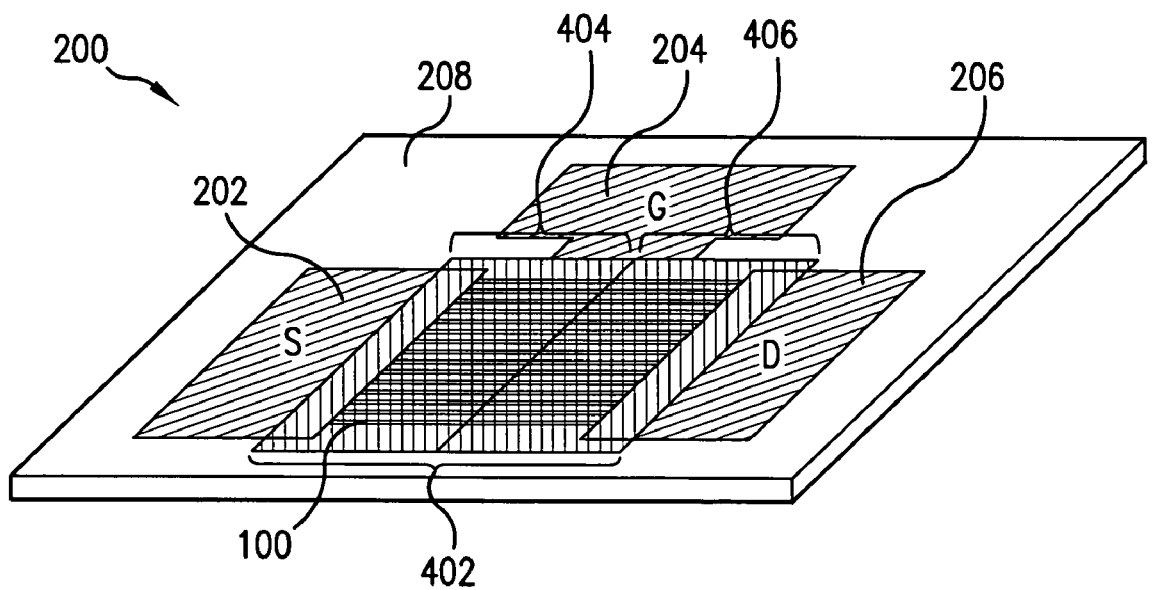

FIGS. 4A and 4B show examples of semiconductor device 200, according to example doping embodiments of the present invention. As shown in FIG. 4A, the top surface of substrate 208 is coated with a dopant layer 402. Dopant layer 402 includes electron-donor or electron acceptor doping materials. Properties of semiconductor device 200 can be controlled by the introduction of dopant layer 402. The electron-donor or electron acceptor materials introduce negative or positive charge carriers into the nanowires to achieve n- or p-channel transistors, respectively. Very high mobility levels can be attained in this configuration for semiconductor device 200 because the dopants are separated from the actual conducting channel.

As shown in FIG. 4B, dopant layer 402 covers a region of substrate 208 substantially localized around thin film of nanowires 100. In embodiments, dopant layer 402 applied to semiconductor device 200 can be patterned to have two or more areas doped according to different n- and p-type characteristics. For example, in the embodiment of FIG. 4B, dopant layer 402 has a first portion 404 doped with an n-type characteristic, and a second portion 406 doped with a p-type characteristic. In such an embodiment, a p-n junction can be achieved according to a variety of electronic and optoelectronic devices, including light-emitting diodes (LEDs). Electronic devices other than device 200 can be fabricated using the method described above. For example, a diode can be fabricated as shown in FIG. 4B, although the diode would have electrodes 202 and 206, as gate electrode 204 would not be necessary. Doped areas can vary in dopant type, size and position throughout the device as is necessary in the fabrication particular devices.

As described above, dopant layer 402 can be introduced on substrate 208 prior to or after actual fabrication of semiconductor device 200.

Collections of nanowires manufactured with these materials are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires. For example a thin film of nanowires used in a semiconductor device can be formed to include 2, 5, 10, 100, and any other number of nanowires between or greater than these amounts, for use in high performance electronics.

Note that nanowires can also be used to make high performance composite materials when combined with polymers/ materials such as organic semiconductor materials, which can be flexibly spin-cast on any type of substrate. Nanowire/ polymer composites can provide properties superior to a pure polymer materials. Further detail on nanowire/polymer composites is provided below.

As described above, collections or thin films of nanowires can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/Vs$.

Aligned collections or thin films of nanowires provide for materials having performance comparable or superior to single crystal materials. Furthermore, collections or thin films of nanowires that include aligned ballistic nanowires (e.g., core-shell nanowires as shown in FIG. 3B) can provide dramatically improved performance over single crystal materials.

Aligned and non-aligned, and composite and non-composite thin films of nanowires can be produced in a variety of ways, according to the present invention. Example embodiments for the assembly and production of these types of thin films of nanowires are provided as follows.

Randomly oriented thin films of nanowires can be obtained in a variety of ways. For example, nanowires can be dispersed or suspended into a suitable solution. The nanowires can then be deposited onto a desired substrate using spin-casting, drop-and-dry, flood-and-dry, or dip-and-dry approaches. These processes can be undertaken multiple times to ensure a high degree of coverage. Randomly oriented thin films of nanowires/polymer composites can be produced in a similar way, providing that the solution in which the nanowires are dispersed is a polymer solution.

Aligned thin films of nanowires can be obtained in a variety of ways. For example, aligned thin films of nanowires can be produced by using the following techniques: (a) Langmuir-Blodgett film alignment; (b) fluidic flow approaches, such as described in U.S. Ser. No. 10/239,000, filed Sep. 10, 2002, and incorporated herein by reference in its entirety for all purposes; and (c) application of mechanical shear force. For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin casting of the desired polymer onto the created thin film of nanowires. For example, nanowires may be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

Thin films of nanowires can be formed on virtually any substrate type, including silicon, glass, quartz, polymeric, and any other substrate type describe herein or otherwise known. The substrate can be large area or small area, and can be rigid or flexible, such as a flexible plastic or thin film substrate type. Furthermore, the substrate can be opaque or transparent, and can be made from a conductive, semiconductive, or a non-conductive material.

Nanowire film contacts, including sources, drains, and gates, for example, can be patterned on a substrate using standard photolithography, ink-jet printing, or micro-contact printing processes, for example, or by other processes.

A dielectric layer can be applied to a thin film of nanowires on a substrate to electrically insulate gate contacts, for example. These materials can be applied to nanowires by gas-phase deposition processes, including, but not limited to, chemical vapor deposition (CVD), plasma assisted chemical vapor deposition (PACVD) and physical vapor deposition (PVD); solution phase over-coating or simply by spin-coating the appropriate precursor onto the substrate. Other known techniques can be employed, for example, sputtering and others. Such a deposition of a dielectric layer on a substrate may not be necessary if the nanowires are insulated by their own dielectric layer.

Note that nanowire films can be patterned on a substrate using various processes, including lithography techniques. Deposition and patterning of thin film of nanowires can be done simultaneously using various processes, such as ink-jet printing or micro-contact printing methods.

Note that the order in which contacts are patterned can be varied. For example, gates 204, sources 202, and drains 206 shown in FIG. 2 can be patterned simultaneously with each other, or at different times. They can be all be patterned prior to deposition of the thin film of nanowires 100, or afterwards. Sources 202 and drains 206 can be patterned prior to deposition of the thin film of nanowires 100, while gates 204 are patterned afterwards. Alternatively, gates 204 can be patterned prior to deposition of the thin film of nanowires 100, while sources 202 and drains 206 are patterned afterwards. Either of sources 202 and drains 206 can also be patterned prior to deposition of the thin film of nanowires 100, while the other is patterned afterwards.

Note that in some embodiments, more than one layer of a thin film of nanowires can be applied to a substrate in a given area. The multiple layers can allow for greater electrical conductivity, and can be used to modify electrical characteristics of a respective semiconductor device. The multiple layers can be similar, or different from each other. For example, two or more layers of thin films of nanowires having nanowires aligned in different directions, doped differently, and/or differently insulated, can be used in a particular semiconductor device. A contact area of a particular semiconductor device can be coupled to any one or more of the layers of a multiple layer thin film of nanowires. Note that a thin film of nanowires can be formed as a monolayer of nanowires, a sub-monolayer of nanowires, and greater than a monolayer of nanowires, as desired.

Example Applications of Nanowire Films of the Present Invention

Nanowire Composite Embodiments

Figure 5:
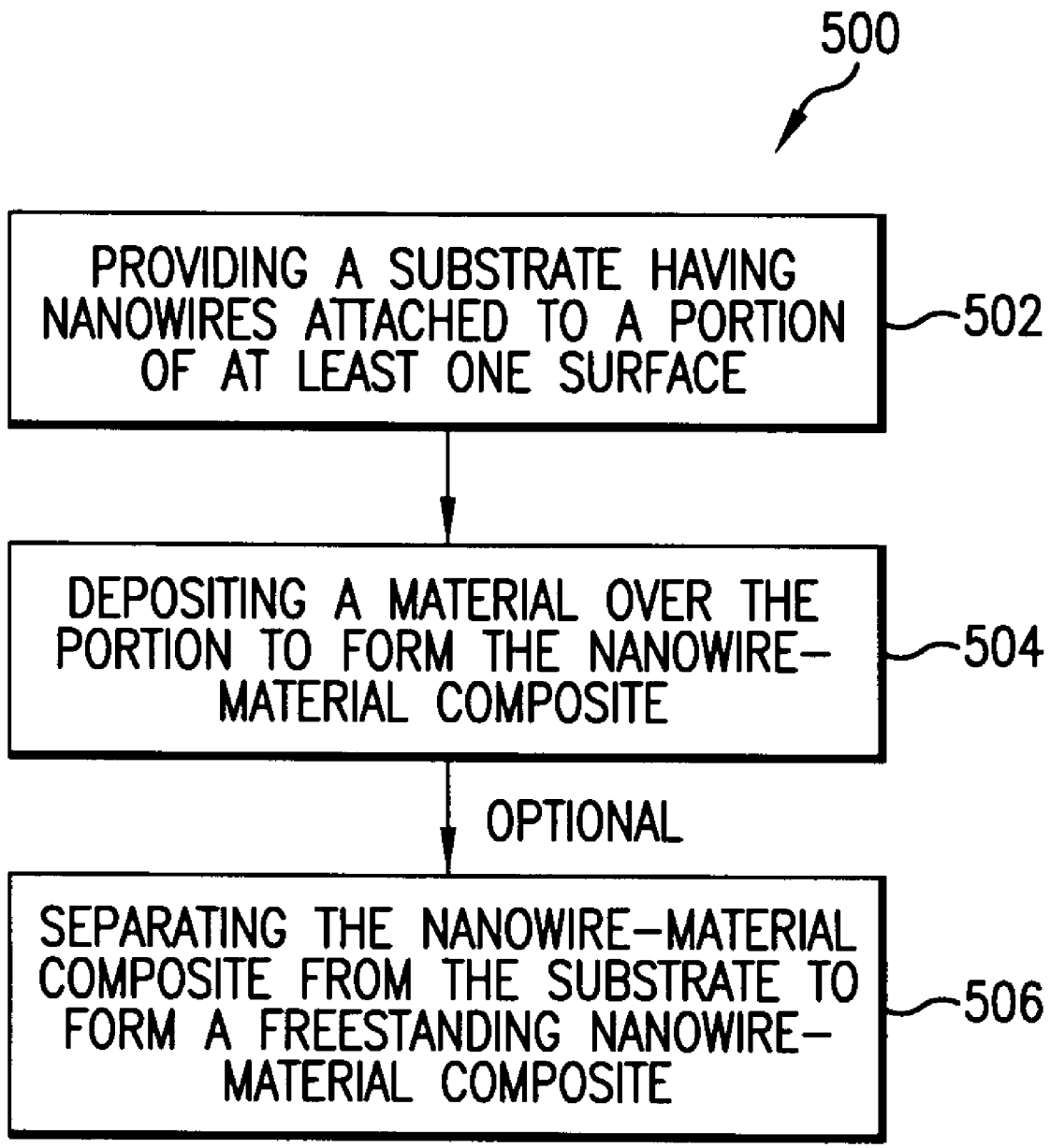
FIG. 5 is a flow diagram for a process for producing a freestanding nanowire-material composite, according to an embodiment of the present invention.
Figure 6A:
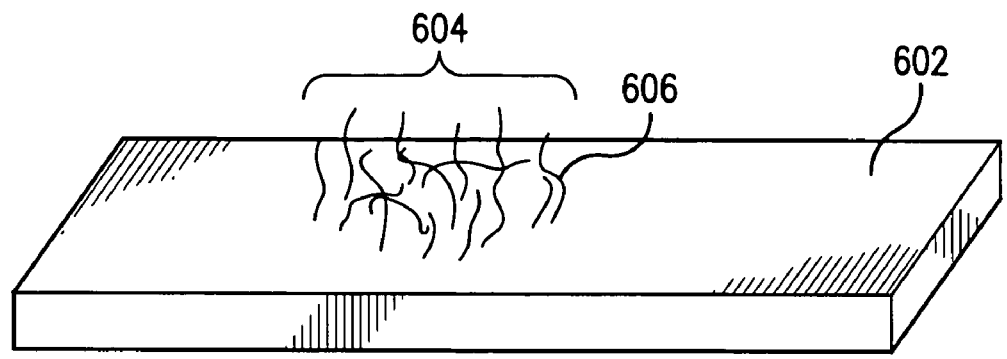
FIGS. 6A-6C illustrate a freestanding nanowire-material composite being fabricated on a substrate, according to the process of FIG. 5.
Figure 6B:
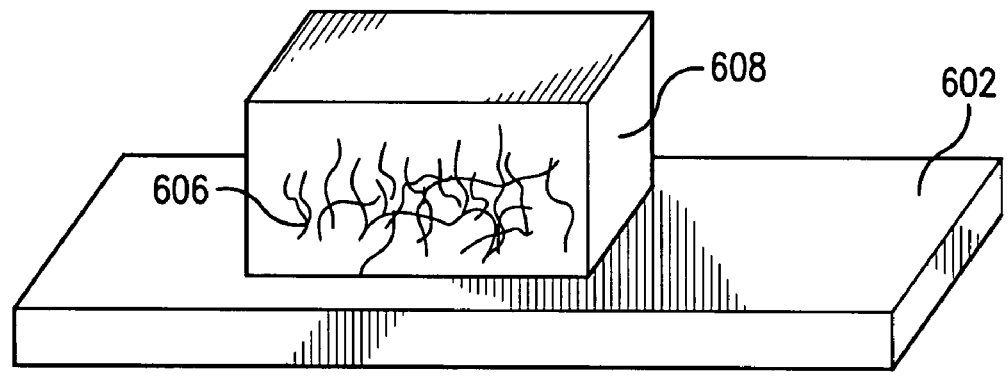
Figure 6C:
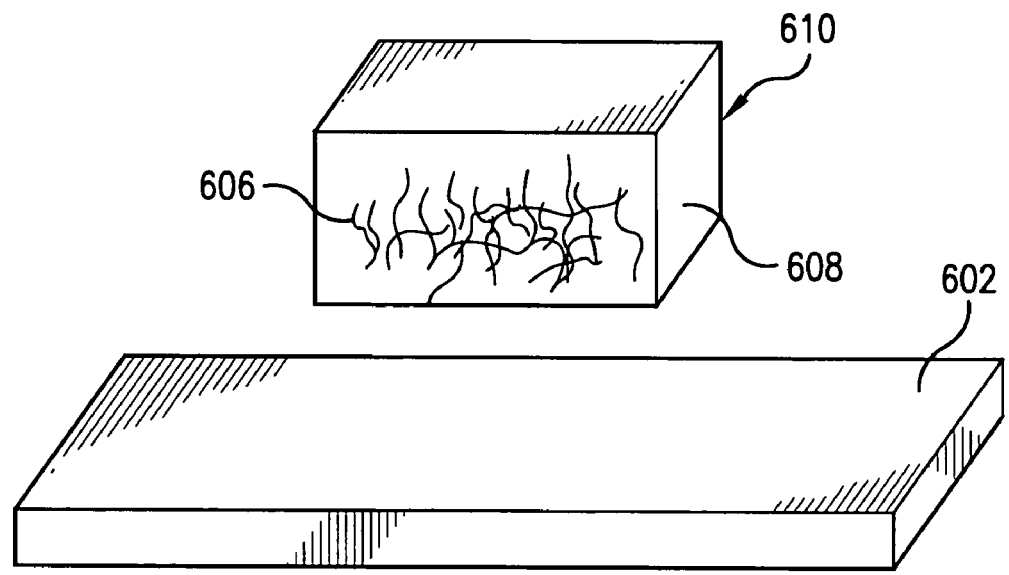

In another aspect, the invention relates to a system and process for producing a nanowire-material composite. For example, FIG. 5 shows a flowchart 500 showing example steps for producing a nanowire-material composite, according to an embodiment of the present invention. FIGS. 6A-6C show example implementations of the steps of FIG. 5. Flowchart 500 begins with step 502. In step 502, a substrate having nanowires attached to a portion of at least one surface is provided. In step 504, a material is deposited over the portion to form the nanowire-material composite. Flowchart 500 optionally further includes step 506. In step 506, the nanowire-material composite is separated from the substrate to form a freestanding nanowire-material composite.

FIG. 6A shows an example implementation of step 502. Referring to FIG. 6A, a substrate 602 is provided having nanowires 606 attached to a portion 604. Portion 604 can be all or less than an entire area of a surface of substrate 602. It is understood -by one of ordinary skill in the art that nanowires can be prepared by a variety of methods. Nanowires for use in the present invention can be prepared by any method known in the art. Particular methods are exemplified in U.S. Pat. Nos. 5,997,832, 6,036,774 and published U.S. Patent Appl. No. 20030089899, all of which are incorporated herein by reference in their entireties for all purposes. The nanowires are prepared on a substrate and attached to the substrate. For example, nanowires 606 can be grown on substrate 602; or can be grown separately and subsequently attached. The substrate can be any material upon which nanowires can be prepared. Examples of suitable substrates for substrate 602 include, but are not limited to: silicon and silicon oxide-coated silicon wafers, glass, ceramic, polymeric wafers and a composite thereof. Alternatively, substrate 602 can be the interior and/or exterior surfaces of a tube, a cube or sphere, or other three dimensional object. Substrate 602 can also be an irregular object or porous medium, such as a reticulated macroporous metal, oxide or ceramic. In one particular example, the method of gold nanoparticle catalyzed chemical vapor deposition (CVD) grows nanowires on a silicon wafer substrate such that the nanowires are randomly aligned or have no alignment.

Alternatively, the gold, or other material, nanoparticles are deposited on the interior and/or exterior surfaces of a three dimensional object, such as an object made from a macroporous metal and/or oxide. The object is immersed in a solution comprising the nanoparticles and the nanoparticles adhere or bind to the surface of the object. For example, the nanoparticles bind to the surface by static charge.

FIG. 6B shows an example implementation of step 504. Referring to FIG. 6B, a material 608 is deposited over portion 604 to form a nanowire-material composite. The material for use as material 608 in the present invention can be any material capable of forming a composite with nanowires 606. The particular choice of material is dependent on the intended application of the nanowires and the nanowire-material composite. Particular examples include but are not limited to polymeric materials, glasses and ceramics. Preferred materials for materials 608 include materials that can be separated from the substrate and form freestanding nanowire-material composites. Preferred materials include flexible materials, including, but not limited to polymers and resins. Furthermore, preferred materials for materials 608 are capable of adhering to and supporting the nanowires while the nanowire-material composite is separated from the substrate such that the nanowires are detached from the substrate and become embedded in the composite intact and undamaged from the separation.

It is understood by one of ordinary skill in the art that suitable polymers for material 608 include, but are not limited to an elastomer, thermoplastic or thermosetting resin. Particularly, polymers for use include oligomers, which includes, but is not limited to monomers, dimers, trimers, tetramers, pentamers, hexamers, heptamers, octamers, nonamers, decamers, undecamers, and dodecamers; branched, hyperbranched, dendritic and other non-linear structural forms of polymers; prepolymers such as phenoxy and epoxy prepolymers; networked polymers such as interpenetrating and semi-interpenetrating network polymers; homopolymers, copolymers, terpolymers and other copolymers including random, statistical, alternating, block and graft copolymers and blends of two or more different polymers. Particular examples of polymers for use in material-nanowire composites include, but are not limited to polyalkanes, polyhaloalkanes, polyalkenes, polyalkynes, polyketones, polycarbonates, polyamides, polyimides, polyarylenes, polyarylvinylenes, polyheteroarylenes, polyheteroarylvinylenes polyesters, polyethers, polyurethanes, polybenzimidazoles, polysulfides, polysiloxanes, polysulfones, polysaccharides, polypeptides, polyphosphazenes, polyphosphates, phenolic and phenol-formaldehyde resins, epoxy and phenoxy resins, and urea- and melamine-formaldehyde resins.

The nanowire-material composite shown in FIG. 6B optionally comprises additives to modify the properties of the material 608. One example of an additive is a plasticizer. Plasticizer is used herein to mean any material that can decrease the flexural modulus of a polymer. The plasticizer may influence the morphology of the polymer and may affect the melting temperature and glass transition temperature. Examples of plasticizers include, but are not limited to: small organic and inorganic molecules, oligomers and small molecular weight polymers (those having molecular weight less than about 50,000), highly-branched polymers and dendrimers. Specific examples include: monomeric carbonamides and sulfonamides, phenolic compounds, cyclic ketones, mixtures of phenols and esters, sulfonated esters or amides, N-alkylolarylsulfonamides, selected aliphatic diols, phosphite esters of alcohols, phthalate esters such as diethyl phthalate, dihexyl phthalate, dioctyl phthalate, didecyl phthalate, di(2-ethylhexy) phthalate and diisononyl phthalate; alcohols such as glycerol, ethylene glycol, diethylene glycol, triethylene glycol, oligomers of ethylene glycol; 2-ethylhexanol, isononyl alcohol and isodecyl alcohol, sorbitol and mannitol; ethers such as oligomers of polyethylene glycol, including PEG-500, PEG 1000 and PEG-2000; and amines such as triethanol amine.

Examples of other additives for use in the invention include but are not limited to fillers, antioxidants, colorants, initiators, crosslinking and curing agents, impact strength modifiers, heat and ultraviolet stabilizers, flame retardants, antistatic agents, electrical and thermal conductivity modifiers, drugs and biologically active compounds and molecules.

Referring to FIG. 6B, material 608 is deposited over portion 604 using any method that allows for the controlled deposition of material 608. It is understood by one of ordinary skill in the art that many different methods of deposition are available and the choice of method depends on the type of material 608 used and the desired final properties of the nanowire-material composite. Methods for depositing material 608 include, but are not limited to drop-casting, spin-coating, dip-coating, langmuir-blodgett techniques and blade coating. It is understood by one of ordinary skill in the art that material 608 can be deposited in a variety of forms. The forms include, for example, but are not limited to a neat liquid or melt and as a solution in a suitable solvent. Suitable solvents include aqueous and non-aqueous solvents.

In a preferred method for deposition, material 608 is deposited unidirectionally such that nanowires 606 are substantially aligned parallel to their long axis as a result of the deposition. For example, material 608 is made to flow over nanowires 606 such that nanowires 606 are substantially aligned parallel to the direction of flow. Alternatively, material 608 is deposited by blade coating by moving substrate 602 and/or the blade in such a way that results in the substantial alignment of nanowires 606 parallel to their long axis and parallel to the direction of movement. Alternatively, substrate 602 having nanowires 606 attached thereon is dipped into a bath of material 608 or a langmuir-blodgett trough. Substrate 602 is removed such that nanowires 606 are substantially aligned parallel to their long axis and parallel to the direction that substrate 602 is removed from the bath. It will be apparent to one of ordinary skill in the art that alternative means of aligning the nanowires during deposition of material 608 are available. Alternative means include, for example, electric and/or magnetic field alignment.

After depositing material 608 over portion 604, material 608 is optionally further processed. A variety of processing steps can be performed, depending on the desired final properties of the nanowire-material composite. Processing steps include, but are not limited to hardening, curing, cross-linking, polymerizing, photo polymerizing, melting, crystallizing, oxidizing and reducing.

In one particular example, referring back to FIG. 6B, material 608 is deposited over portion 604 as a polymer solution. Examples of polymer solutions for use in the present invention include, but are not limited to polystyrene, poly(methylmethacrylate), nylon-6 or poly(ethylene terephthalate) dissolved in toluene; polyethylene or polypropylene dissolved in dichloromethane; and poly(lactic acid) dissolved in water. Removing the solvent from material 608 hardens material 608 and forms the nanowire-material composite. The solvent can be removed by any method known to one of ordinary skill in the art, for example, by evaporating the solvent.

In another example, material 608 is deposited over portion 604, as a mixture of at least one or more prepolymers. Processing the mixture by polymerizing the prepolymers forms the material-nanowire composite. In a particular example, low-molecular weight polyurethane oligomers are deposited as a neat film and heat-cured to form a high-molecular weight elastomeric polyurethane composite having nanowires embedded therein. In a further example, a mixture of two or more epoxy prepolymers is deposited over the nanowires as a neat film, or two or more epoxy prepolymers are deposited separately and admixed on the substrate to form an epoxy polymer. Curing the film forms an epoxy resin composite having nanowires embedded therein. In another example, a monomer film, neat or with additives, such as initiator, e.g. a photoinitiator or heat-activated initiator, is deposited over the nanowires. Polymerizing the monomer film using heat, light, x-rays, microwaves or other electromagnetic energy forms the material-nanowire composite. Depositing a mixture of different monomers, neat or with additives, such as initiator, and polymerizing the mixture, forms the material-nanowire composite having an interpenetrating and/or semi-interpenetrating network polymer as the base material.

In another example, material 608 is deposited on the interior surface(s) of an irregular object. Any method of deposition can be used. For example, a substrate can comprise reticulated macroporous metals such as aluminum, that have nanowires attached on the interior of the pores of the metal. The macroporous substrate is then impregnated or injected with material 608. Upon impregnation or injection, material 608 covers the portions of the substrate to which the nanowires are attached. The material covering the nanowires can optionally be further processed, as described herein.

In an embodiment, after forming the nanowire-material composite, it is optionally further processed while attached to substrate 602. Alternatively, the nanowire-material composite is separated from substrate 602 before optional further processing. Optional further processing steps include, but are not limited to, planarization, patterning, separating the patterned nanowire-material composite from substrate 602, doping, metallization and further device fabrication steps.

FIG. 6C shows an example implementation of step 506. Referring to FIG. 6C, after forming the nanowire-material composite the composite is separated from substrate 602 to form freestanding nanowire-material composite 610. It is understood that a variety of methods are available to separate nanowire-material composite from substrate 602. Preferably, the method of separation results in a freestanding nanowire-material composite 610, wherein the nanowires are detached from substrate 602 and are embedded in material 608 intact, without being damaged during separation. Methods of separating nanowire-material composite 610 from substrate 602 for use in the present invention include, but are not limited to the three following examples.

First, using a blade, nanowire-material composite 610 is physically lifted from substrate 602. The term blade is used herein to refer to any sharp-edged object capable of lifting composite 610 off of substrate 602 and detaching nanowires 606 from substrate 602 without damaging nanowires 606. The blade is used to separate the entire composite 610 from the substrate, or alternatively, the blade is used to separate a first portion of composite 610 from substrate 602. A second portion of composite 610 is mechanically separated from substrate 602 or lifted from the substrate by hand or hand-held apparatus.

Second, substrate 602 is etched away from nanowire-material composite 610. The method of etching substrate 602 depends on the material of substrate 602. For example, plasma etching is used to etch away a silicon wafer substrate from a nanowire-material composite 610. Alternatively, the silicon wafer substrate is chemically etched away from composite 610 using a suitable etching agent, such as hydrofluoric acid and an oxidizing agent such as $HNO_3$ or $H_2SO_4$. Other chemical etching agents include, but are not limited to, KOH and $XeF_2$. Metal substrates can be electrochemically etched away from nanowire-material composite 610. Polymeric substrates can be separated from nanowire-material composite 610 by dissolving the substrate in a suitable fluid that does not dissolve nanowire-material composite 610.

Third, a parting layer is used to separate the nanowire-material composite 610 from substrate 602. The term parting layer is used herein to refer to any agent capable of facilitating the separation of nanowire-material composite 610 from substrate 602. An example of a parting layer for use in the present invention includes, but is not limited to, a chemically removable parting layer between substrate 602 and nanowire-material composite 610. For example, substrate 602 is first coated and/or covered on at least one surface with a chemically removable parting layer. Nanowires 606 are grown on the chemically removable parting layer. Material 608 is deposited over nanowires 606 to form nanowire-material composite 610. The nanowire-material composite 610 is separated from substrate 602 by dissolving the chemically removable layer in a suitable solvent. The suitable solvent is capable of dissolving the chemically removable layer but does not dissolve nanowire-material composite 610 or the substrate. The parting layer can also be a photoremovable layer, in which ultraviolet or other suitable wavelengths of light, or other suitable electromagnetic energy, are used to remove the parting layer and separate nanowire-material composite 610 from substrate 602. An example of a photoremovable layer is a substance that breaks down and disintegrates in the presence of ultraviolet light, making it easily removed by washing with a suitable fluid.

In an embodiment of the invention, the freestanding nanowire-material composite 610 is collected in sheets and can be stored for later use. Flexible nanowire-material composites 610 are optionally rolled and stored for later use or for further optional processing.

In an embodiment, the freestanding nanowire-material composite 610 is further optionally processed. Alternatively, material 608 is separated from nanowires 606 and nanowires 606 are harvested for further processing. Any method capable of separating material 608 from nanowires 606 can be used in the present invention. Specific examples include, but are not limited to dissolving material 608 in a suitable solvent, heating the nanowire-material composite 610 to a temperature sufficient to incinerate material 608, and etching away the material. Suitable solvents include those fluids that dissolve material 608 while leaving nanowires 606 intact and undamaged. The solvent contacts nanowire-material composite 610, dissolves material 608 and nanowires 606 are collected by some means, for example filtration. Heating nanowire-material composite 610 can be done in any suitable furnace. Nanowires 606 are washed free of any ash from material 608 and collected. Etching away material 608 can be done with a plasma etch or other ion-etch that is capable of separating nanowires 606 from material 608. The collected nanowires 606 can be optionally further processed into thin films for electronic device fabrication.

Embodiments for Depositing Oriented Nanowires

Figure 7:
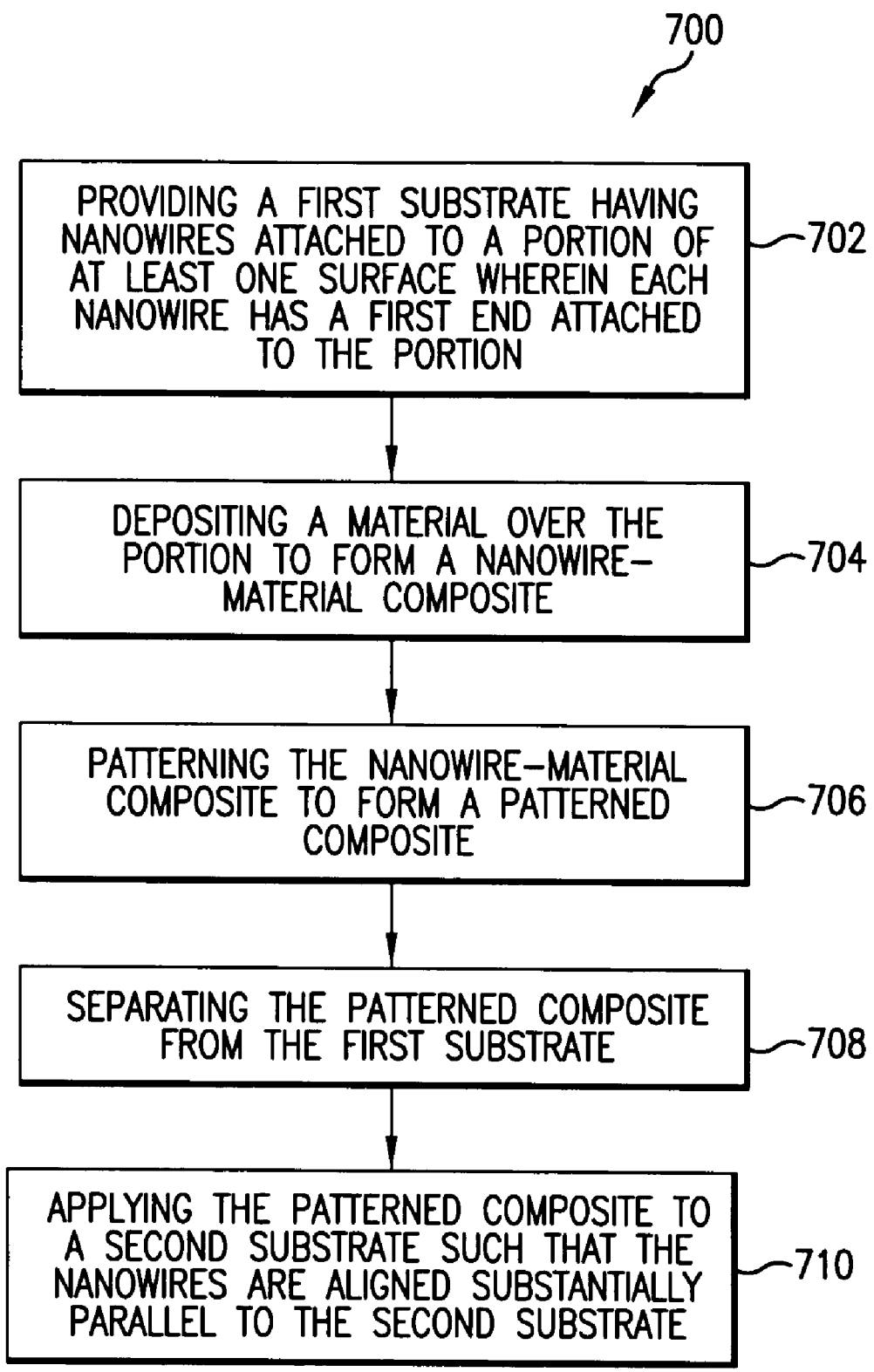
FIG. 7 is a flow diagram for a process for aligning nanowires on a substrate, according to an embodiment of the present invention.

In an embodiment, the invention relates to a system and process for depositing oriented nanowires. For example, FIG. 7 shows a flowchart 700 showing example steps for depositing oriented nanowires according to an embodiment of the present invention. FIGS. 8A-8F show example implementations of the steps of FIG. 7. Flowchart 700 begins with step 702. In step 702, a first substrate having nanowires attached to a portion of at least one surface is provided, wherein each nanowire has a first end attached to said portion. Preferably, the nanowires are oriented substantially perpendicular to the surface of the substrate. In step 704, a material is deposited over the portion to form a nanowire-material composite. In step 706, the nanowire-material composite is patterned to form a patterned composite. In step 708, the patterned composite is separated from the first substrate. In step 710, the patterned composite is applied to a second substrate such that the nanowires are aligned substantially parallel to the second substrate.

Figure 8A:
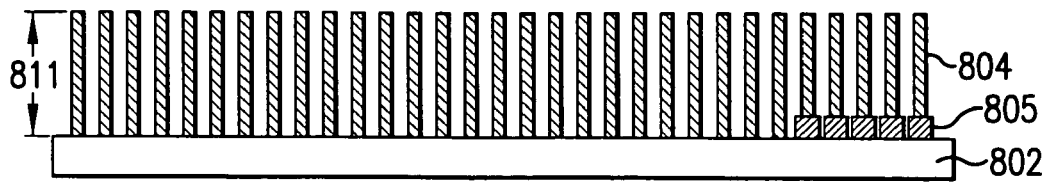
FIGS. 8A-8F illustrate nanowires being aligned on a substrate according to the process of FIG. 7.

FIG. 8A shows an example implementation of step 702. Referring to FIG. 8A, before step 702, nanowires 804 are grown on a first substrate 802. Preferably, nanowires 804 are grown perpendicular to the surface of substrate 802. Any method known in the art can be used to grow nanowires perpendicular to a surface, including, for example, the methods described in Published U.S. Patent Appl. No. 20020172820, which is incorporated herein, in its entirety, for all purposes. Preferably, nanowires 804 are grown to a length 811, which can be in the range of about 10 to about 20 microns although the invention is not limited to this range. Preferably, nanowires 804 are grown such that a portion 805 of each nanowire at an end that is attached to substrate 802 is doped. Methods for doping nanowires are well known in the art. Any method of doping can be used during growth that results in portion 805, which is attached to the substrate, being doped.

Flowchart 700 can optionally include providing a parting layer on the first substrate, wherein the nanowires are attached to a portion of said parting layer. Nanowires 804 are optionally doped at the end that is attached to the parting layer. The parting layer facilitates the separation of nanowires 804 from substrate 802.

Figure 8B:
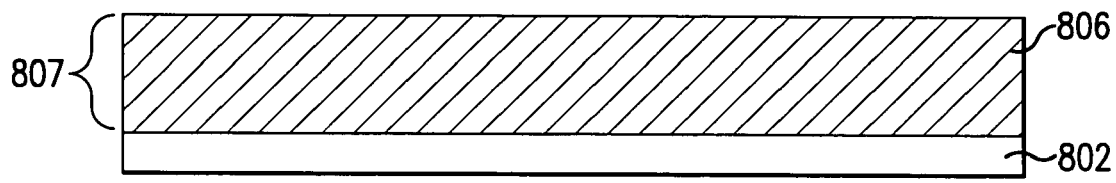

FIG. 8B shows an example implementation of step 704. Referring to FIG. 8B, material is deposited over the portion to form a nanowire-material composite 806. The material is deposited over the nanowires, to a height 807 such that the nanowires are covered by the material and embedded in nanowire-material composite 806. As discussed above, any method known in the art for depositing the material over the nanowires can be used in the present invention. After the material is deposited over the nanowires, the material is optionally processed to form nanowire-material composite 806. Optional processing steps are discussed above. Preferably, the material is polymerized or cross-linked in a curing and/or hardening step. Preferably, the material is photopolymerized and/or heat-cured to form nanowire-material composite 806.

Figure 8C:
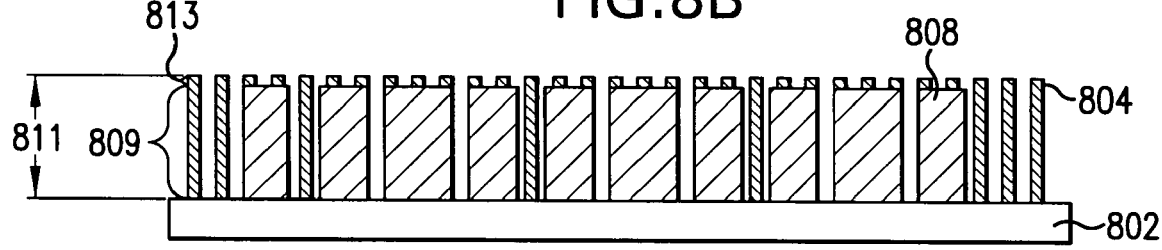

FIG. 8C shows an example implementation of step 706. Referring to FIG. 8C, the nanowire-material composite is patterned to form patterned composite 808. Optionally, the nanowire-material composite is patterned into a plurality of patterned composites 808. The nanowire-material composite can be patterned into any shape. Preferably, the nanowire-material composite is patterned into a plurality of substantially rectangular blocks 808. Blocks 808 can be patterned to have any dimensions, depending on the particular application. A height 809 of block 808 is about equal to or greater than the length of the nanowires, which would result in the nanowires being completely embedded in each composite block. Alternatively, the nanowires are not completely embedded in block 808, such that the height 809 of the block 808 is less than the length, 811, of the nanowires, leaving a portion 813 not embedded in block 808. The height 809 of the blocks 808 can range from about 2 microns to about 50 microns, although the invention is not limited to this range. Preferably, the blocks have a height of less than about 10 microns. The plurality of blocks can be uniform in dimensions, or alternatively, the blocks are patterned such that each block, or each group of blocks, has different dimensions. Methods for patterning materials are well known in the art. Any method that results in a well-defined pattern of nanowire-material composite can be used in the present invention. A method of patterning for use in the present invention includes, but is not limited to, lithographic patterning, including, but not limited to, photolithography and soft lithography. Alternatively, the method of patterning can be reactive ion etching. Such etching, in accordance with the invention include, but are not limited to, ions of $SF_6$, $CF_4$, $CHF_3$, $CCl_4$, $CCl_2F_2$, $Cl_2$, $O_2$, $H_2$ and Ar.

Figure 8D:
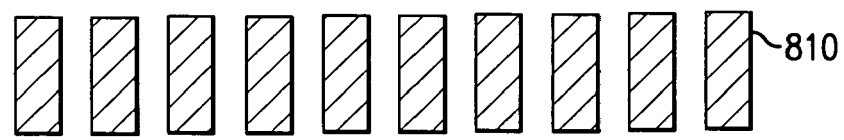

FIG. 8D shows an example implementation of step 708. Referring to FIG. 8D, the patterned blocks 808 are separated from substrate 802. As described above, any method of separation can be used. Referring to FIG. 8D, the blocks, once separated, form freestanding nanowire-material blocks 810, and can be stored for later use and further optional processing. Preferably, the blocks are further processed on a second substrate.

Figure 8E:
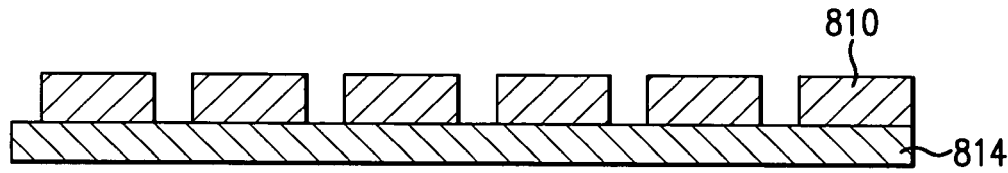

FIG. 8E shows an example implementation of step 710. Referring to FIG. 8E, freestanding nanowire-material blocks 810 are laminated to a second substrate 814 such that the nanowires are substantially parallel to the surface of the second substrate. For example, a plurality of nanowire-material blocks 810 can be laminated on substrate 814 in a predetermined pattern. Alternatively, blocks 810 are arranged on substrate 814 in no pattern or in a random pattern. Any method known to one of ordinary skill in the art can be used to laminate blocks 810 to the second substrate 814. The choice of method depends on factors such as the material in block 810 and the type of substrate 814. For example, blocks 810 can be designed to adhere to substrate 814 through covalent and/or non-covalent bonds. For example, composite blocks 814 can be made from a pressure-sensitive adhesive polymer that adheres to substrate 814 when blocks 810 are arranged on its surface and pressure is applied. Alternatively, a separate adhesive can be used to laminate blocks 810 to substrate 814. Adhesives are well known in the art and the choice of adhesive depends on the particular application and the material of block 810 and substrate 814. Alternatively, blocks 810 can be laminated to substrate 814 via covalent chemical bonds. Any method of producing the covalent chemical bond can be used. For example, the covalent chemical bond can be a siloxane bond. One of ordinary skill in the art will know how to produce a siloxane bond between block 810 and substrate 814. For example, a reaction between hydroxyl groups and halosilanes can be used.

Figure 8F:
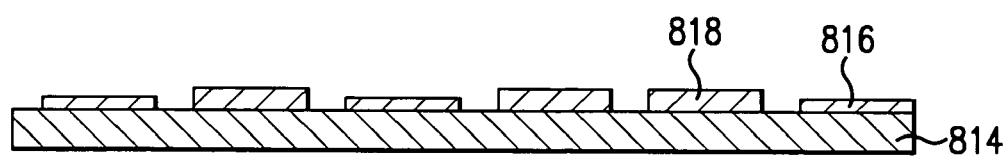

FIG. 8F shows an example implementation of an optional further processing step. The nanowire-material blocks are optionally planarized to form planarized blocks 814 and 816. In an embodiment, all nanowire-material blocks laminated to the second substrate are planarized to the same height. Alternatively, a first plurality of nanowire-material blocks 814 are planarized to a first height and a second plurality of nanowire-material blocks 816 are planarized to a second height. Alternatively, the nanowire-material blocks are planarized individually to different heights. In further embodiments, one or more nanowire-material blocks laminated to the second substrate are not planarized. Any method known to one of ordinary skill in the art can be used to planarize the nanowire-material blocks. Preferably, oxygen plasma is used to planarize the nanowire-material blocks.

Planarization removes material from the nanowire-material composite. Preferably, the planarization exposes at least one surface of at least one nanowire. Alternatively, the planarization removes all the material from the nanowire-material composite and exposes the nanowires that were embedded in the composite. When it is desired to remove all the material during planarization, nanowire-material blocks can be optionally detached from the substrate after a first surface of at least one nanowire is exposed. The detached block can then be turned over and re-attached to the substrate and further planarized to expose all other surfaces of the nanowires. This allows for the complete removal of all the material from the nanowire-material composite block and results in a neat thin film of nanowires that are substantially aligned parallel to their long axis and parallel to the surface of the substrate. Alternatively, planarization can remove material and yet not expose any surface of the nanowires.

In an embodiment, the planarization results in a plurality of blocks of exposed nanowires that are patterned on a surface of a substrate. The exposed nanowires are optionally further processed to produce electronic devices. Optional further processing steps include, but are not limited to coating with a dielectric layer, doping, patterning, planarization, metallization and further device fabrication steps.

To fabricate a device, for example, the nanowire-material blocks can be planarized on the second substrate to remove the material from the block. A thin film of nanowires is thereby formed on the second substrate having nanowires aligned substantially parallel to the second substrate, with a sufficient density to achieve an operational current level. A plurality of semiconductor device regions can be defined in the thin film of nanowires. Contacts are formed at the semiconductor device regions to thereby provide electrical connectivity to the plurality of semiconductor devices.

Further optional processing steps also include laminating one or more additional nanowire-material composite blocks on the first planarized blocks 814 and 816, to produce layered blocks. Optional processing steps can be performed on each layer individually or in groups.

Electronic Substrate Embodiments

Figure 9:
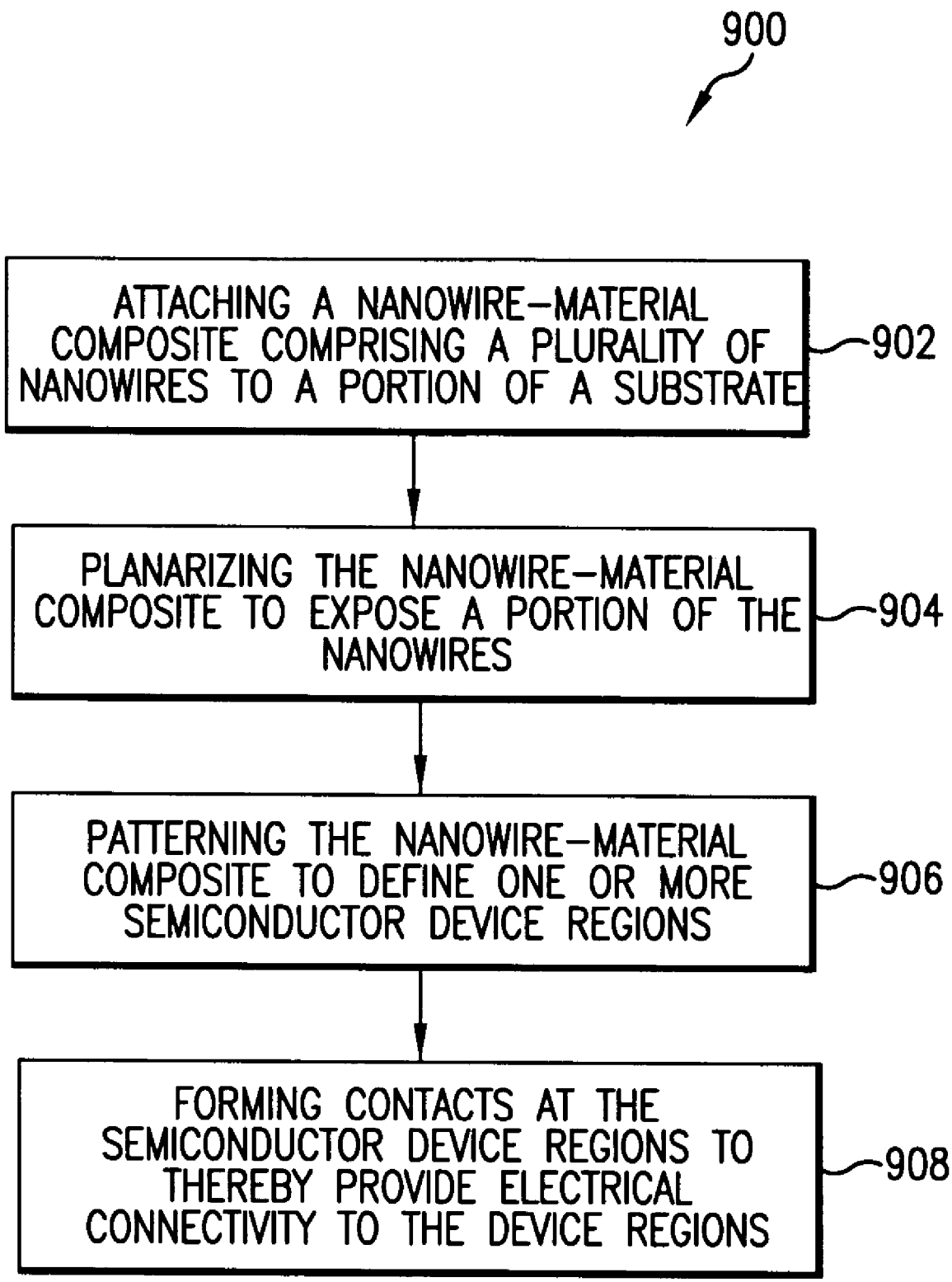
FIG. 9 is a flow diagram for a process of producing an electronic substrate using nanowires, according to an embodiment of the present invention.
Figure 10:
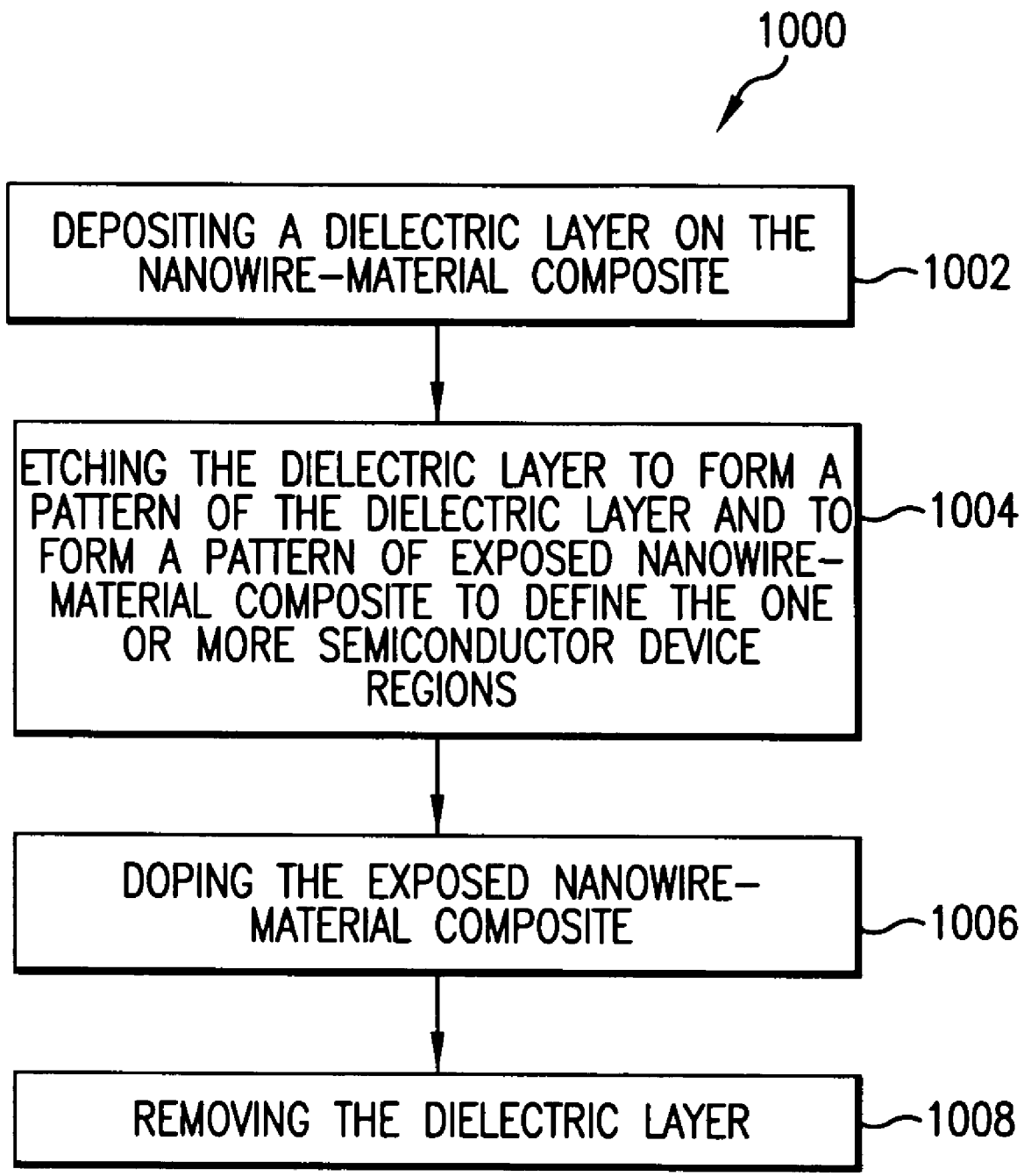
FIG. 10 is a flow diagram of optional processing steps in the process of producing an electronic substrate using nanowires, according to an embodiment of the present invention.

In an embodiment, the present invention relates to a system and process for producing an electronic substrate. For example, FIG. 9 shows a flowchart 900 showing example steps for producing an electronic substrate, according to an embodiment of the present invention. FIG. 10 shows a flowchart 1000 showing optional steps that can be performed after step 906, and before step 908. FIG. 11A through FIG. 18B show example implementations of the steps for FIG. 9 and FIG. 10.

Flowchart 900 begins with step 902. In step 902, a nanowire-material composite comprising a plurality of nanowires is attached to a portion of a substrate. In step 904, the nanowire-material composite is optionally planarized to expose a portion of the nanowires. In step 906, the nanowire-material composite is patterned to define one or more semiconductor device regions. In step 908, contacts are formed at the semiconductor device regions to thereby provide electrical connectivity to said device regions.

Flowchart 1000 begins with step 1002. In step 1002, a dielectric layer is optionally deposited on the nanowire-material composite. In step 1004, the dielectric layer is optionally etched to form a pattern of the dielectric layer and to form a pattern of exposed nanowire-material composite to define the one or more semiconductor device regions. In step 1006, the exposed nanowire-material composite is optionally doped. In step 1008, the dielectric layer is optionally removed before step 908 of forming contacts.

Figure 11A:
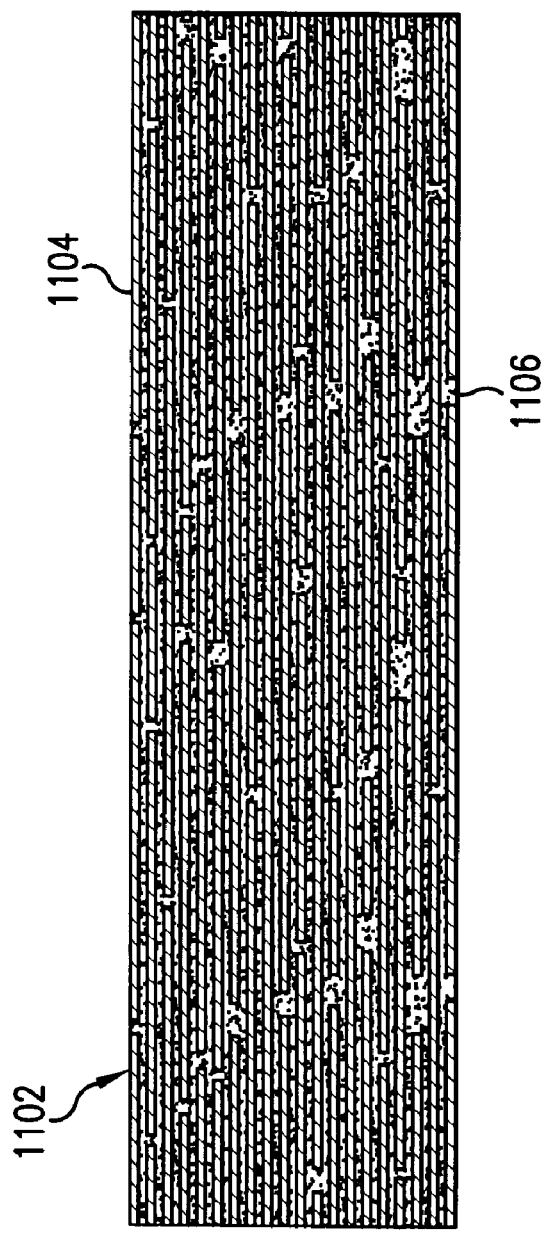
FIGS. 11A-11B show plan and side views, respectively, of a nanowire-material composite attached to a substrate.
Figure 11B:
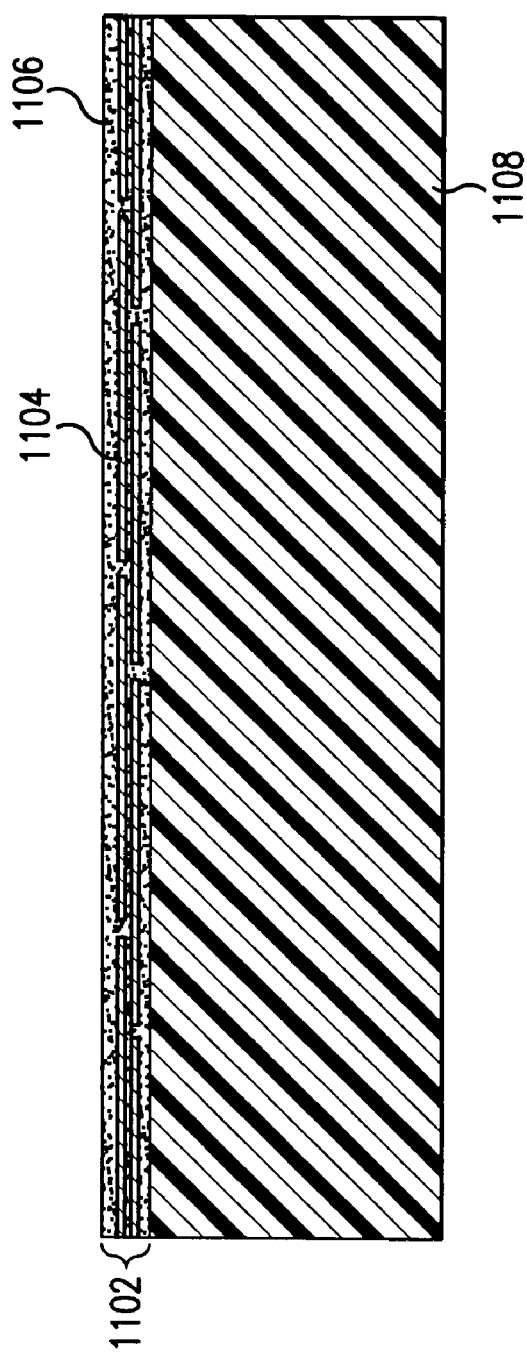

FIGS. 11A and 11B show an example implementation of step 902. FIG. 11A shows a plan view of a nanowire-material composite 1102 laminated on surface of a substrate. Composite 1102 has nanowires 1104 embedded in a material 1106 in sufficient density to achieve an operational current level. FIG. 11B shows a side view of composite 1102 laminated to the top surface of substrate 1108. Multiple layers of nanowires 1104 are embedded in material 1106. Alternatively, a single layer of nanowires is embedded in the material. Preferably, nanowires 1104 are aligned substantially parallel to their long axis and parallel to the surface of the substrate to which composite 1102 is laminated. After laminating composite 1102 to substrate 1108, the composite can be optionally planarized to expose a surface of a layer of nanowires.

Figure 12A:
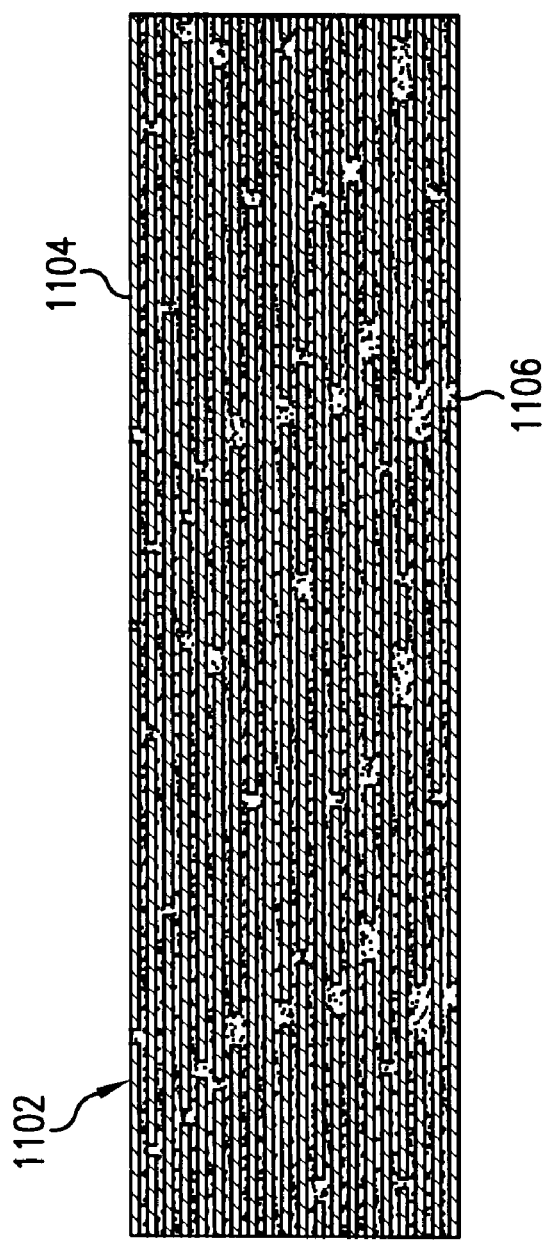
FIGS. 12A-12B show plan and side views, respectively, of a planarized nanowire-material composite attached to a substrate.
Figure 12B:
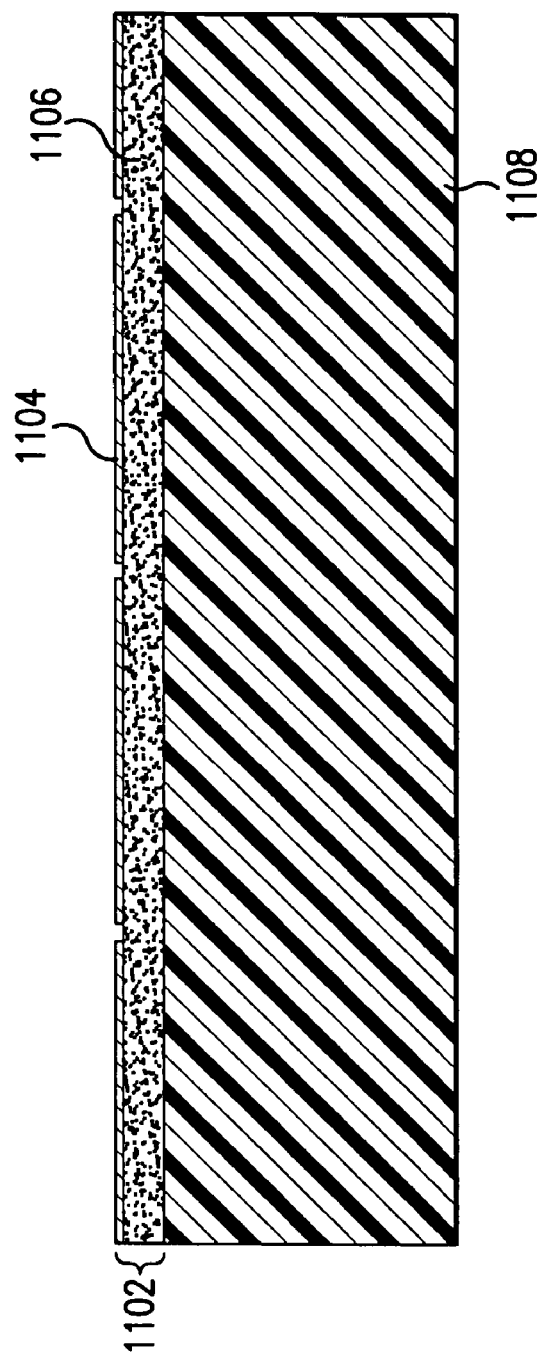

FIGS. 12A and 12B show an example implementation of step 904. FIG. 12A shows a plan view of nanowire-material composite 1102 having nanowires 1104 embedded in material 1106. FIG. 12B is a side view showing nanowire-material composite 1102 laminated to substrate 1108 and having nanowires 1104 embedded in material 1106, and having a surface exposed due to planarization. After optionally planarizing composite 1102, the composite can be patterned into a predetermined pattern.

Figure 13A:
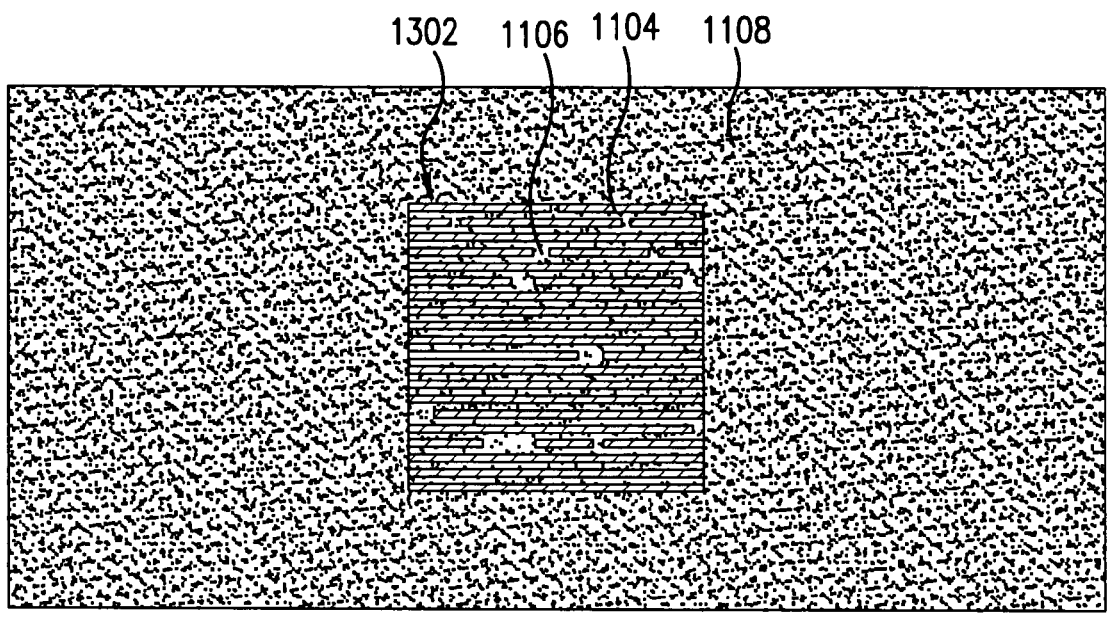
FIGS. 13A-13B show plan and side views, respectively, of a patterned nanowire-material composite attached to a substrate.
Figure 13B:
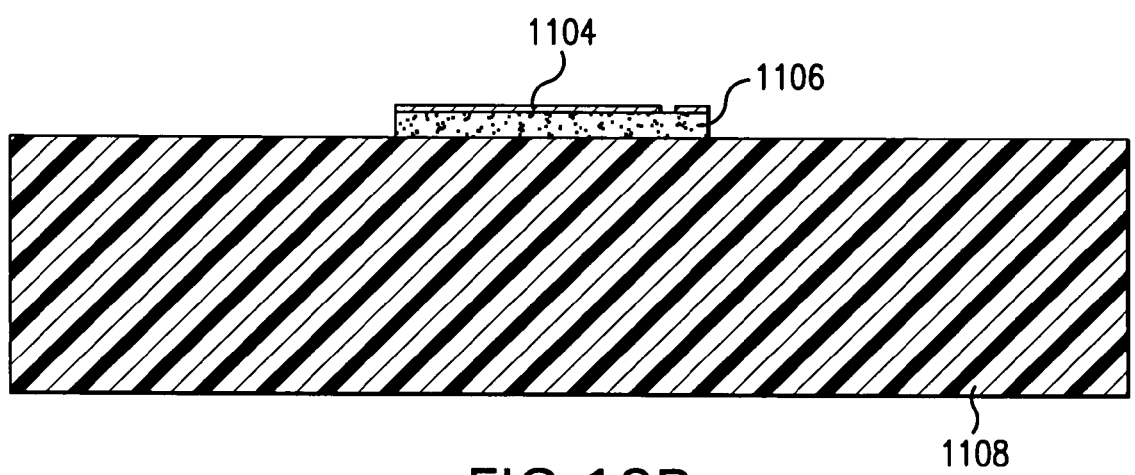

FIGS. 13A and 13B show an example implementation of step 906. FIG. 13A is a plan view showing patterned nanowire-material composite 1302 having a square shape and having nanowires 1104 embedded in material 1106. The nanowire-material composite can be planarized into any shape, or into any pattern of a plurality of like or different shapes. Alternative shapes include, but are not limited to, circles, rectangles, triangles, rings, ovals, stars, any other shape or any random pattern. FIG. 13B shows a side view of patterned nanowire-material composite 1302 laminated on substrate 1108 and having nanowires 1104 embedded in material 1106 and having an exposed surface. After forming patterned nanowire-material composite 1302, a dielectric layer can be deposited on composite 1302 and the exposed surface of substrate 1108.

Figure 14A:
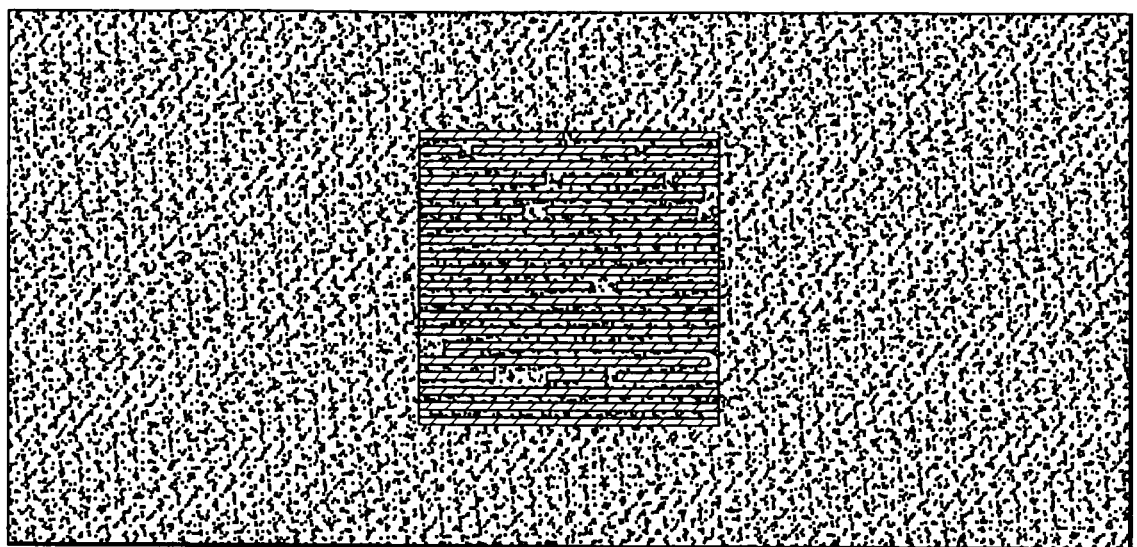
FIGS. 14A-14B show plan and side views, respectively, of a dielectric layer deposited over the patterned nanowire-material composite.
Figure 14B:
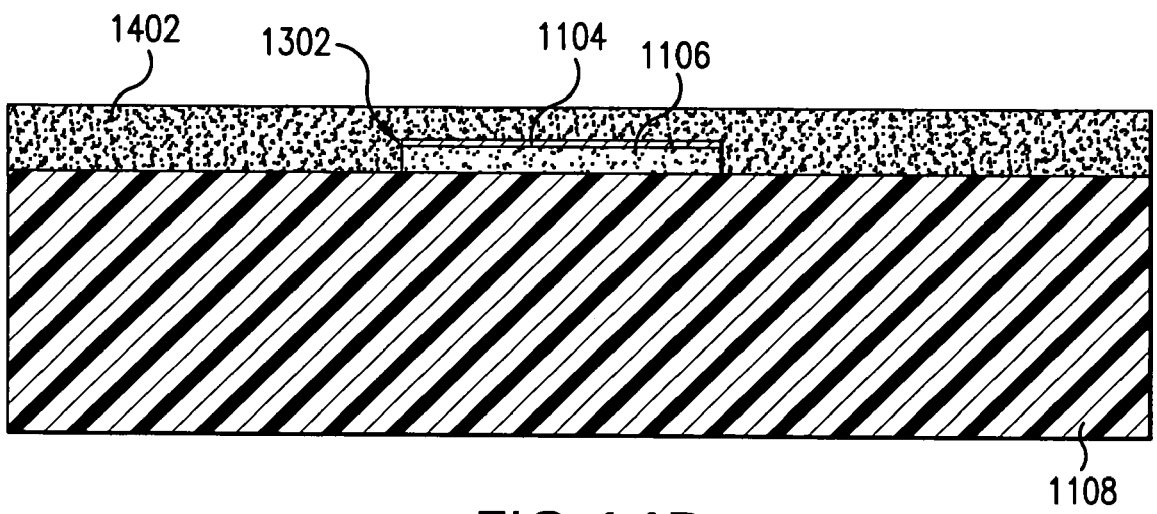

FIGS. 14A and FIG. 14B show an example implementation of step 1002. FIG. 14A shows a plan view of dielectric layer 1402 deposited on substrate 1108 and patterned nanowire-material composite 1302. FIG. 14B shows a side view of dielectric layer 1402 covering patterned nanowire-material composite 1302, embedded and exposed nanowires 1104, material 1106 and substrate 1108. Dielectric layer 1402 can be deposited using any process known in the art, including for example, drop casting, spin-coating or blade coating of polymeric, oxide or any other dielectrics. Polymer dielectrics for use in the present invention include any polymers, including for example, polyimides, fluorinated polyimides, polybenzimidazoles, and others. Oxide dielectrics for use in the invention include $SiO_2$, $Ta_2O_5$, $ZrO_2$, $Hf_2O$, and $Al_2O_3$. Nitride dielectrics include AlN and SiN. A preferred dielectric material is SiN.

Figure 15A:
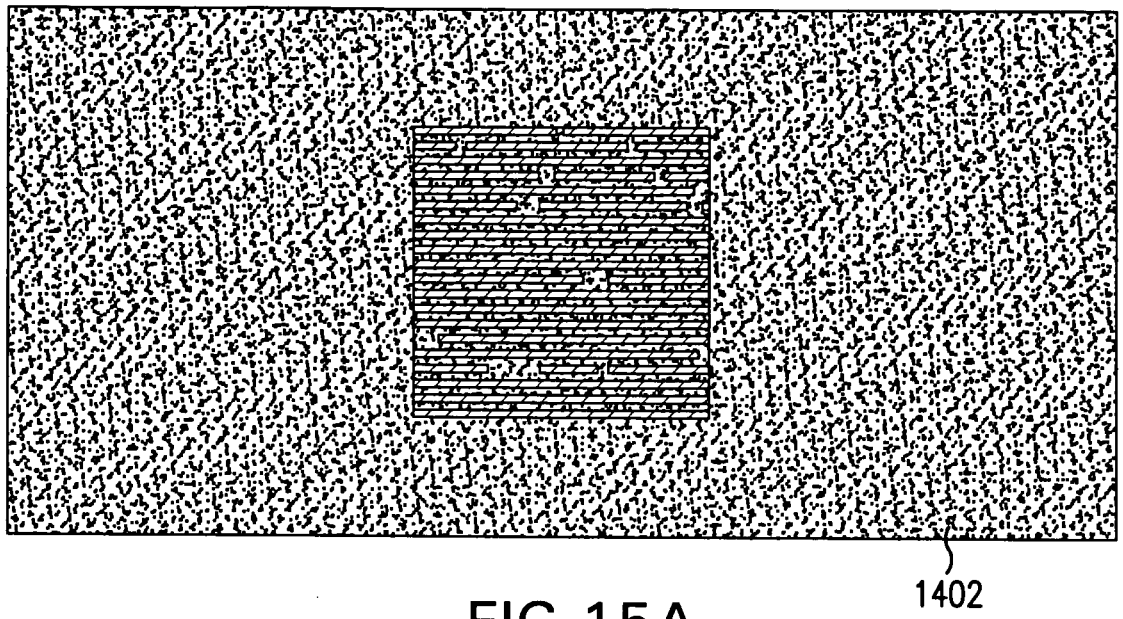
FIGS. 15A-15B show plan and side views, respectively, of a patterned dielectric layer covering a patterned nanowire-material composite and having exposed nanowires.
Figure 15B:
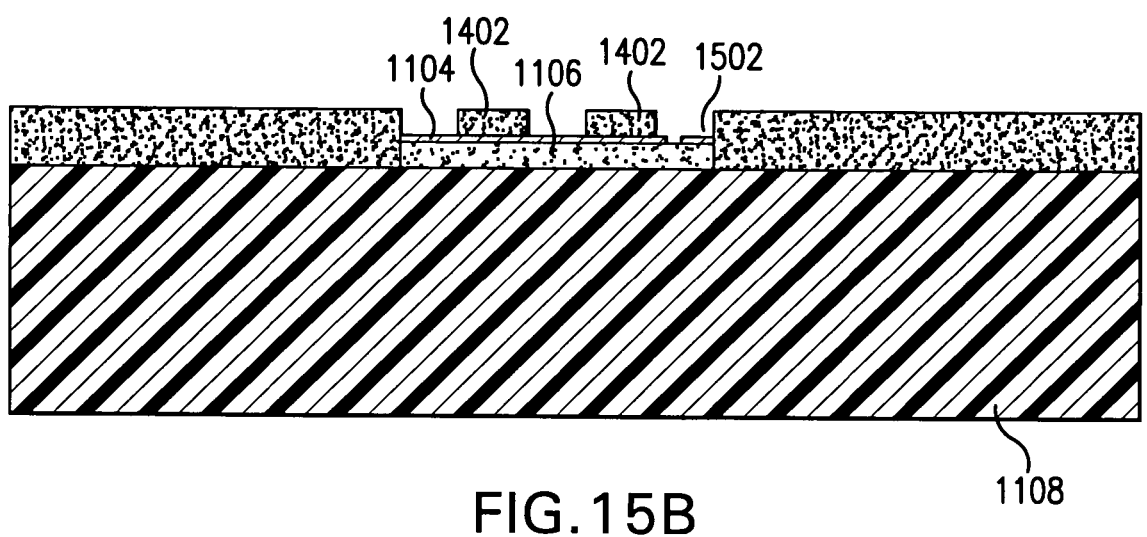

FIGS. 15A and 15B show an example implementation of step 1004. Referring to FIG. 15A, dielectric layer 1402 is etched to form a pattern of the dielectric layer and to form a pattern of exposed nanowire-material composite to define the one or more semiconductor device regions. FIG. 15B shows a side view with semiconductor device regions 1502 etched into dielectric layer 1402 to expose a portion of patterned nanowire-material composite 1302. Etching can be done by any method described above, preferably a fluorine based etch plasma or reactive ion etch is used.

Figure 16A:
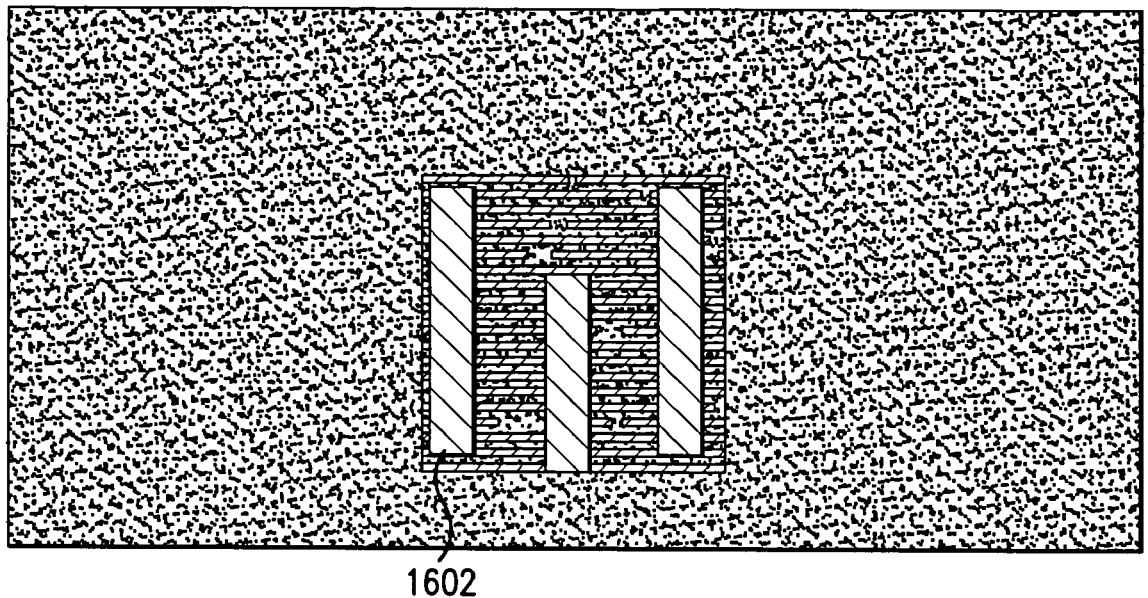
FIGS. 16A-16B show plan and side views, respectively, of a dielectric layer covering a patterned nanowire-material composite and having exposed nanowires, after a doping step.
Figure 16B:
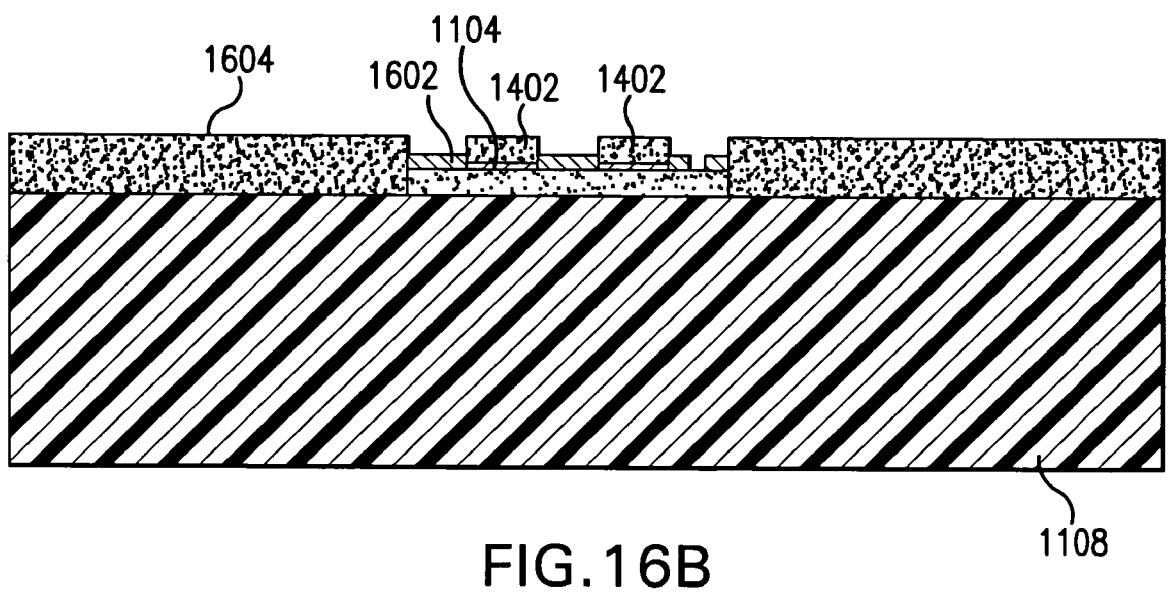

FIGS. 16A and 16B show an example implementation of step 1006. As shown in FIGS. 16A and 16B, the exposed nanowire-material composite is doped to form doped composite 1602 and doped dielectric layer 1604. Doping can be done by any method known in the art. Preferred methods include, but are not limited to, spin-on-doping, low-energy ion implantation or ion showering.

Figure 17A:
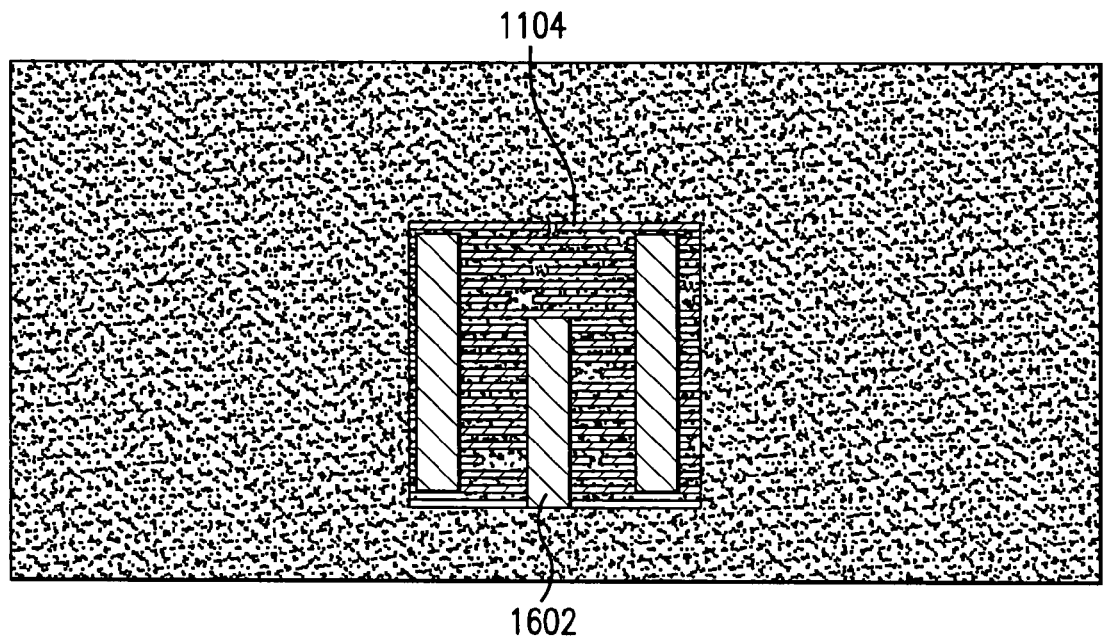
FIGS. 17A-17B show plan and side views, respectively, of a patterned nanowire-material composite having areas of doping.
Figure 17B:
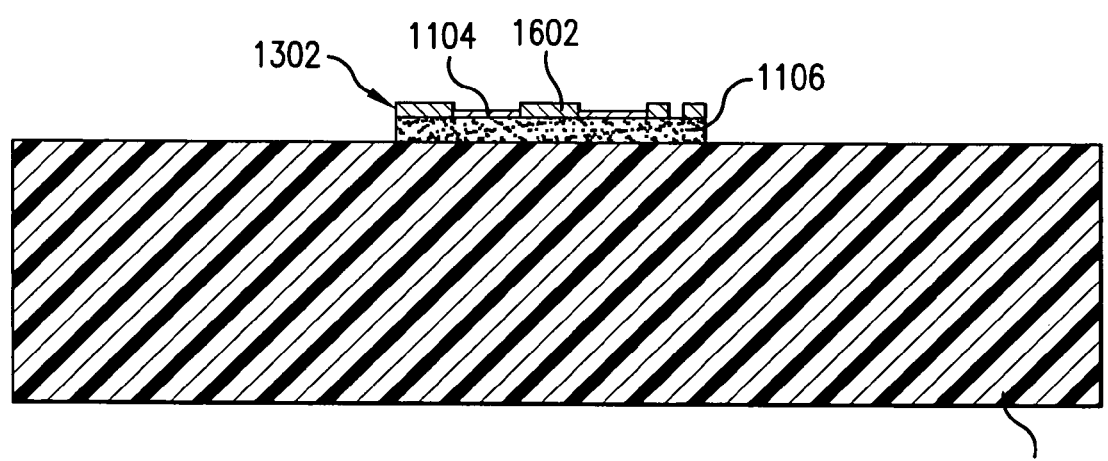

FIGS. 17A and 17B show an example implementation of step 1008. As shown in FIG. 17A, dielectric layer 1402 is removed to expose patterned nanowire-material composite 1302 and exposed nanowires 1104. Regions of doped nanowire-material composite 1602 are also shown. FIG. 17B shows a side view of substrate 1108 having patterned nanowire-material composite 1302 laminated to the top surface.

Figure 18A:
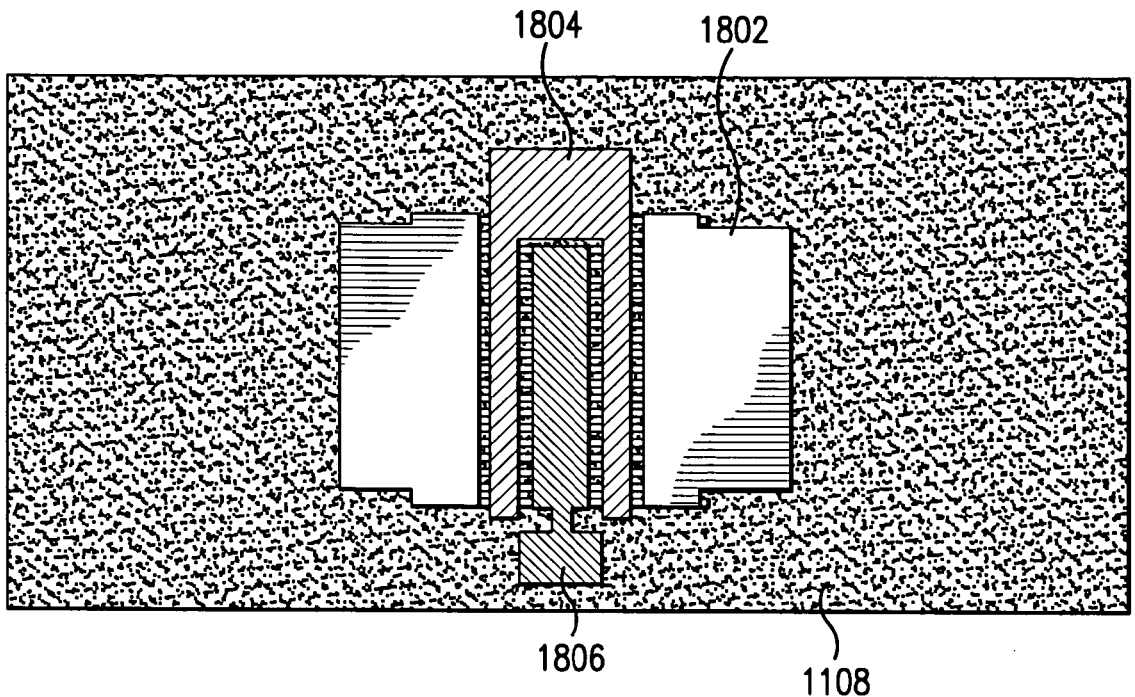
FIGS. 18A-18B show plan and side views, respectively, of an electronic substrate having source, gate and drain electrodes metallized on a nanowire-material composite.
Figure 18B:
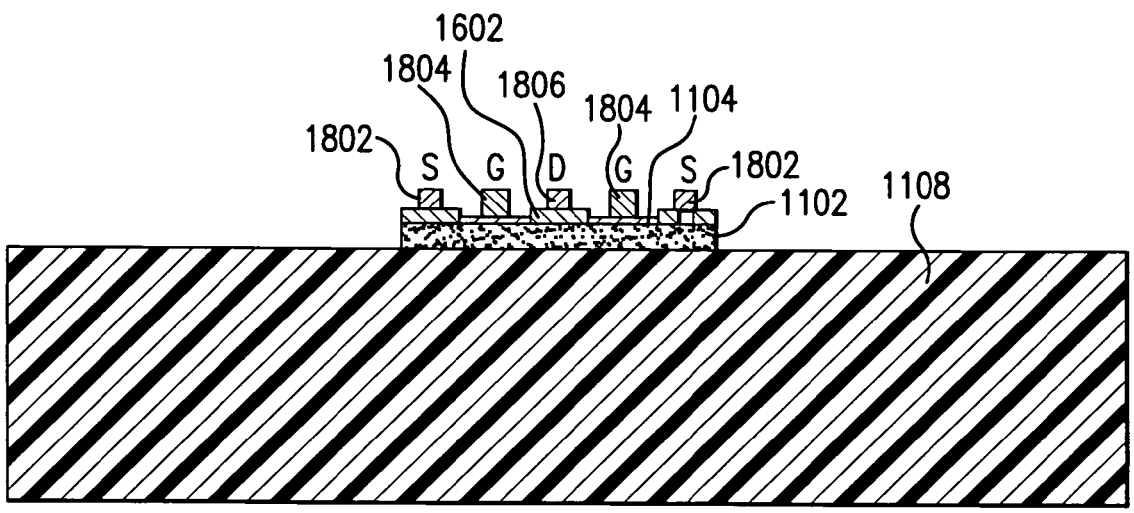

FIGS. 18A and 18B show an example implementation of step 908. The semiconductor device regions are metallized to form electrical connectivity to the device regions. FIG. 18A shows a plan view of metallized semiconductor device regions 1802, 1804 and 1806, which form source, gate and drain transistor electrodes respectively. FIG. 18B shows a side view of regions 1802, 1804 and 1806. Metallization can be carried out using any method known in the art. Preferably, the semiconductor device regions are metallized by e-beam evaporation. Preferably, the source and drain electrodes are formed whereby the nanowires form channels having a length between respective ones of the source and drain electrodes, and the nanowires are aligned approximately parallel to an axis between the source and drain contacts. Preferably, the gate electrode is formed on the surface of the nanowire-material composite such that the distance between the gate and the nanowires is 5 nanometers or less, 10 nanometers or less, 50 nanometers or less, or 100 nanometers or less.

An alternative process for producing an electronic substrate is shown in FIGS. 19A-19E, which show plan views of a substrate. As shown in FIG. 19A, a nanowire-material composite 1902 is provided having nanowires 1904 embedded in material 1905. Preferably, the nanowires are aligned substantially parallel along their long axis. A composite 1902 is optionally laminated on a surface of a substrate.

As shown in FIG. 19B, a portion of material 1905 is removed from the nanowire-material composite to form areas 1906, in which material 1905 has been removed. Material 1905 is removed such that nanowires 1904 remain in areas 1906. Composite 1902 is thereby patterned into strips of nanowire-material composite 1907 having areas 1906, which comprise exposed nanowires.

As shown in FIG. 19C, the composite strips 1907 can be further processed, for example, by hardening, curing or cross-linking material 1905 to form processed strips 1908. The strips 1907 can be planarized to form planarized strips. A dielectric layer can be formed on a portion of the exposed nanowires and/or on planarized strips 1907. The portions of exposed nanowires can be doped in either areas 1906 or on planarized strips 1907.

As shown in FIG. 19D, the areas of exposed nanowires can be metallized to form areas of electrical connectivity and form addressable electrodes. It is understood by one of ordinary skill in the art that a variety of architectures can be built in the metallization step, depending on which device is desired. For example, metallizing processed strips 1908 forms metallized substrate 1910. In another example, FIG. 19E shows metallized positive electrode 1911 and metallized negative electrode 1912 deposited to form a diode 1913. In another example, anode and cathode electrodes are formed in the metallization step. When a voltage is applied across electrodes 1911 and 1912, a p-n junction forms between electrodes 1911 and 1912. The p-n junction is formed in the semiconductor nanowires 1904, such that light is emitted from the nanowires 1904 during operation. The wavelength of light emitted from the nanowire depends on several factors, including the nanowire semiconductor material and the presence of impurities in the nanowire. The minimum voltage required for the nanowires to emit light also depends on these factors. Preferably, the minimum voltage is less than about 5 volts. Diode 1913 is separately addressable and has pixel size dimensions for display applications. Therefore, sheets of composite 1913 can be formed that comprise a plurality of independently and electrically addressable pixel sized diodes for flat-panel display applications.

Light Emitting Diode Embodiments

In an embodiment, the present invention relates to a flat-panel display comprising as the active layer a Light-Emitting Diode (LED). The LED comprises one or more nanowire-material composites having a plurality of independently and electrically addressable pixel sized diodes. Each addressable diode includes nanowires as the active light-emitting element.

Figure 20:
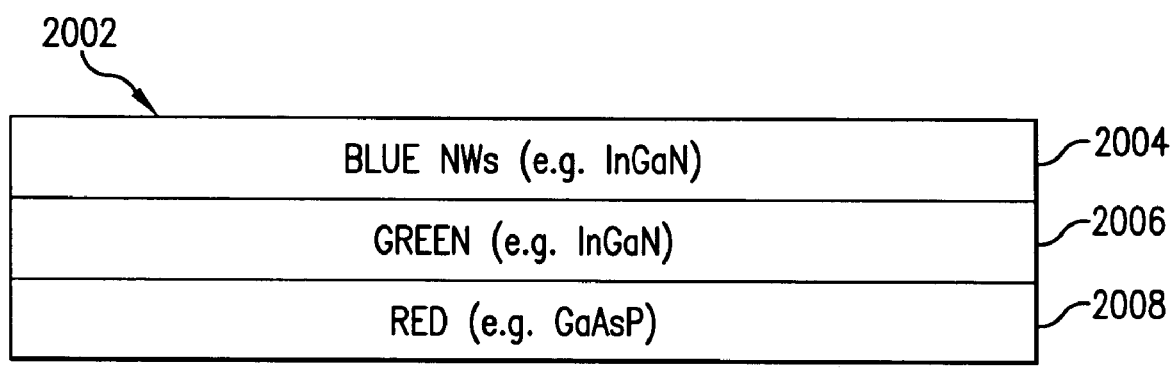
FIG. 20 shows a multilayered light-emitting diode having three layers of different nanowire-material composites, according to an embodiment of the present invention.

FIG. 20 shows an example of a multi-layered display 2002 having three different and independent active layers. The layers comprise nanowires that emit light at different wavelengths. Preferably, the layer attached to a substrate 2008 the bottom layer, emits red light. Examples of red-emitting nanowires are made from GaAsP. The middle layer 2006 preferably comprises green-emitting nanowires, for example, InGaN nanowires. The top layer 2004 preferably comprises blue-emitting nanowires, for example, InGaN nanowires. Note, however, the layers can be arranged in different orders, and can have different numbers of layers. Other semiconductor nanowire materials for use in light-emitting applications includes, but is not limited to GaN, GaP, GaAs, InP, InAs, ZnO and combinations thereof.

In an embodiment, the top layer absorbs no light, or alternatively, only a small amount of light emitted by the two layers below it. In other words, in the configuration at FIG. 20, the blue layer does not absorb light emitted from the red or green layer. Also, the green layer does not absorb light from the red layer. It is understood by one of ordinary skill in the art that different colors can be used when stacking layers of light-emitting nanowire-material composites. Color combinations should be chosen such that layers laminated on top of another layer do not absorb a substantial amount of the light emitted from the lower layer.

Figure 21:
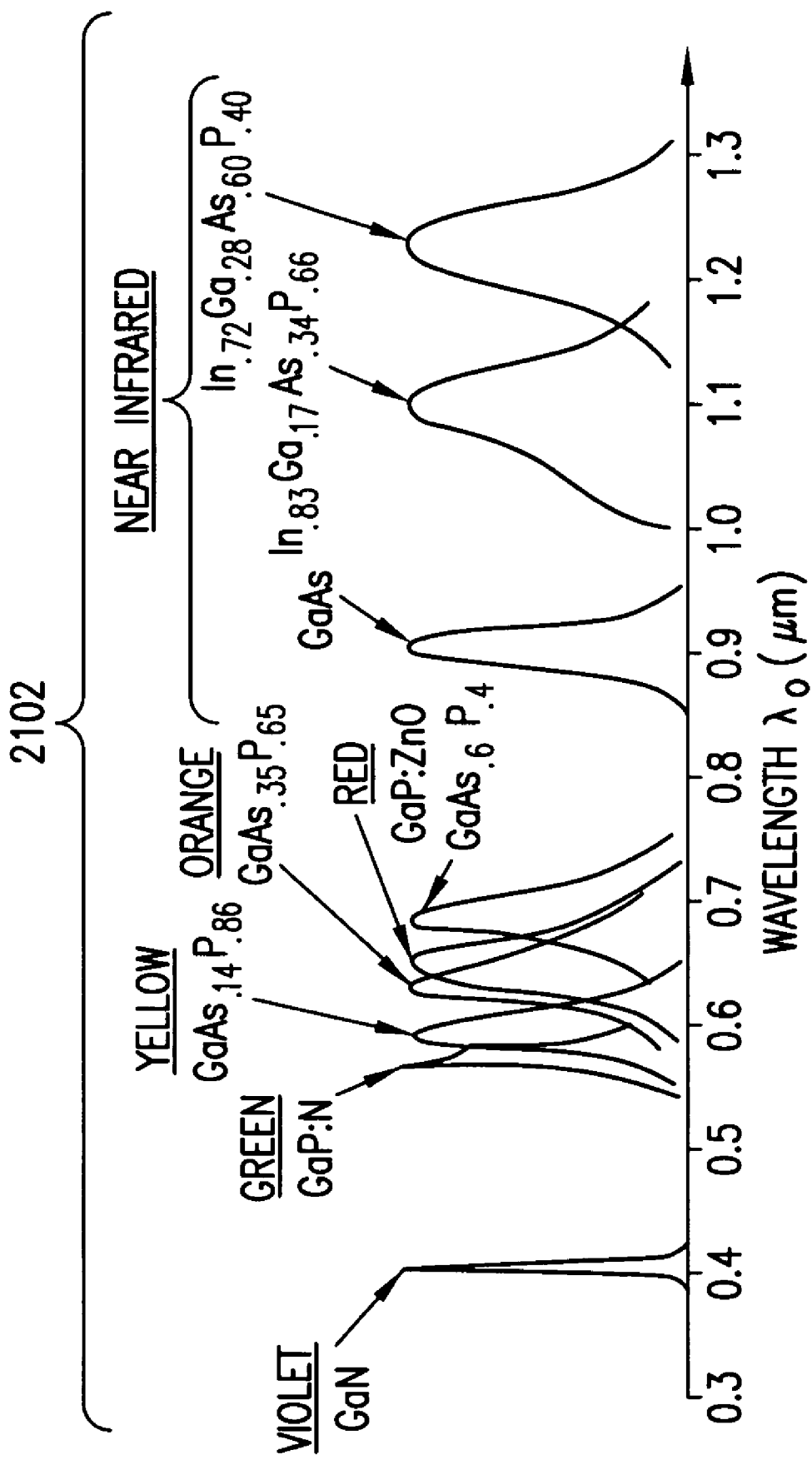
FIG. 21 shows an electronic absorption spectrum of various semiconductor nanowires and their respective absorption spectrum.

FIG. 21 shows an absorption spectra 2102 for a variety of nanowires compositions. Nanowires absorbing light having wavelengths greater than about 1.0 microns should be below layers absorbing light having wavelengths between about 0.7 and about 1.0 microns. Nanowires absorbing light having wavelengths between about 0.3 and about 0.7 microns should be laminated on top of all other layers. Alternatively, however, these layers can be stacked in different orders.

In an embodiment, therefore, the present invention relates to a nanowire-material composite, comprising a polymer having nanowires embedded therein, which emits light. Thus, the present invention may be used in any display and/or light source application, including televisions, computer displays, (e.g., handheld, notebook, desktop, laptop), overhead displays, indoor or outdoor lighting, and any other such applications.

Solution Based Processing Embodiments

Figure 22:
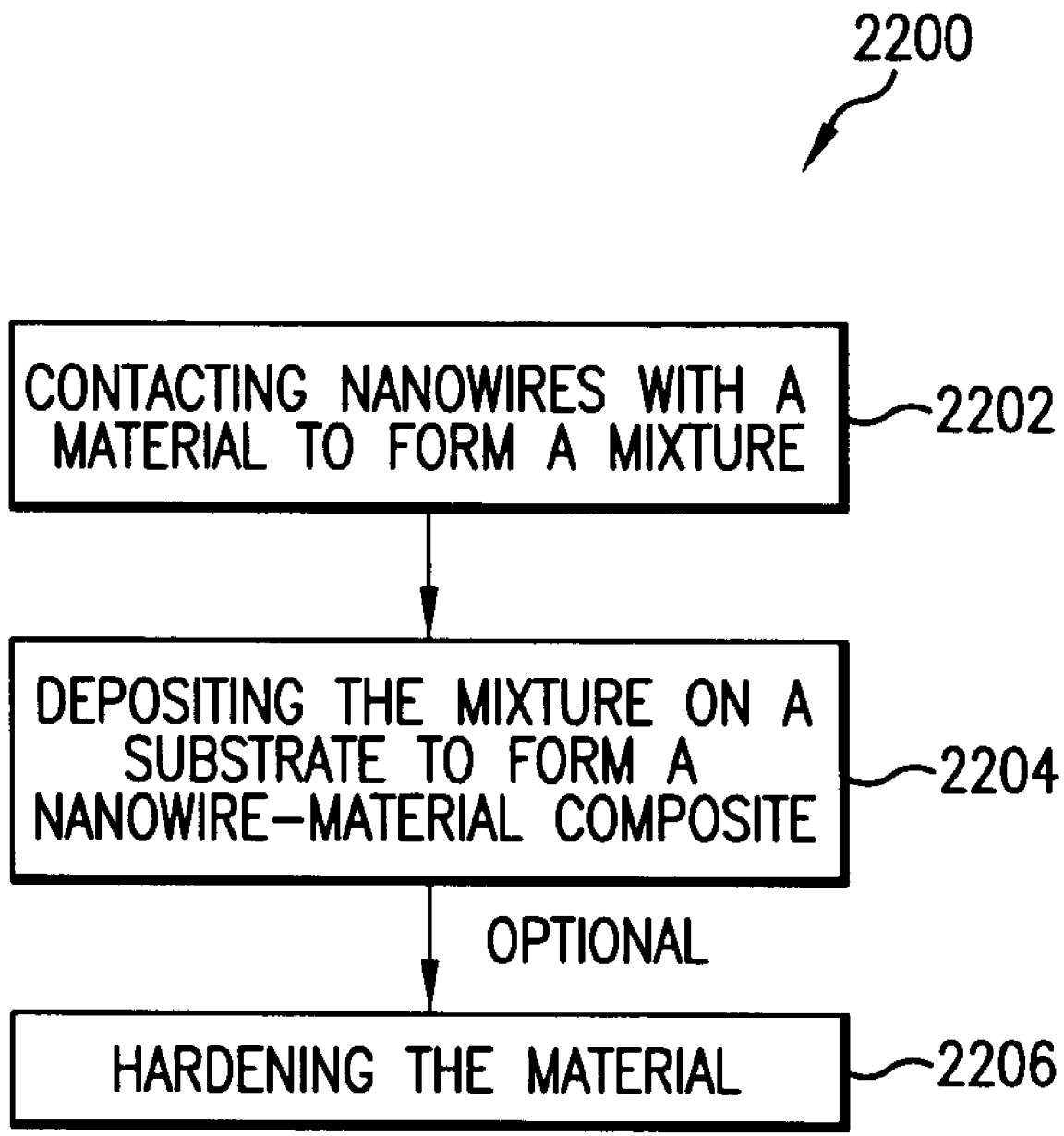
FIG. 22 is a flow diagram of steps in the solution-based process of producing a nanowire-material composite, according to an embodiment of the present invention.

In an embodiment, the present invention relates to a method of forming a nanowire-material composite. FIG. 22 shows flowchart 2200 showing example steps for producing a nanowire-material composite using solution based methods, according to an embodiment of the present invention. In step 2202, nanowires are contacted with a material to form a mixture. Any material, such as material 608, shown in FIG. 6, can be used to form the mixture. The formation of the mixture can be facilitated by stirring, sonication or any other method known to one of ordinary skill in the art for dispersing nanowires in the material.

In step 2204, the mixture is deposited on a substrate to form a nanowire-material composite. The mixture is deposited using any method that allows for the controlled deposition of the mixture. It is understood by one of ordinary skill in the art that many different methods of deposition are available and the choice of method depends on the type of material, substrate and nanowires used and the desired final properties of the nanowire-material composite. Methods for deposition include, but are not limited to drop-casting, spin-coating, dip-coating, langmiur-blodgett techniques and blade coating. It is understood by one of ordinary skill in the art that the mixture can be deposited in a variety of forms. The forms include, for example, but are not limited to a neat liquid or melt and as a solution in a suitable solvent. Suitable solvents include aqueous and non-aqueous solvents.

In an example embodiment, the mixture is deposited unidirectionally such that the nanowires are substantially aligned parallel to their long axis as a result of the deposition. For example, the mixture is made to flow over the substrate such that the nanowires are substantially aligned parallel to the direction of flow. Alternatively, the mixture is deposited by blade coating in such a way that results in the substantial alignment of the nanowires parallel to their long axis and parallel to the direction of movement. Alternatively, the substrate is dipped into a bath of the mixture or a langmuir-blodgett trough containing the mixture. The substrate is removed such that the nanowires are substantially aligned parallel to their long axis and parallel to the direction that the substrate is removed from the bath. It will be apparent to one of ordinary skill in the art that alternative means of aligning the nanowires during deposition of the mixture are available. Alternative means include, for example, electric and/or magnetic field alignment.

In an exemplary method of aligning nanowires using an electric field, positive and negative electrodes are held across the deposited mixture or nanowire-material composite. A direct current (DC) electric field is applied to the mixture or composite in the range of about 10 V/cm to about 3000 V/cm or other value, and held constant or varied for a time sufficient to align the nanowires.

After depositing the mixture on the substrate, the material is optionally further processed. A variety of processing steps can be performed, depending on the desired final properties of the nanowire-material composite. Referring back to FIG. 22, one example is shown in optional step 2206, in which the material is hardened. Alternative processing steps include, but are not limited to curing, cross-linking, polymerizing, photo polymerizing, melting, crystallizing, oxidizing, reducing and removing solvents, gases or other volatile fluids. Solvents or volatile gases and fluids can be removed using any method known to one of ordinary skill in the art. Removing volatile gases/fluids can render the composite porous by removing the volatile gases/fluids quickly, or by selectively choosing appropriate volatile gases. Example appropriate volatile gases include inert gases that do not react or interfere with the embedded nanowires, such as nitrogen, helium, argon or the like.

In an embodiment, after forming the nanowire-material composite, it is optionally further processed while attached to the substrate. Alternatively, the nanowire-material composite is separated from substrate before optional further processing to form a free-standing nanowire-material composite. Optional further processing steps include, but are not limited to, planarization, patterning, separating the patterned nanowire-material composite from the substrate, doping, metallization and further device fabrication steps.

Nanowire Array Embodiments

Figure 23A:
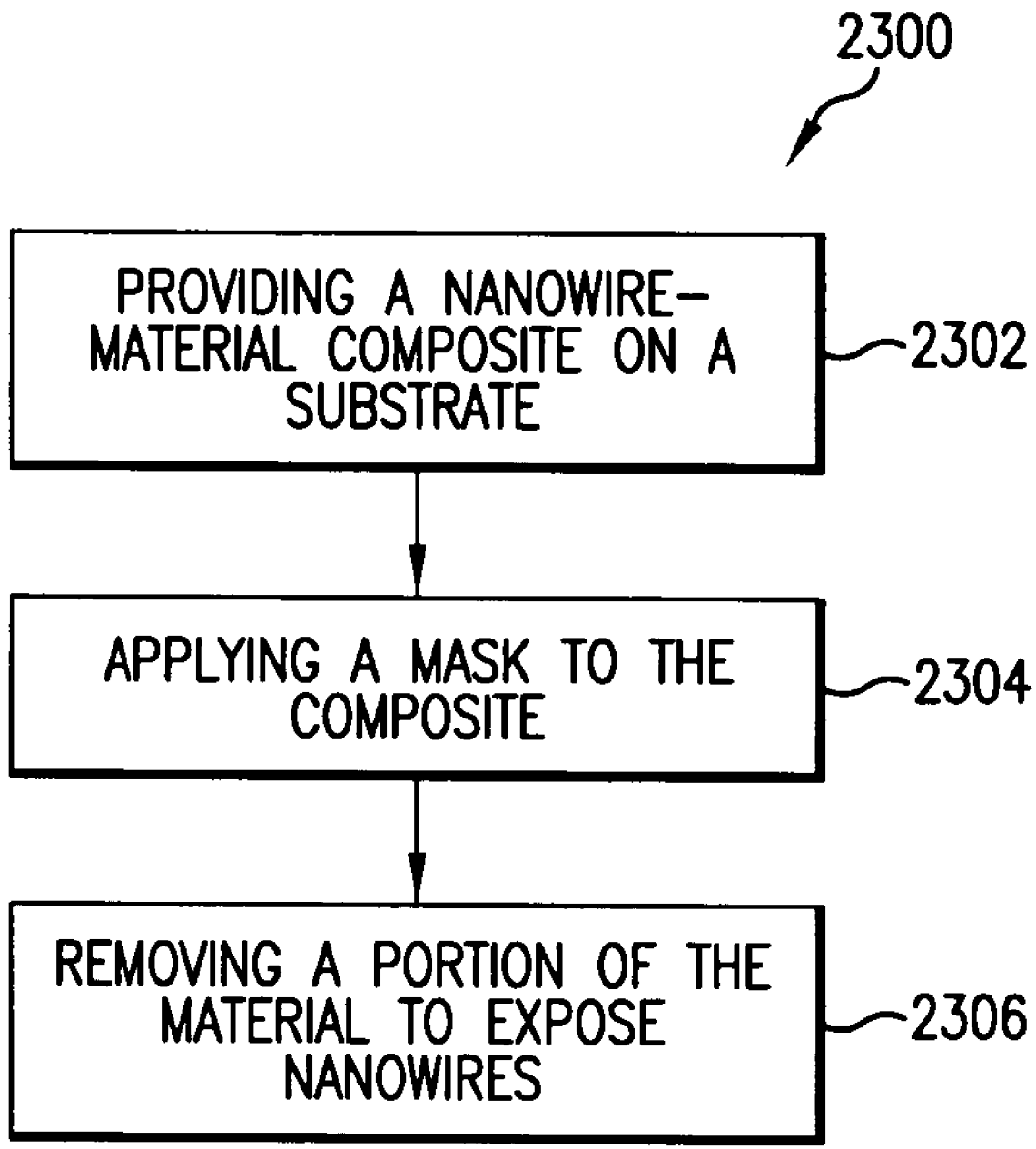
FIG. 23A is a flow diagram of steps in a process of producing a nanowire array, according to an embodiment of the present invention.

In an embodiment, the present invention relates to a nanowire array and a method of producing the same. FIG. 23A shows a flowchart 2300 showing example steps for producing a nanowire array, according to an embodiment of the invention. In step 2302, a nanowire-material composite is provided. The composite can be provided on a substrate or as a free-standing composite. The composite can comprise embedded nanowires that are oriented in any fashion. For example, the nanowires can be oriented perpendicular to the surface of the substrate or randomly oriented. The composite can be formed on the substrate, or formed as a freestanding composite and attached to the substrate in subsequent processing steps.

Figure 23B:
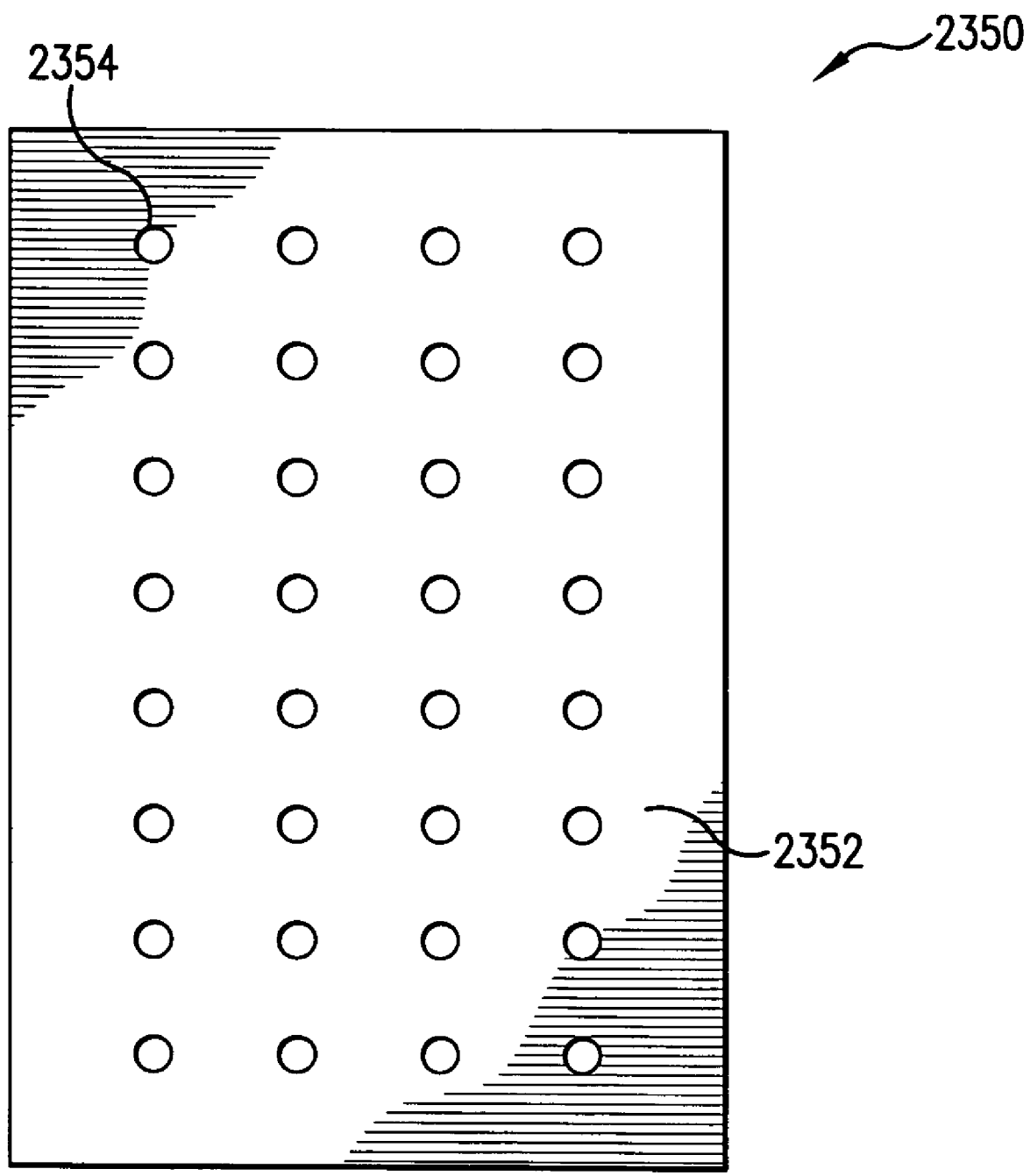
FIG. 23B shows an exemplary mask that can be used in a process of producing a nanowire array, according to an embodiment of the present invention.

In step 2304, a mask is applied to the nanowire-material composite. The mask allows for the controlled removal of a portion of material from the composite. For example, the mask is a shadow mask. The mask can be made of any material that allows for the selective removal of material from the composite, for example, metal foil. Metal foils for use as the mask include those foils that are inert and unreactive to the composite. The mask comprises an array of shapes that allows for patterns of material to be selectively removed, for example, the mask comprises an array of circles, squares, rectangles or any other regular or irregular shapes or patterns. In an embodiment, as shown in FIG. 23B, mask 2350 can be used in steps 2304 and 2306. Mask 2350 comprises metal foil 2352 and an array of circles 2354.

In step 2306, material is selectively removed from the composite to expose a portion of the nanowires. Any method can be used to remove the material. For example, the material can be removed using a plasma etch or organic solvent. The amount of material that is removed from the composite depends on the particular application for the array. In one example, a portion of material is removed from the composite to create an array of wells in the composite that contain exposed nanowires. For example, the wells comprising the nanowires can hold an analyte that is analyzed using the exposed nanowires as sensing elements.

Figure 24:
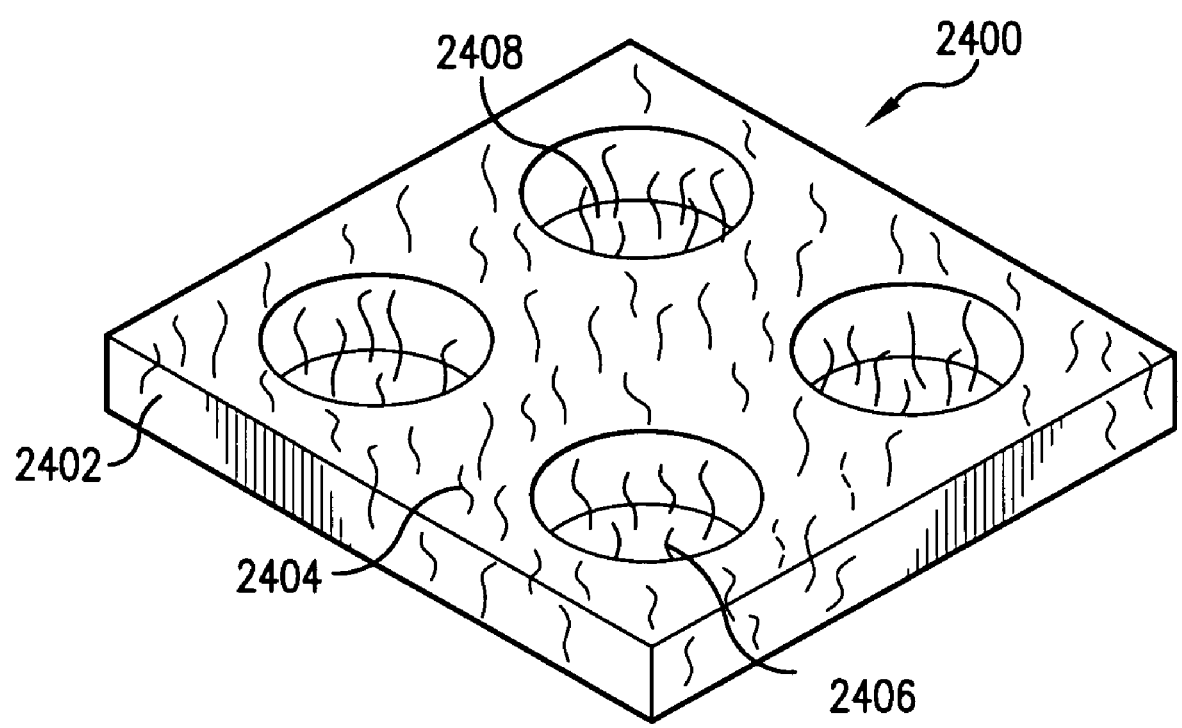
FIG. 24 is a diagram illustrating a nanowire array, prepared according to an embodiment of the present invention.

FIG. 24 illustrates an example of a nanowire array 2400. Nanowire array 2400 can be formed by mask 2350 shown in FIG. 23B, for example. Material 2402 is shown having nanowires 2404 embedded therein. Areas 2408 in which material 2402 has been removed are shown. Exposed nanowires 2406 are shown. The nanowires 2406 can be processed to allow for efficient distribution of analyte into the wells or areas 2408 comprising the exposed nanowires 2406. For example, nanowires 2406 can comprise hydrophilic surfaces and material 2402 can comprise hydrophobic surfaces. It is understood that nanowires 2406 can alternatively comprise hydrophobic surfaces and material 2402 can comprise hydrophilic surfaces. It is well known to one of ordinary skill in the art how nanowires can be processed to render their surfaces hydrophobic. For example, nanowires can be reacted with an alkylfluorosilane. Arrays prepared in accordance with embodiments of the present invention can be used in a variety of devices. For example, they can be used as sensing elements for the analysis of biological material, including, but not limited to DNA, RNA, proteins, enzymes, antibodies and the like.

High Capacitance Capacitor Embodiments

Figure 25A:
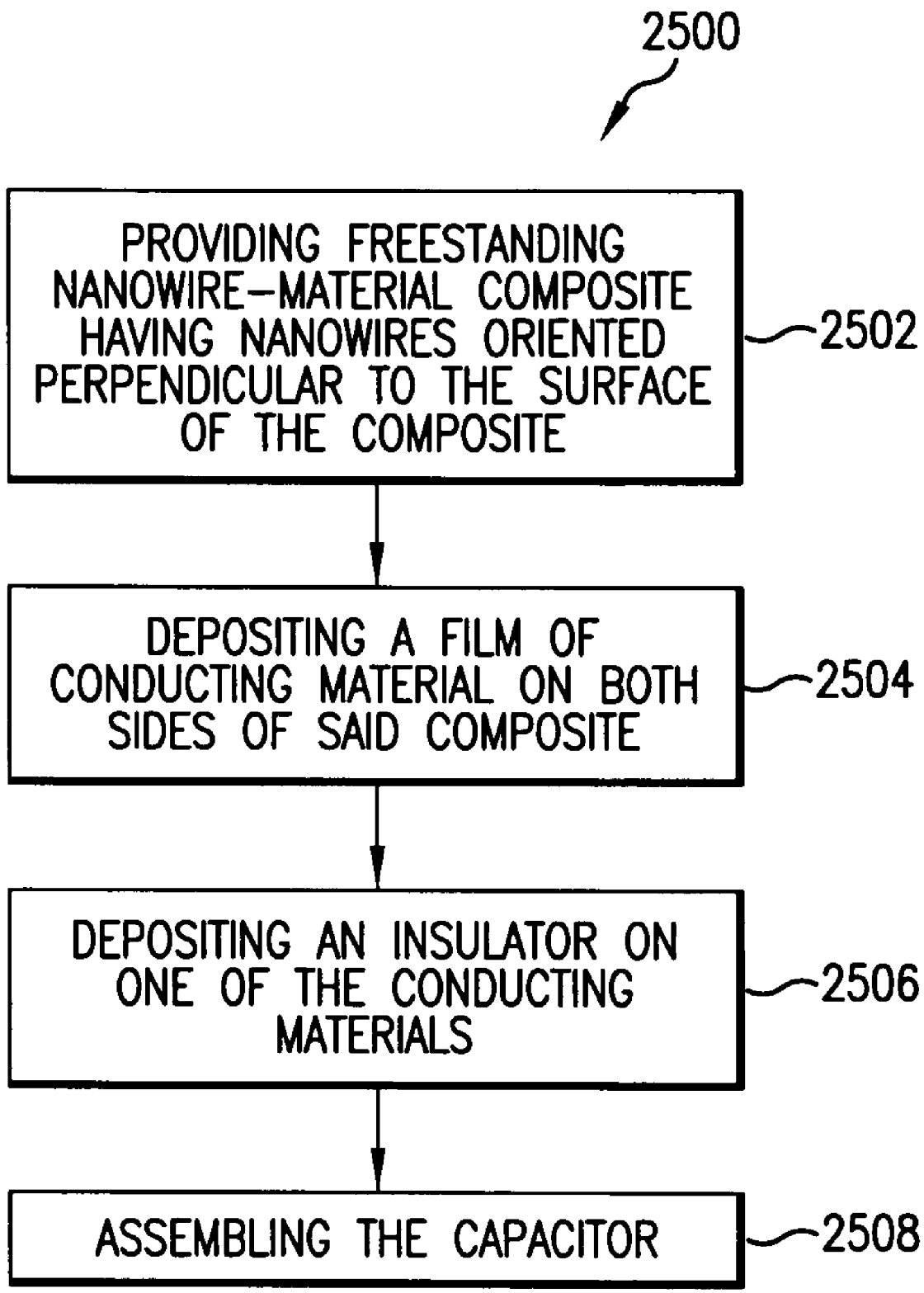
FIG. 25A is a flow diagram of steps in a process of producing a high-capacitance capacitor comprising a nanowire-material composite, according to an embodiment of the present invention.
Figure 25B:
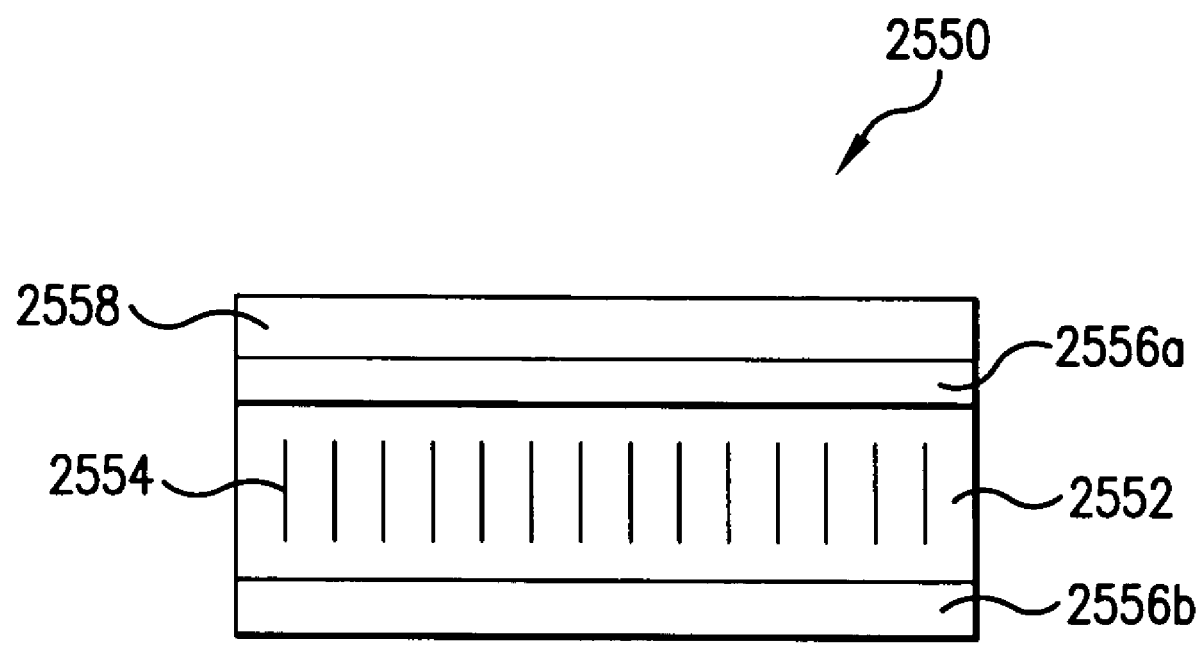
FIG. 25B shows an exemplary capacitor produced according to an embodiment of the present invention.

In an embodiment, the present invention relates to high capacitance capacitors including nanowire-material composites, and relates to methods of producing the same. FIG. 25A shows flowchart 2500 showing example steps for producing a high capacitance capacitor, according to an embodiment of the present invention. FIG. 25B shows an example capacitor 2550, produced according to an embodiment of the present invention. Flowchart 2500 begins with step 2502. In step 2502, a freestanding nanowire-material composite having nanowires oriented perpendicular to the composite surface is provided. For example, FIG. 25B shows nanowire-material composite 2552, having nanowires 2554 oriented perpendicular to the composite surface.

In step 2504, a conducting film is deposited on both surfaces of the freestanding composite. Any conducting material can be deposited on the composite, preferably, the conducting material is a metal. Any method of depositing the metal on the composite surface can be used. Examples include, but are not limited to electroless plating and sputtering. Any metal can be used, preferably, the metal is an inert metal that is highly conductive and does not react chemically with the composite. Examples of metals include, but are not limited to aluminum, nickel, copper, silver, platinum, and gold. For example, FIG. 25B shows metal layers 2556a and 2556b deposited on both surfaces of composite 2552.

In step 2506, an insulator is deposited on one metal surface. Any insulator can be used. For example, aluminum oxide can be used. The insulator layer can be deposited on the surface using any method known to one of skill in the relevant art. For example, FIG. 25B shows insulator layer 2558 deposited on metal layer 2556a.

Figure 25C:
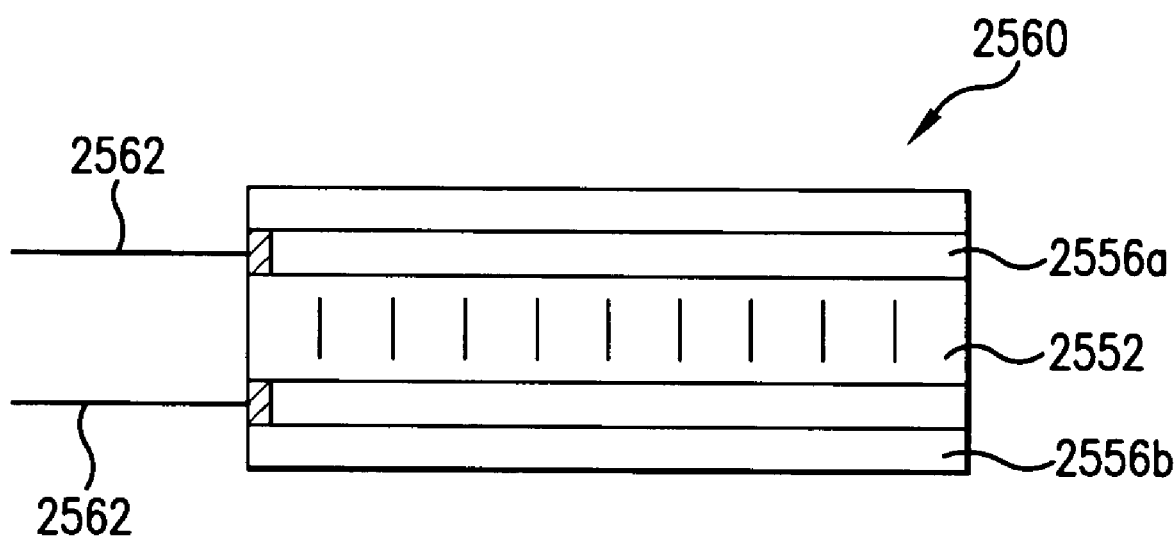
FIG. 25C shows an exemplary capacitor produced according to an embodiment of the present invention.

In step 2508, a capacitor is assembled. The assembling of a capacitor can include a variety of steps, including, but not limited to attaching leads to both metal surfaces, rolling-up the films, storing the rolled up films in a canister and sealing the canister. FIG. 25C shows an example capacitor 2560 having leads 2562 attached to the metal layers 2556a and 2556b.

Figure 26:
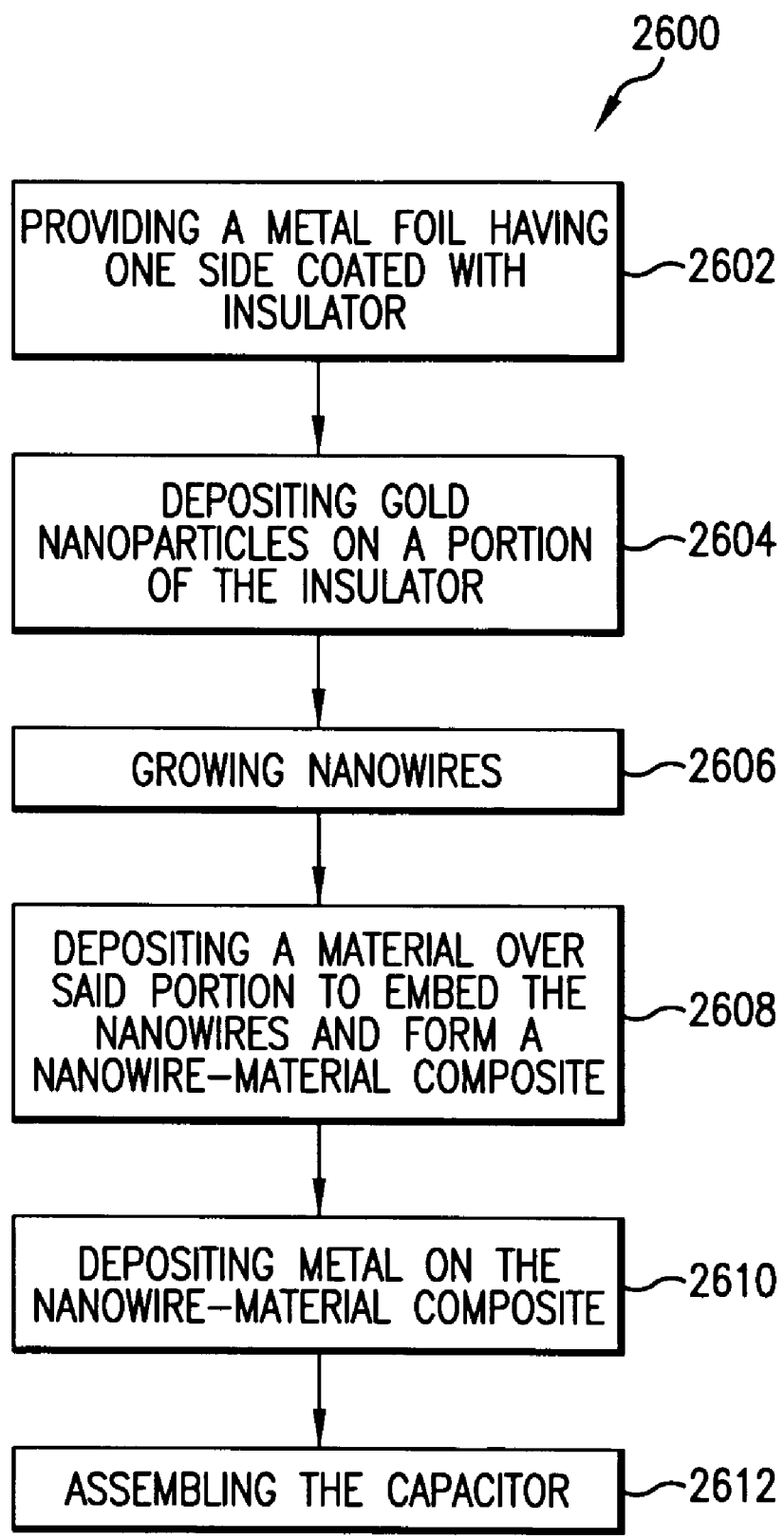
FIG. 26 is a flow diagram of steps in an alternative process of producing a high-capacitance capacitor comprising a nanowire-material composite, according to an embodiment of the present invention.

FIG. 26 shows flowchart 2600 showing an alternative process for producing a high capacitance capacitor, according to an embodiment of the present invention. In step 2602, a metal foil is provided in which one surface of the metal foil is coated with an insulator film. The insulator film can be made from various insulator materials, including, but not limited to aluminum oxide. In step 2604, gold, or other material, nanoparticles are deposited on a portion of the insulator film. Any method of deposition can be used, for example, the gold nanoparticles can be spin-casted or drop-casted onto a surface of the insulator film. In step 2606, nanowires are grown on the portion comprising the gold nanoparticles. In step 2608, a material is deposited on the portion to embed the nanowires and form a nanowire-material composite on the surface of the insulator film. In one embodiment, the material comprises a prepolymer or monomer mixture. The material is optionally further processed in optional further processing steps. For example, the material can be hardened. In one example, the material comprises a prepolymer and the material is hardened by polymerizing the prepolymer. In step 2610, a metal is deposited on the surface of the composite to form a capacitor film. In step 2612, the capacitor is assembled. For example, the capacitor may be assembled by attaching leads to the metal surfaces, rolling the capacitor film, and sealing the rolled film in a container.

Flexible Nanocomposite Sheet and Nanofur Embodiments

Figure 27A:
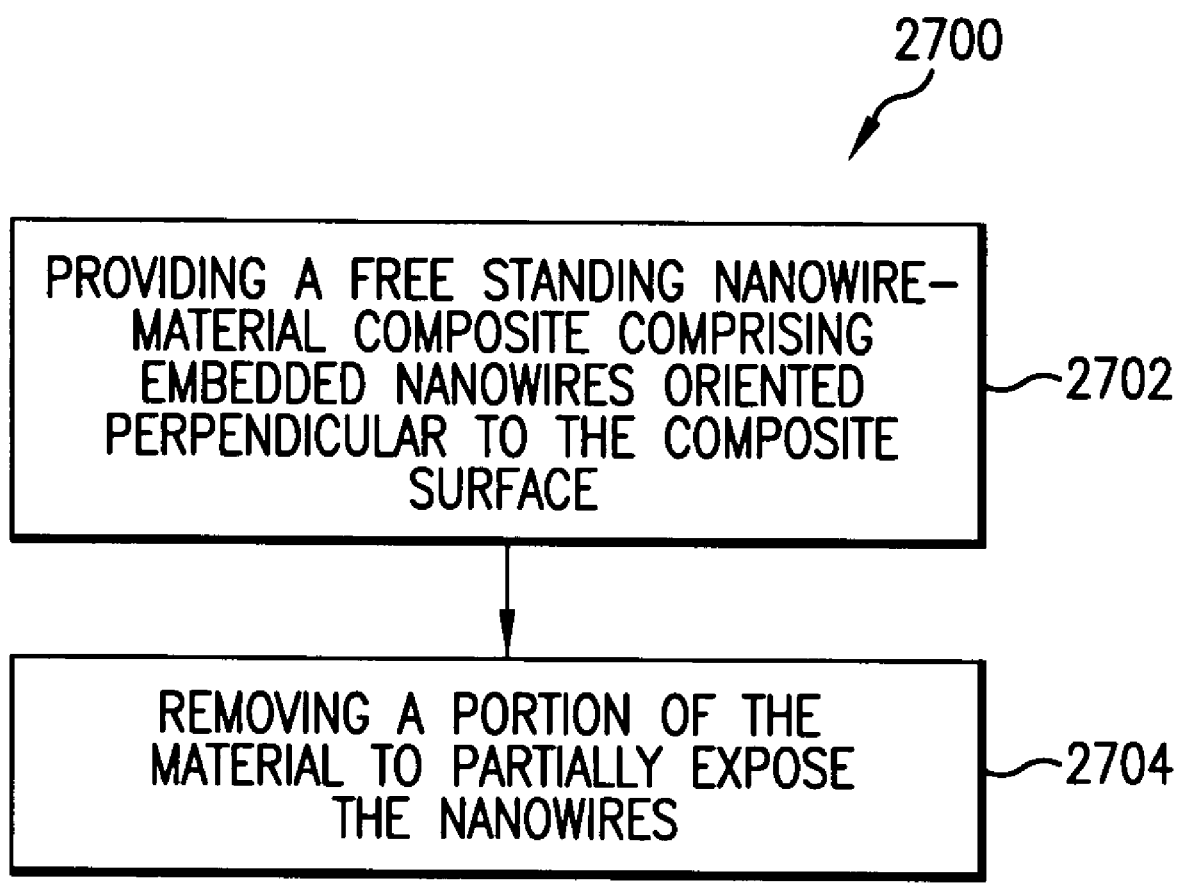
FIG. 27A is a flow diagram of steps in a process of producing flexible nanofur, according to an embodiment of the present invention.
Figure 27B:
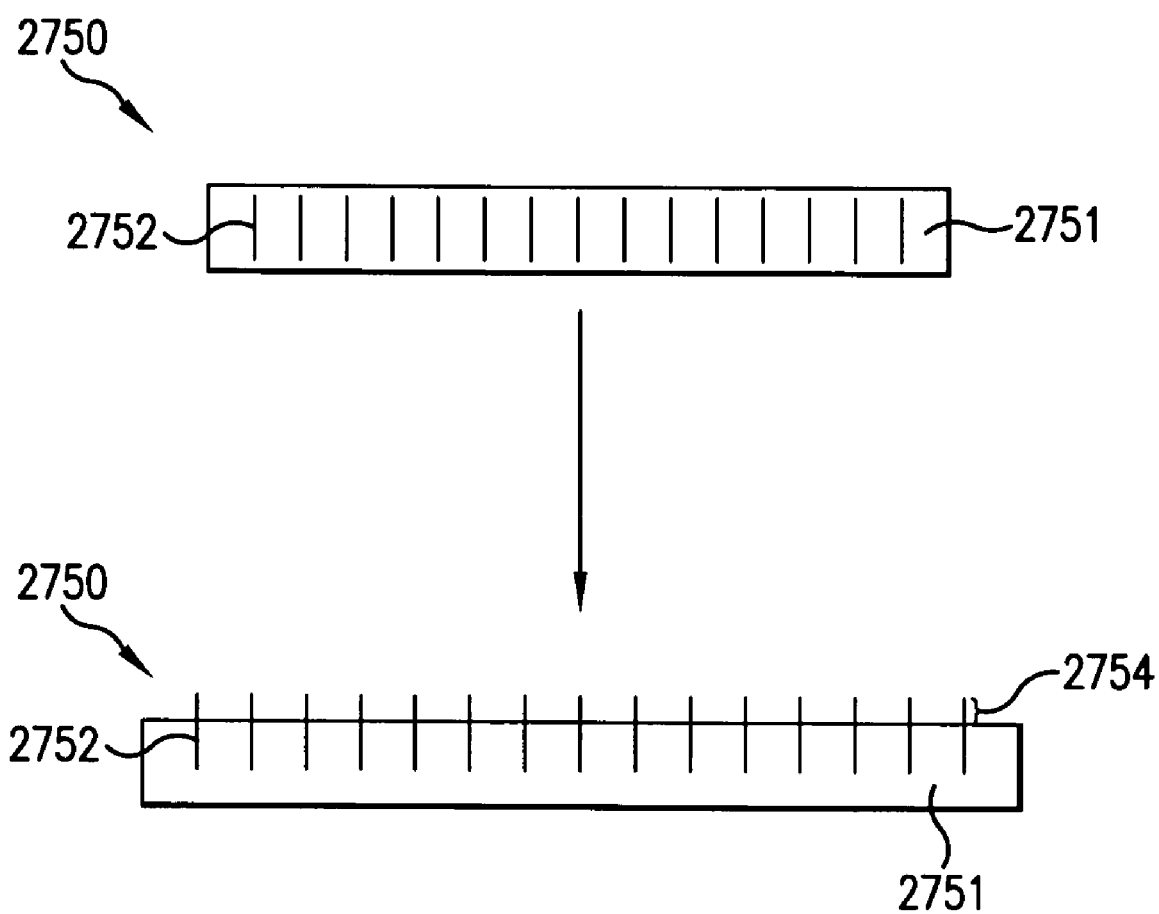
FIG. 27B shows exemplary nanofur being produced according to an embodiment of the present invention.

In an embodiment, the present invention relates to nanowire-material composite films comprising partially exposed nanowires oriented perpendicular to the surface of the composites and relates to methods for producing the same. FIG. 27A shows flowchart 2700 showing example steps in the preparation of composites comprising partially exposed nanowires. In step 2702, a nanowire-material composite film comprising embedded nanowires oriented perpendicular to the surface is provided. Alternatively, a mixture of nanowires and material is extruded to form a sheet of nanowire-material composite. The extrusion process orients the nanowires in the direction of fluid flow. In step 2704, a portion of the material is removed to partially expose the embedded nanowires. Any method known to one of skill in the relevant art can be used to remove the material, for example, plasma etching or organic solvents are used. FIG. 27B shows examples of the implementation of steps 2702 and 2704. Nanowire-material composite 2750 comprises material 2751 and nanowires 2752 embedded in material 2751 and oriented perpendicular to the composite surface. After step 2704, material 2751 is partially removed from composite 2750. Then, composite 2750 comprises nanowires 2752, wherein a portion 2754 of nanowires 2752 are exposed to produce nanofur.

Nanowire Composite Tube Embodiments

Figure 28A:
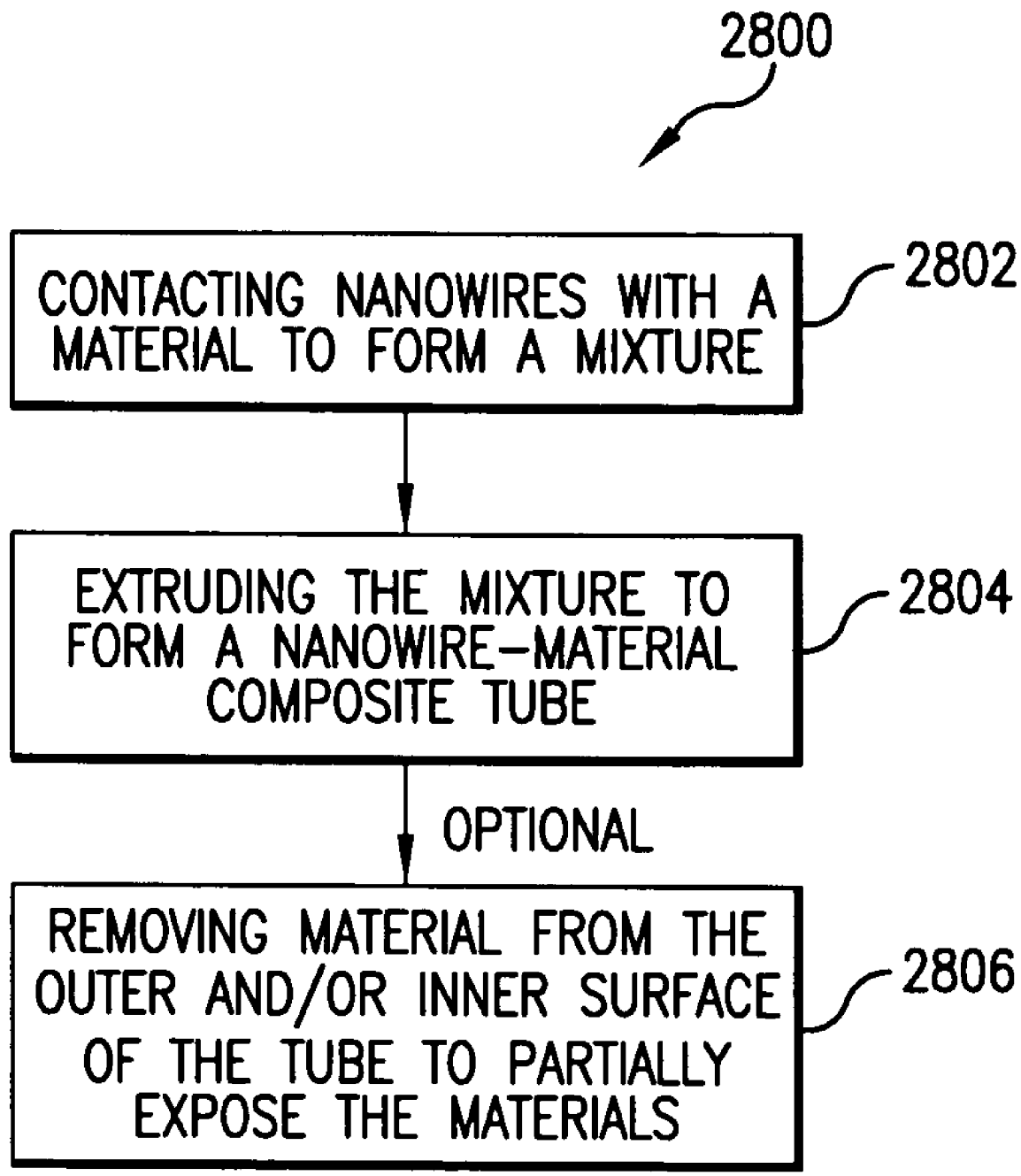
FIG. 28A is a flow diagram of steps in a process of producing a tubular nanowire-material composite, according to an embodiment of the present invention.
Figure 28B:
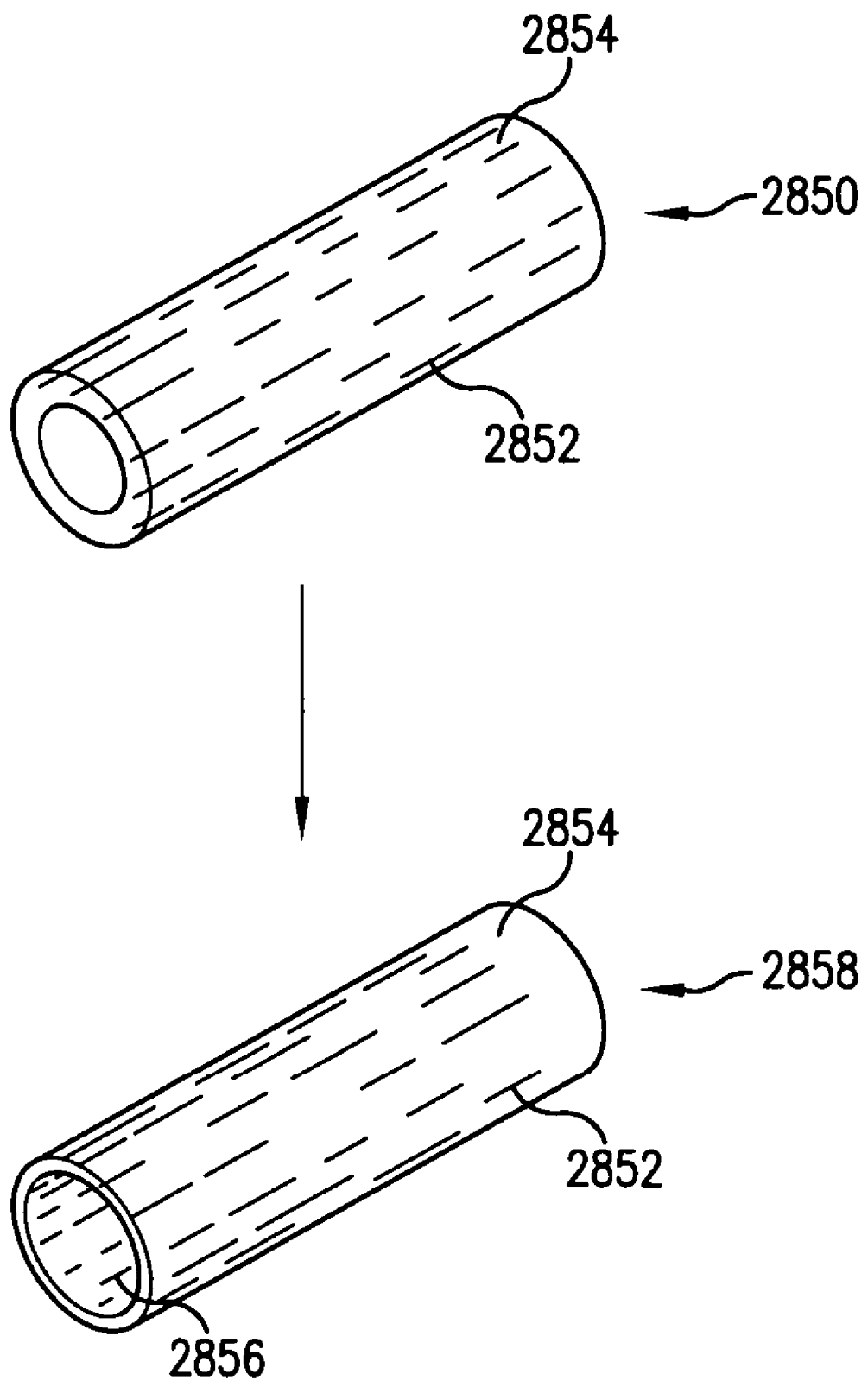
FIG. 28B shows an exemplary tubular nanowire-material composite produced according to an embodiment of the present invention.

In an embodiment, the present invention relates to nanowire-material composite tubes and processes for producing the same. FIG. 28A shows flowchart 2800 showing exemplary steps in the preparation of nanowire-material composite tubes. In step 2802, nanowires are contacted with a material to form a mixture. In step 2804, a mixture comprising nanowires and material is extruded to form a nanowire-material composite tube. Any method of extrudation known to one of skill in the relevant art can be used. Extrusion can be used to produce materials having various shapes. For example, the mixture can be extruded through a circular die to produce a tubular shape. In another example, the mixture can be extruded through a linear die to produce a sheet of composite. In optional step 2806, material is removed from the one or both of the outer and inner surfaces of the tube to partially expose the embedded nanowires. FIG. 28B shows examples of the implementation of the steps of flowchart 2800. FIG. 28B shows tubular nanowire-material composite 2850 comprising material 2854 and nanowires 2852 embedded therein. Tubular composite 2858 has a portion of material 2854 removed from the inner surface and comprises partially exposed nanowires 2856 and embedded nanowires 2852.

Figure 29A:
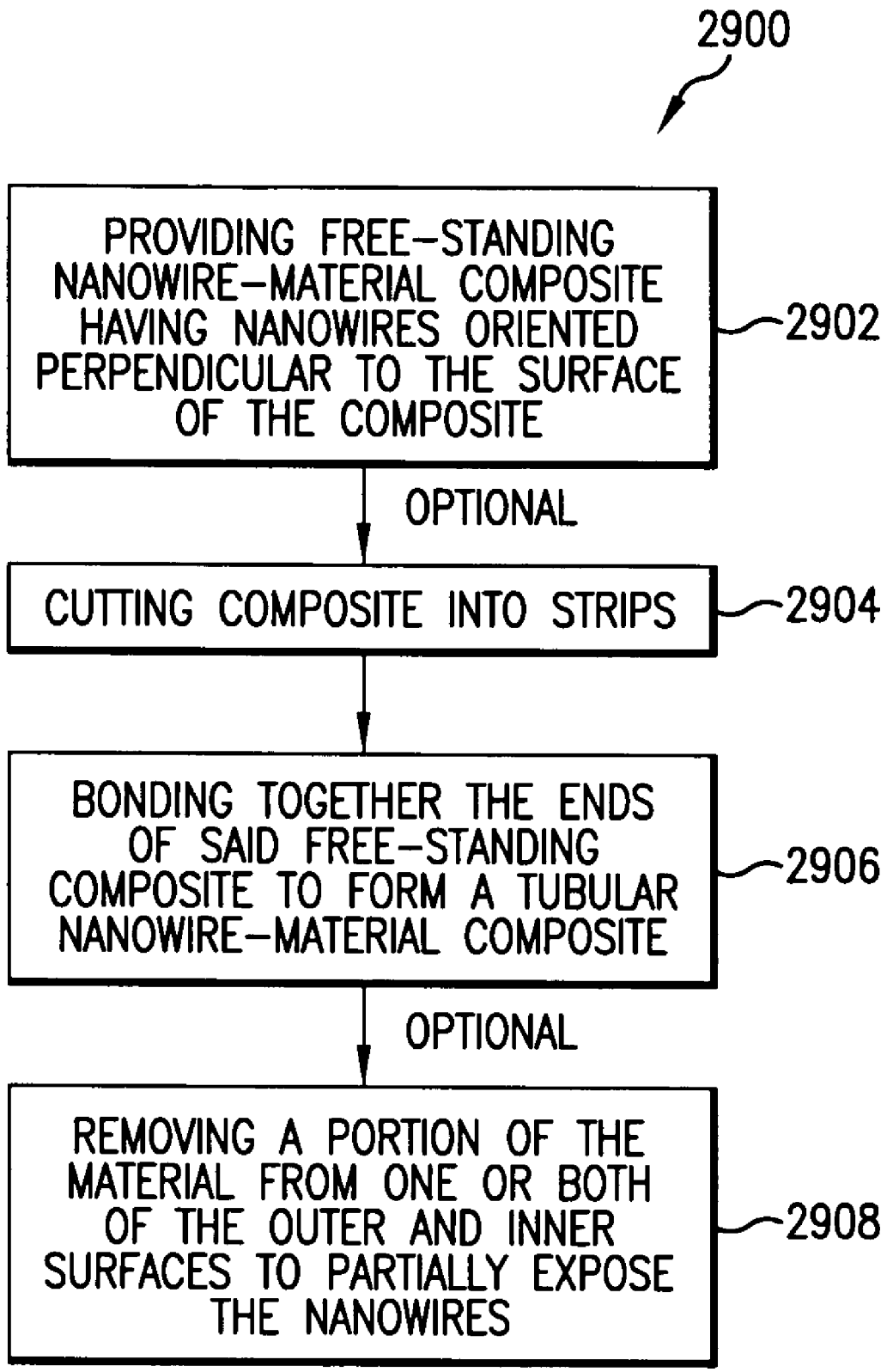
FIG. 29A is a flow diagram of steps in an alternative process of producing a tubular nanowire-material composite, according to an embodiment of the present invention.
Figure 30:
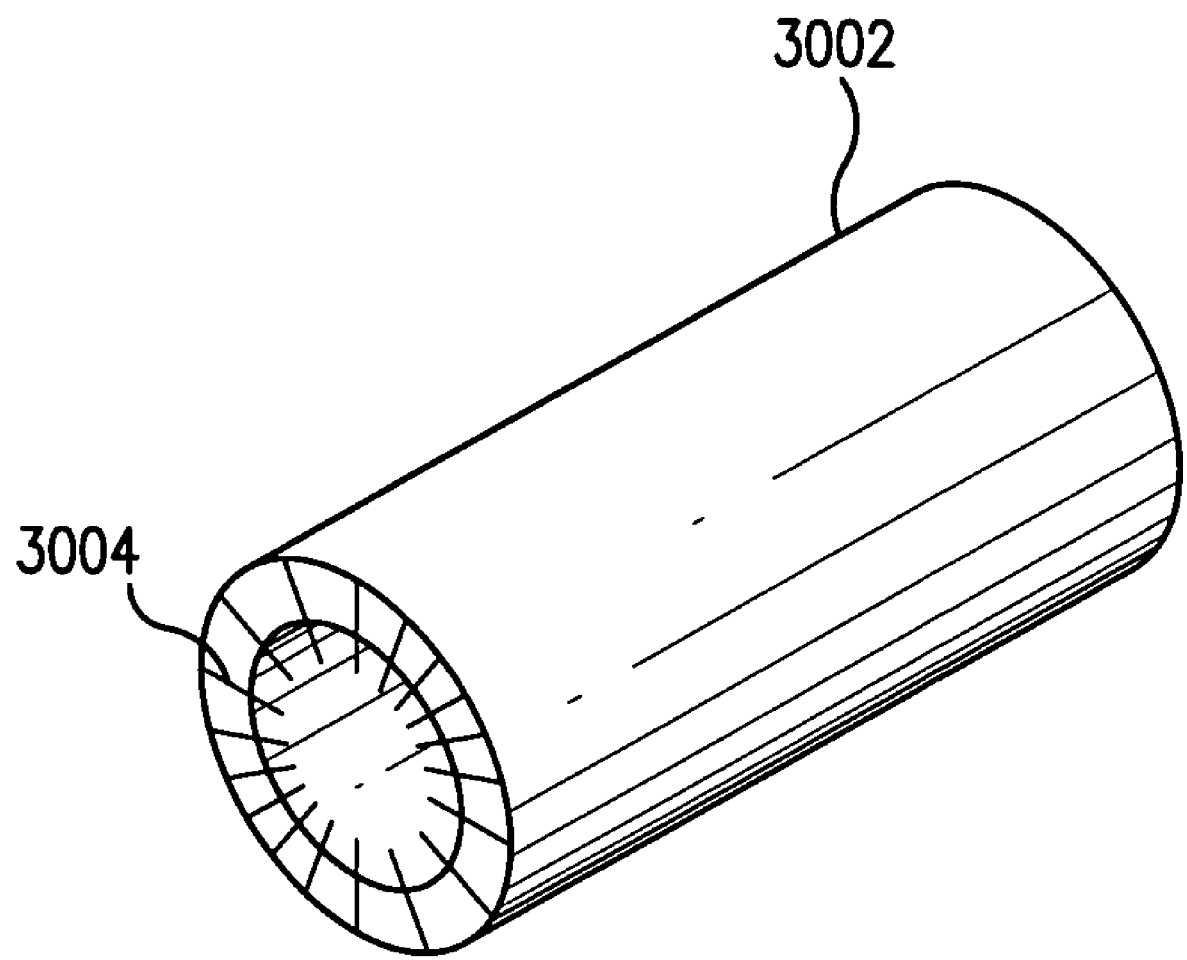
FIG. 30 is a diagram illustrating a tubular nanowire-material composite, prepared according to an embodiment of the present invention.

FIG. 29A shows flowchart 2900 showing an alternative process of preparing nanowire-material composite tubes. In step 2902, a freestanding nanowire-material composite film comprising embedded nanowires oriented perpendicular to the surface of the composite is provided. In optional step 2904, the composite film is cut into strips of any desired shape or size. In step 2906, the strips are rolled to form tubes and the ends are bonded together. The bonding or attachment of the ends of the composites can be done using any method known to one of skill in the relevant art. Exemplary methods include, but are not limited to, gluing or thermo-welding the ends of the composite. In optional step 2908, material is removed from one or both of the outer and inner surfaces of the tube to partially expose the embedded nanowires. FIG. 30 shows a tubular nanowire-material composite 3002, having exposed nanowires 3004 on the interior of the tube.

Figure 29B:
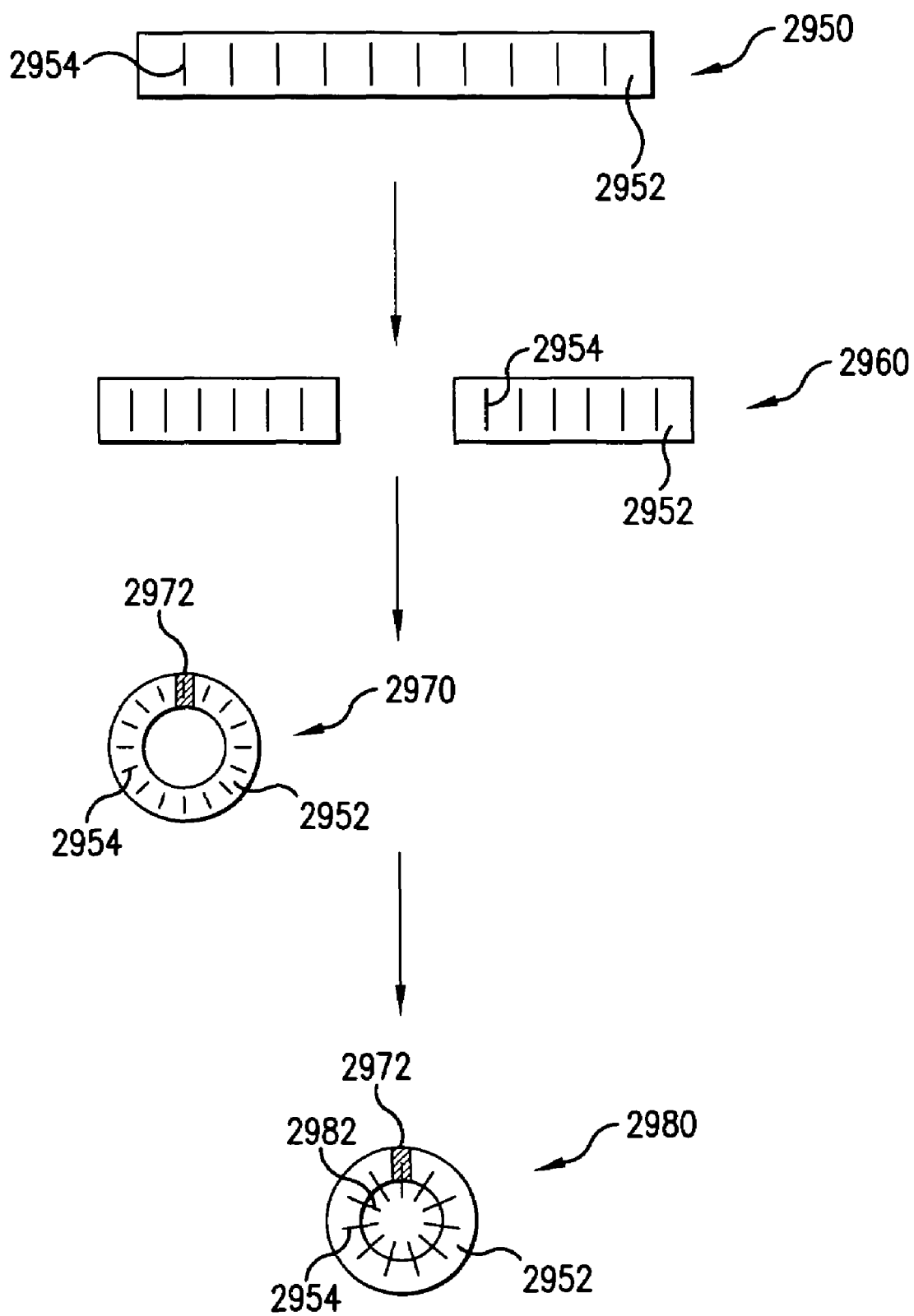
FIG. 29B shows an alternative exemplary tubular nanowire-material composite produced according to an embodiment of the present invention.

FIG. 29B shows examples of the implementation of flowchart 2900. Nanowire-material composite 2950 comprises material 2952 and nanowires 2954 embedded in material 2952 and oriented perpendicular to the surface of the composite. Composite strips 2960 show example implementation of step 2904. Rolled and bonded composite strips form tubular composites 2970, showing example implementation of step 2906. Bonded area 2972 attaches the ends of the composite strip 2960 to form the tubular shape. An example implementation of 2908 is shown by tubular composite 2980. Tubular composite 2980 comprises nanowires 2954 having a portion 2982 exposed in the inner portion of tubular composite 2980.

The following examples are illustrative, but not limiting, of the method and compositions of the present invention. Other suitable modifications and adaptations of the variety of conditions and parameters encountered in nanowire-material composite preparation and processing that would be known to those skilled in the art are within the spirit and scope of the invention.

EXAMPLES

Example 1

Preparation of Nanowire Composite With Nanowires Oriented Perpendicular to the Sheet Surface About 1.0 g of liquid polyethylene glycol diacrylate comprising about 10 mg of the photo initiator 2,2-dimethoxy-2-phenylacetophenone was placed in a glass vial. A silicon substrate, measuring about 1×3 cm was coated with 40 nm in diameter silicon nanowires. The nanowires were oriented substantially perpendicular to the surface of the substrate. The substrate was placed in the glass vial, with about 3 mm of one end of the substrate immersed in the liquid mixture. After about 15 minutes, the nanowires had wicked the liquid up to fill the spaces between them. The substrate was removed from the vial and placed under a UV lamp for about 15 min to polymerize the liquid. A nanocomposite coated substrate was thereby obtained, in which the nanowires were "frozen" at their original growth orientation.

Figure 31:
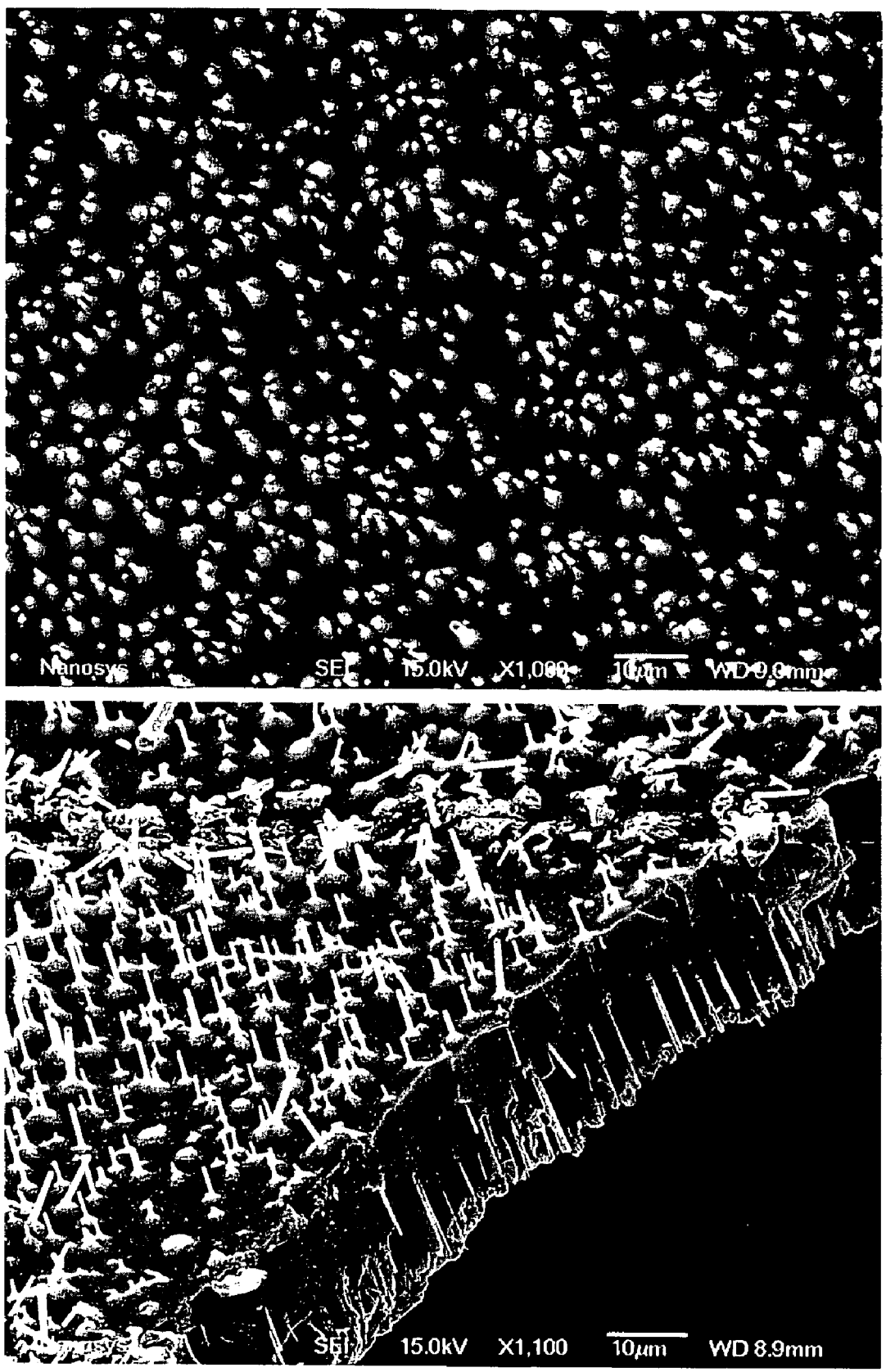
FIG. 31 is a Scanning Electron Microscope (SEM) image of a nanowire-material composite comprising nanowires oriented perpendicular to the surface of the composite, prepared according to an embodiment of the present invention.

FIG. 31 is a Scanning Electron Microscope (SEM) image of nanowires oriented perpendicular to the surface of an example resulting composite material, wherein the material comprises poly(ethyleneoxide).

Example 2

Preparation of Nanowire Composite With Nanowires Oriented Perpendicular to the Sheet Surface About 0.5 g poly(vinylidenefluoride) (PVDF) polymer was contacted with about 10 g of acetone. After a clear solution formed, about 11.6 mg of 40 nm Si nanowires was dispersed into the solution by sonication. About 5 g of the dispersion was transferred to a flat bottom glass dish with an inner diameter of about 35 mm. The dish was placed between a pair of electrodes and a DC field (about 3000 V/cm, with the negative (−) electrode applied to the top and positive (+) electrode applied to the bottom) was applied and the solvent was evaporated under the field.

Example 3

Preparation of Nanowire Composite With Random Nanowire Orientation

About 13 mg of 40 nm Si nanowires was dispersed in about 1 g of polyethylene glycol diacrylate. About 10 mg photo initiator of 2,2-dimethoxy-2-phenylacetophenone was added. About 5 drops of the dispersion was placed between two glass slides with a gap of about 0.3 mm. The glass slide was placed under a UV lamp for 15 minutes to polymerize the polyethylene glycol diacrylate and yield a composite sheet with thickness of about 0.3 nm.

Figure 32:
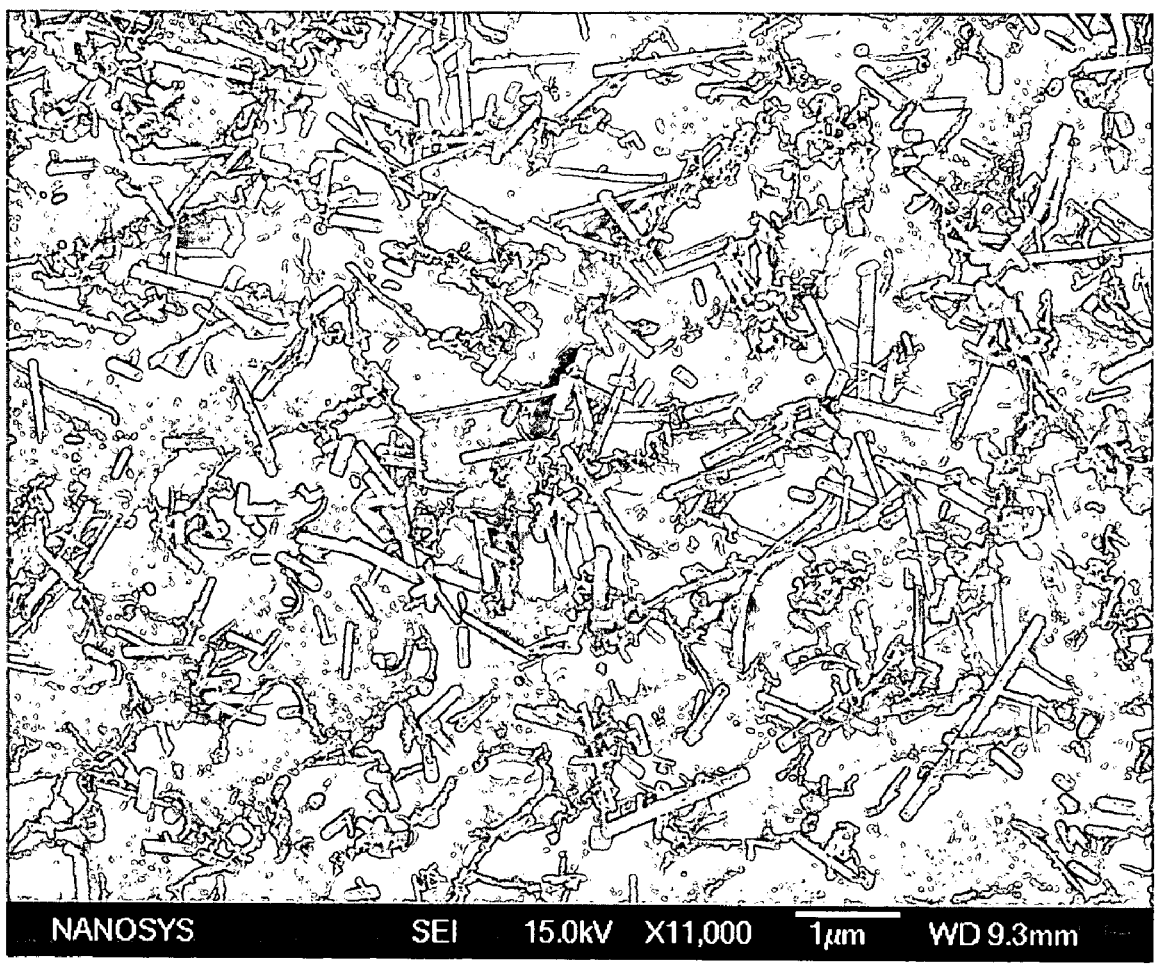
FIG. 32 is a SEM image of a nanowire-material composite comprising randomly oriented nanowires, prepared according to an embodiment of the present invention.

FIG. 32 is a SEM image of an example resulting nanowire-material composite, wherein the nanowires are randomly oriented and the material comprises poly(ethyleneoxide).

Example 4

Preparation of Nanowire Composite With Random Nanowire Orientation

About 0.5 g PVDF polymer was added to about 10 g acetone. After a clear solution was formed, about 8.5 mg of 40 nm Si nanowires was dispersed into the solution by sonication. About 5 g of the dispersion was transferred to a flat bottom glass dish with an inner diameter of about 35 mm. The dish was loosely covered and placed in a hood to allow solvent evaporation. Upon evaporation of the solvent, a composite sheet with a thickness of about 0.09 mm was obtained.

Figure 33:
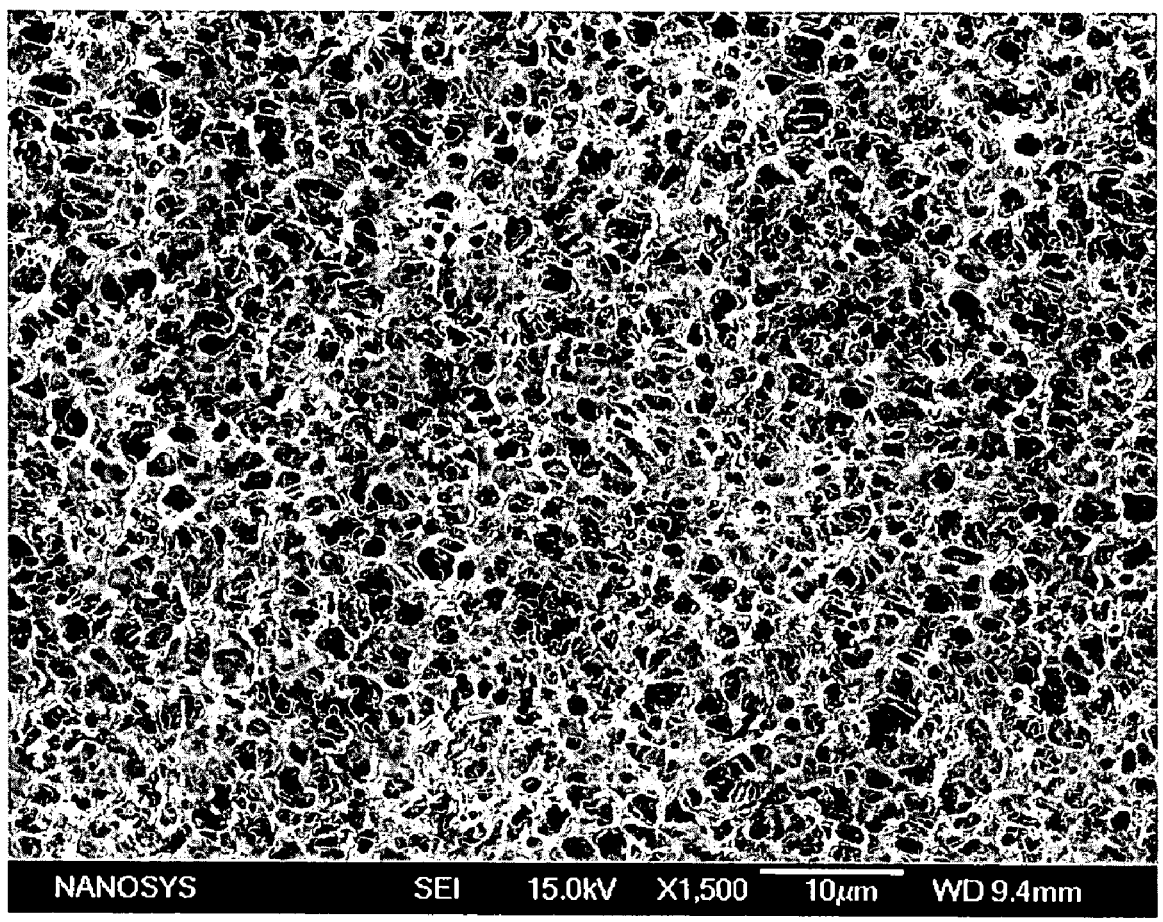
FIG. 33 is a SEM image of a nanowire-material composite comprising a porous material and randomly oriented nanowires, prepared according to an embodiment of the present invention.

FIG. 33 is an SEM image showing an example resulting porous nanowire-material composite, wherein the nanowires are randomly oriented and the material is PVDF polymer. The material was made porous by rapid evaporation of the solvent acetone.

Figure 34:
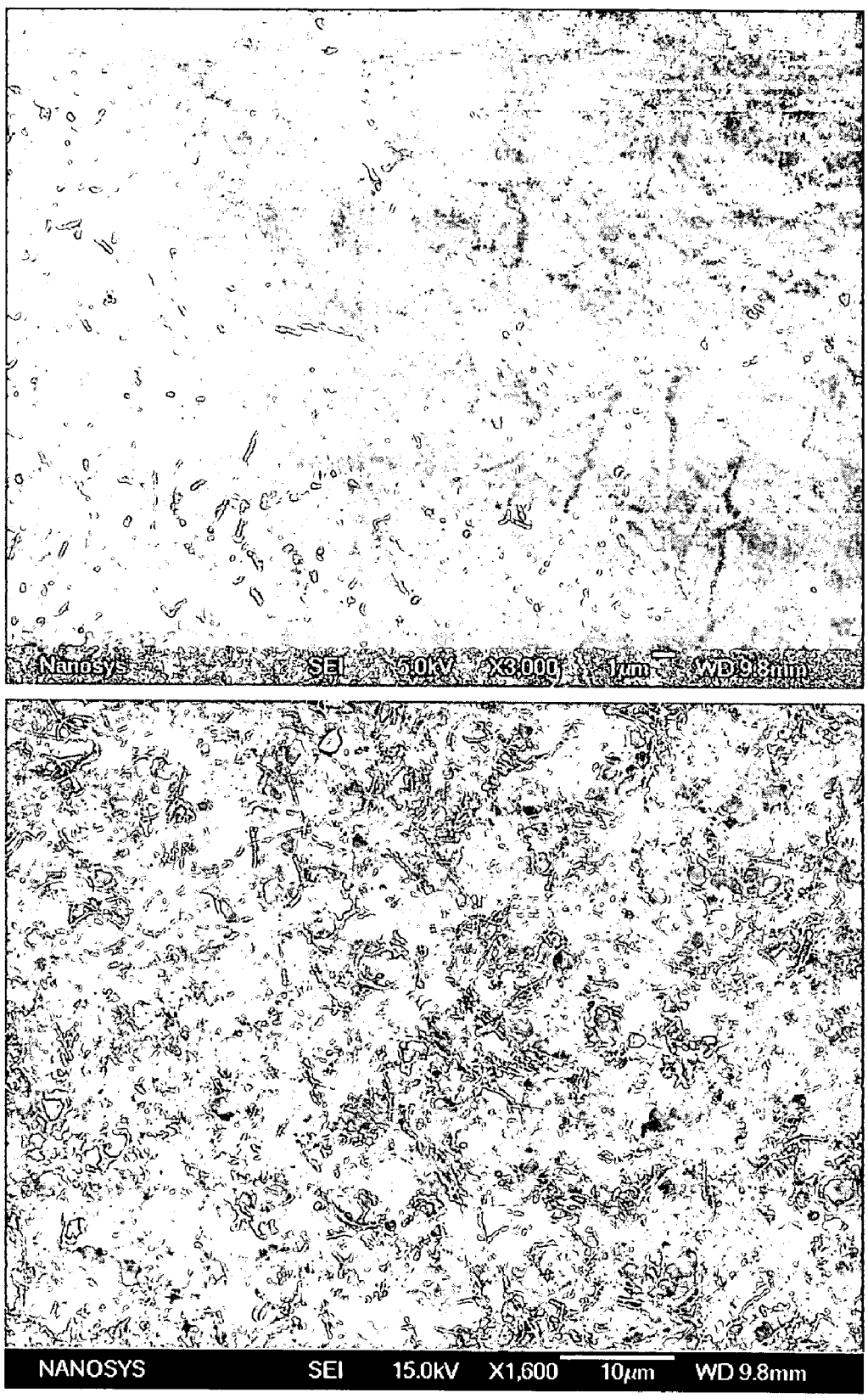
FIG. 34 is a SEM image of a nanowire-material composite comprising randomly oriented nanowires, prepared according to an embodiment of the present invention.

FIG. 34 is an SEM image showing a nanowire-material composite, wherein the nanowires are randomly oriented and the material is PVDF polymer. The composite is less porous than the composite shown in FIG. 33. The solvent was evaporated at a decreased rate, which caused a less porous film. This example shows how the porosity of the composite can be controlled by controlling the rate at which the volatiles (e.g., gases and fluids) are removed from the nanowire-material composite during processing.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A process for producing an electronic substrate, comprising:
    (a) forming a plurality of nanowires on a first substrate;
    (b) depositing a material over at least a portion of the plurality of nanowires to form a nonowire-material composite;

(c) removing the nanowire-material composite from the first substrate;

(d) attaching the nanowire-material composite to a portion of a second substrate such that the nanowires are aligned substantially parallel to each other on a surface of the second substrate;

(e) removing the material from the nanowire-material composite to form on the surface of the substrate the plurality of nanowires aligned substantially parallel to each other on the second substrate; and (f) forming contacts to said plurality of nanowires to thereby provide electrical connectivity to said nanowires.

2. The process of claim 1, wherein (d) comprises:
laminating said nanowire-material composite to said second substrate.

3. The process of claim 1, wherein said nanowire-material composite comprises a plurality of nanowires with sufficient density to achieve an operational current level.

4. The process of claim 3, wherein said nanowires have lengths between about 10 microns to about 20 microns long.

5. The process of claim 1, wherein said second substrate is a semiconductor, glass, ceramic, polymer, metal or composite thereof.

6. The process of claim 1, wherein said material of said nanowire-material composite is a polymer, prepolymer, ceramic, glass, metal or composite thereof.

7. The process of claim 1, wherein said material of said nanowire-material composite is an elastomer, thermoplastic or thermosetting resin.

8. The process of claim 1, wherein said attaching comprises:
coating said nanowire-material composite on said substrate.

9. The process of claim 1, wherein (f) comprises:
metallizing said nanowires to form electrical connectivity to said nanowires.

10. The process of claim 9, wherein said metallizing comprises:
metallizing said nanowires by e-beam evaporation.

11. The process of claim 9, wherein said metallizing comprises:
(1) forming source and drain electrodes, whereby the nanowires form channels having a length between respective ones of the source and drain electrodes.

12. The process of claim 11, wherein said metallizing further comprises:
(2) forming gate electrodes.

13. The process of claim 11, wherein said nanowires are aligned approximately parallel to an axis between the source and drain electrodes.

14. The process of claim 9, wherein said metallizing comprises:
forming anode and cathode electrodes.

15. The process of claim 12, wherein (2) comprises:
forming a gate electrode on a surface of said nanowires such that the distance between said gate and said nanowires is equal to or less than 100 nanometers.

16. The process of claim 12, wherein (2) comprises:
forming a gate electrode on a surface of said nanowires such that the distance between said gate and said nanowires is equal to or less than 5 nanometers.

17. The process of claim 1, wherein step (a) comprises:
(1) forming said nanowires to include p-n junctions.

18. A process for producing an electronic substrate, comprising:

(a) forming a plurality of nanowires which include p-n junctions on a first substrate, the nanowires being formed from at least one light emitting semiconducting material such that said p-n junctions emit light during operation;

(b) depositing a material over at least a portion of the plurality of nanowires to form a nanowire-material composite;

(c) removing the nanowire-material composite from the first substrate;

(d) attaching the nanowire-material composite comprising the plurality of nanowires to a portion of a second substrate;

(e) patterning said nanowire-material composite to define one or more semiconductor device regions; and (f) forming contacts at said semiconductor device regions to thereby provide electrical connectivity to said device regions.

19. The process of claim 18, wherein step (a) comprises:
forming said nanowires from said at least one light emitting semiconducting material that includes at least one of GaN, GaP, GaAs, InP, InAs, ZnO and a combination thereof.

20. The process of claim 18, further comprising:
(g) forming said nanowire-material composite from a plurality of nanowire-material composite layers,
wherein each said nanowire-material composite layer includes at least one of said at least one light emitting semiconducting materials selected to emit light at a wavelength different from other layers of said plurality of nanowire-material composite layers.

21. The process of claim 20, further comprising:
(h) forming a first nanowire-material composite layer of said plurality of nanowire-material composite layers from at least one light emitting semiconducting material selected to emit light at a blue light wavelength;

(i) forming a second nanowire-material composite layer of said plurality of composite layers from at least one light emitting semiconducting material selected to emit light at a green light wavelength; and (j) forming a third nanowire-material composite layer of said plurality of nanowire-material composite layers from at least one light emitting semiconducting material selected to emit light at a red light wavelength.

22. The process of claim 21, further comprising:
coupling said first nanowire-material composite layer to a first surface of said second nanowire-material composite layer; and
coupling a second surface of said second nanowire-material composite layer to a first surface of said third nanowire-material composite layer.

* * * * *

UNITED STATES PATENT AND TRADEMARK OFFICE
CERTIFICATE OF CORRECTION

PATENT NO.        : 7,468,315 B2
APPLICATION NO. : 11/225951
DATED             : December 23, 2008
INVENTOR(S)       : Mihai A. Buretea et al.

Page 1 of 1

It is certified that error appears in the above-identified patent and that said Letters Patent is hereby corrected as shown below:

In claim 8, column 31, line 34, after "composite on said", please insert --second--.

Signed and Sealed this

Third Day of March, 2009

JOHN DOLL
*Acting Director of the United States Patent and Trademark Office*